United States Patent [19]
Ide et al.

[11] Patent Number: 5,955,921
[45] Date of Patent: Sep. 21, 1999

[54] SIGNAL AMPLIFIER CIRCUIT

[75] Inventors: Satoshi Ide; Hiroyuki Nobuhara, both of Kawasaki; Takaya Chiba, Sapporo, all of Japan

[73] Assignee: Fujitsu Limited, Kawasaki, Japan

[21] Appl. No.: 08/910,002

[22] Filed: Aug. 11, 1997

[30] Foreign Application Priority Data

Dec. 11, 1996 [JP] Japan ................................ 8-331255

[51] Int. Cl.$^6$ ........................................................ H03F 3/45
[52] U.S. Cl. ........................ 330/254; 330/279; 330/136
[58] Field of Search .............................. 330/9, 129, 136, 330/141, 279, 280, 281, 254; 375/76; 250/214 AG

[56] References Cited

U.S. PATENT DOCUMENTS

| | | | |
|---|---|---|---|
| 4,019,048 | 4/1977 | Maione et al. | 250/214 AG |
| 4,433,256 | 2/1984 | Dolikian | 307/358 |
| 4,631,737 | 12/1986 | Davis et al. | 375/76 |
| 5,025,251 | 6/1991 | Mittel et al. | 375/76 |
| 5,091,920 | 2/1992 | Ikeda et al. | 375/76 |
| 5,113,151 | 5/1992 | Yamamoto et al. | 250/214 AG |
| 5,475,342 | 12/1995 | Nakamura et al. | 330/136 |
| 5,606,625 | 2/1997 | Dallavalle et al. | 330/278 |
| 5,636,048 | 6/1997 | Kogure et al. | 330/278 |

FOREIGN PATENT DOCUMENTS

| | | |
|---|---|---|
| 6-310967 | 11/1994 | Japan. |
| 8-223228 | 8/1996 | Japan. |

*Primary Examiner*—Robert Pascal
*Assistant Examiner*—Khanh Van Nguyen
*Attorney, Agent, or Firm*—Staas & Halsey, LLP

[57] ABSTRACT

The present invention discloses a signal amplifier circuit used in, for example, a receive portion in an optical communication system, and including an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal so as to feed a gain control signal according to amplitude of the input signal to the automatic gain control amplifying portion as a feedforward signal. It is thereby possible to avoid limitation of a signal amplified in the signal amplifier circuit at a time of reproduction of a pulse signal, and compensate for offsets present in circuits so as to suppress a variation in pulse width of the output signal.

50 Claims, 32 Drawing Sheets

F I G. 24
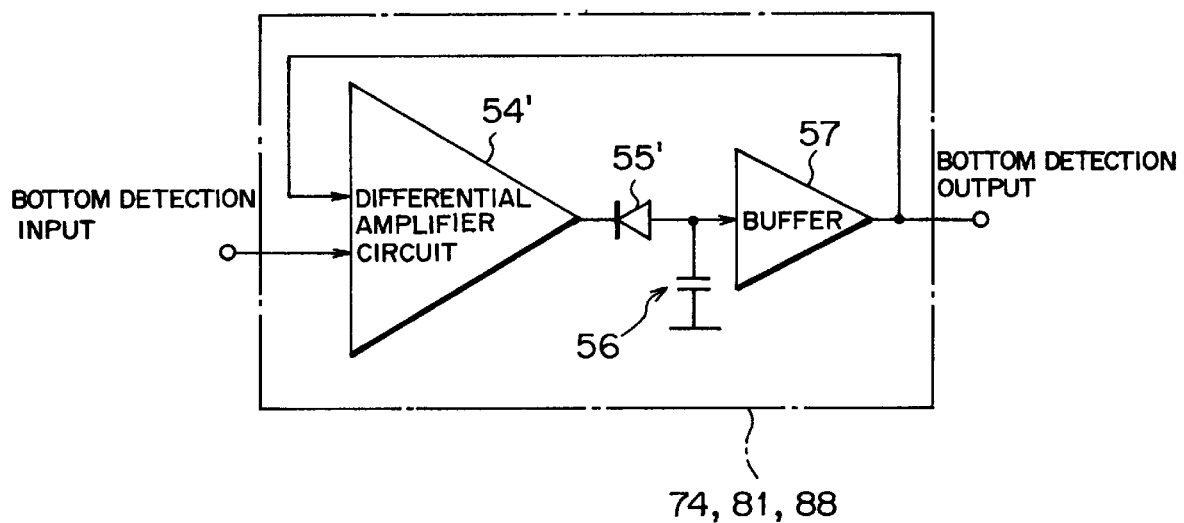

EYE PATTERN WITHOUT OFFSET

IDENTIFIABLE

EYE PATTERN WITH OFFSET

IDENTIFIABLE

SIGNAL AMPLIFIER CIRCUIT

BACKGROUND OF THE INVENTION (1) Field of the Invention

The present invention relates to a signal amplifier circuit suitable to reduce distortion of a pulse width caused due to input offset when a pulse signal is reproduced in, for example, a receiving portion in an optical communication system.

(2) Description of the Related Art

In general, in a receiving portion in a telecommunication system or the like, a signal amplifier circuit is used to reproduce a pulse signal from a very weak analog signal so as to shape a waveform of a signal attenuated at a time of transmission.

The signal amplifier circuit is desired to have a wide dynamic range with respect to an input signal level.

As a signal amplifier circuit meeting such a requirement, there has been known an ATC-limiter amplifier circuit including an ATC (Automatic Threshold Control) circuit (hereinafter referred to as ATC circuit) to detect a peak value and a bottom value of an input signal so as to set an intermediate value between the values as a threshold value, and a limiter amplifier to perform limiter amplification of the input signal depending upon the threshold value.

FIG. 30 shows one illustrative configuration of a signal amplifier circuit including an ATC-limiter amplifier circuit.

As shown in FIG. 30, a signal amplifier circuit 100 includes an ATC-limiter amplifier circuit 101 including an ATC circuit 102 and a limiter amplifier circuit 106, and another limiter amplifier circuit 107 on the side of a subsequent stage of the ATC-limiter amplifier circuit 101.

The ATC circuit 102 detects a peak value and a bottom value of an input signal to set an intermediate value between the values as a threshold value, and includes a peak detecting circuit 103, a bottom detecting circuit 104, and a voltage dividing circuit 105.

Here, the peak detecting circuit 103 detects the peak value of the input signal to output the value as a "1" level, and the bottom detecting circuit 104 detects the bottom value of the input signal to output the value as a "0" level. Further, the peak detecting circuit 103 and the bottom detecting circuit 104 respectively include a diode, a holding capacitor, and an amplifier circuit which are unillustrated.

Further, as shown in FIG. 30, the voltage dividing circuit 105 includes resistances 105A, 105B connected in series between an output terminal of the peak detecting circuit 103 and an output terminal of the bottom detecting circuit 104, and finds a divided voltage level of the peak value from the peak detecting circuit 103 and the bottom value from the bottom detecting circuit 104 by resistive division of the resistances 105A, 105B, thereby setting the divided voltage level as a threshold value (threshold level). Typically, a voltage division ratio is set to one-half so that the threshold level becomes an intermediate value between the "1" level and the "0" level.

Further, the limiter amplifier circuit 106 takes as inputs the input signal and the threshold value from the ATC circuit 102, and performs the limiter amplification of the input signal with center at the threshold level, thereby performing limiter processing such that output amplitude can be held constant throughout a range of the input signal.

Further, the limiter amplifier circuit 107 takes as input a signal (differential signal) obtained through the limiter amplification by the limiter amplifier circuit 106 of the ATC-limiter amplifier circuit 101, thereafter performing differential amplification of the input signal.

According to such a configuration, in the signal amplifier circuit 100 shown in FIG. 30, when the signal is input, the peak value and the bottom value of the input signal are detected in the ATC circuit 102 of the ATC-limiter amplifier circuit 101, and the intermediate value between the values is set as the threshold value.

Subsequently, when the threshold value and the input signal are input into the limiter amplifier circuit 106, the limiter amplifier circuit 106 performs the limiter amplification of the input signal with center at the threshold level, thereby holding the amplitude of the input signal constant.

Further, when the limiter amplifier circuit 107 takes as input the signal obtained through the limiter amplification by the limiter amplifier circuit 106 of the ATC-limiter amplifier circuit 101, the limiter amplifier circuit 107 performs the differential amplification of the input signal.

As set forth above, according to the signal amplifier circuit 100 shown in FIG. 30, the ATC circuit 102 sets the threshold value depending upon the input signal. Therefore, when an input level of the signal is varied, the threshold value can be varied while following the variation. Hence, it is possible to obtain a good output waveform over the wide dynamic range.

However, in the signal amplifier circuit 100 shown in FIG. 30, the peak detecting circuit 103, the bottom detecting circuit 104, and the limiter amplifier circuits 106, 107 have offsets inherent therein. Therefore, the threshold level output from the ATC circuit 102 is deviated from an original threshold level by an offset value.

Here, the peak detecting circuit 103, the bottom detecting circuit 104, and the limiter amplifier circuits 106, 107 respectively have a maximum offset value of ten millivolts. Consequently, accumulation of the offsets of the respective circuits results in an appreciably large offset value with respect to the amplitude of the input signal.

For example, when a signal (see reference numeral S) as shown in FIG. 31(a) is input, as shown in FIG. 31(b), the ATC circuit 102 detects a peak value level P and a bottom value level B from the input waveform S to set the original threshold level to a one-half level depending upon the values (see reference numeral H).

However, in the ATC circuit 102, the offset value (see reference numeral OF) present in the limiter amplifier circuit 106, the peak detecting circuit 103 and the bottom detecting circuit 104 is added to the threshold level, resulting in outputting a threshold level T.

Accordingly, the limiter amplifier circuit 106 performs the limiter amplification by using the threshold level T which is deviated by the offset value. Thus, there is a problem of degradation in the pulse width of a signal output from the limiter amplifier circuit 106 as shown in FIG. 31(c) (see reference numerals Q, R).

FIGS. 32(a), (b) show eye patterns of signals output from the limiter amplifier circuit 106. When the limiter amplification is performed in the limiter amplifier circuit 106 by using a threshold to which no offset is added, an output signal indicates the normal eye pattern as shown in FIG. 32(a). In contrast with this, when the limiter amplification is performed by using the threshold value to which the offset is added, the output signal indicates the abnormal eye pattern as shown in FIG. 32(b).

Further, in case of the input signal having lesser amplitude, the threshold level may exceed an amplitude range of the input signal by the addition of the offset value. In such a case, the limiter amplification of the signal cannot normally be performed in the limiter amplifier circuit 106.

In view of the above problems, there is a possible method in that a feedback loop (offset compensation feedback loop) is mounted in the signal amplifier circuit 100 to start from an output terminal of the limiter amplifier circuit 106 of the ATC-limiter amplifier circuit 101, and a feedback control is made by using an output signal from the limiter amplifier circuit 106, thereby compensating for the offset present in the circuits.

Here, the feedback control in the offset compensation feedback loop possibly includes one method in which comparison is made between peak values of the output signals from the limiter amplifier circuit 106 to make the feedback control so as to provide equal peak values, and the other method in which comparison is made between mean values of the output signals to make the feedback control so as to provide equal mean values.

However, it is possible to employ, only within narrow limits, the latter method in which the feedback control is made by using the mean values of the output signals because of problems in that, for example, the method is affected by a mark ratio of the signal. Thus, the former method is naturally employed in which the feedback control is made by using the peak values of the output signals.

However, a predetermined level or more is limited in the output signal from the limiter amplifier circuit 106 to cause a loss of amplitude information, and the output signal has a constant peak value irrespective of the threshold level. As a result, there is a problem in that it is impossible to employ the method of making the feedback control by using the peak values of the output signals.

Hence, there has been desired a signal amplifier circuit in which the offset can be compensated while taking advantage of the ATC circuit 102.

SUMMARY OF THE INVENTION

In view of the foregoing problems, it is an object of the present invention to prevent limitation of a signal amplified in an amplifier circuit throughout an input level by using an automatic gain control amplifier circuit as a circuit to amplify a signal, and controlling a gain according to a level of an input signal in a feedforward manner. Further, it is another object of the present invention to provide a signal amplifier circuit in which offsets present in circuits can be compensated so as to suppress a variation in pulse width of an output signal.

According to the present invention, for achieving the above-mentioned objects, there is provided a signal amplifier circuit including an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal so as to feed a gain control signal according to amplitude of the input signal to the automatic gain control amplifying portion as a feedforward signal.

Thus, according to the present invention, the signal amplifier circuit includes the automatic threshold value setting portion, the automatic gain control amplifying portion, and the gain control portion. Thereby, the automatic gain control amplifying portion can be operated in its linear range throughout an amplitude level of the input signal. Consequently, there is an advantage in that it is possible to avoid limitation of a signal amplified in the automatic gain control amplifying portion.

Further, the gain control portion controls the automatic gain control amplifying portion in a feedforward manner. It is thereby possible to provide a smaller time constant of response than would be necessary in an automatic gain control amplifying portion according to a typically employed feedback control. Hence, it is possible to provide a more rapid rise of the automatic gain control amplifying portion, resulting in applicability to a communication system for use in high-speed transmission of signals.

According to the present invention, there is provided a signal amplifier circuit including an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, a gain control portion to detect amplitude information of the input signal so as to feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion so as to compensate for offset of the automatic gain control amplifying portion.

Thus, according to the present invention, the signal amplifier circuit includes the automatic threshold value setting portion, the automatic gain control amplifying portion, the gain control portion, and the offset compensation feedback portion. As a result, there are advantages in that it is possible to avoid the limitation of the signal amplified in the automatic gain control amplifying portion, and compensate for the offsets present in the respective circuits forming the signal amplifier circuit so as to suppress a variation in pulse width of an output signal. In addition, the gain control portion controls the automatic gain control amplifying portion in a feedforward manner. It is thereby possible to provide a more rapid rise of the automatic gain control amplifying portion, resulting in another advantage of applicability to a communication system for use in high-speed transmission of signals.

Further, according to the present invention, there is provided a signal amplifier circuit including an automatic gain control amplifying portion to take as inputs an input signal and a reference signal so as to perform differential amplification, a gain control portion to detect amplitude information of the input signal so as to feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion as the reference signal so as to compensate for offset of the automatic gain control amplifying portion.

Thus, according to the present invention, the signal amplifier circuit includes the automatic gain control amplifying portion, the gain control portion, and the offset compensation feedback portion. As a result, there are advantages in that it is possible to avoid the limitation of the signal amplified in the automatic gain control amplifying portion, and compensate for the offsets present in the respective circuits forming the signal amplifier circuit so as to suppress a variation in pulse width of an output signal. In addition, the gain control portion controls the automatic gain control amplifying portion in a feedforward manner. It is thereby possible to provide a more rapid rise of the automatic gain control amplifying portion, resulting in applicability to a communication system for use in high-speed transmission of signals.

Further, the offset compensation feedback portion feeds back the reference signal to the input side of the automatic gain control amplifying portion. As a result, there is no need to mount an automatic threshold value setting portion to set a threshold value, resulting in an advantage in that the signal amplifier circuit can simply be configured.

Further, according to the present invention, there is provided a signal amplifier circuit including at least one signal amplification basic block portion having an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal so as to feed a gain control signal according to amplitude of the input signal to the automatic gain control amplifying portion as a feedforward signal, and at least one limiter amplification basic block portion having a limiter amplifying portion to perform differential amplification of a differential input signal. In the signal amplifier circuit, the at least one limiter amplification basic block portion is connected at a subsequent stage of the at least one signal amplification basic block portion.

Thus, according to the signal amplifier circuit of the present invention, there is one advantage in that it is possible to prevent limitation of a signal amplified in the automatic gain control amplifying portion. Additionally, the gain control portion controls the automatic gain control amplifying portion in a feedforward manner. It is thereby possible to provide a more rapid rise of the automatic gain control amplifying portion, resulting in another advantage of applicability to a communication system for use in high-speed transmission of signals.

Further, according to the present invention, there is provided a signal amplifier circuit including at least one signal amplification basic block portion having an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, a gain control portion to detect amplitude information of the input signal so as to feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion so as to compensate for offset of the automatic gain control amplifying portion, and at least one limiter amplification basic block portion having a limiter amplifying portion to perform differential amplification of a differential input signal. In the signal amplifier circuit, the at least one limiter amplification basic block portion is connected at a subsequent stage of the at least one signal amplification basic block portion.

Further, according to the signal amplifier circuit of the present invention, there are advantages in that it is possible to prevent limitation of a signal amplified in the automatic gain control amplifying portion, and compensate for the offsets present in the respective circuits forming the signal amplifier circuit so as to suppress a variation in the pulse width of an output signal. Additionally, the gain control portion controls the automatic gain control amplifying portion in a feedforward manner. It is thereby possible to provide a more rapid rise of the automatic gain control amplifying portion, resulting in another advantage of applicability to a communication system for use in the high-speed transmission of signals.

Further, according to the present invention, there is provided a signal amplifier circuit including at least one signal amplification basic block portion having an automatic gain control amplifying portion to take as inputs an input signal and a reference signal so as to perform differential amplification, a gain control portion to detect amplitude information of the input signal so as to feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion as the reference signal so as to compensate for offset of the automatic gain control amplifying portion, and at least one limiter amplification basic block portion having a limiter amplifying portion to perform differential amplification of a differential input signal. In the signal amplifier circuit, the at least one limiter amplification basic block portion is connected at a subsequent stage of the at least one signal amplification basic block portion.

Thus, according to the signal amplifier circuit of the present invention, there are advantages in that it is possible to prevent limitation of a signal amplified in the automatic gain control amplifying portion, and compensate for the offsets present in the respective circuits forming the signal amplifier circuit so as to suppress a variation in pulse width of an output signal. Additionally, the gain control portion controls the automatic gain control amplifying portion in a feedforward manner. It is thereby possible to provide a more rapid rise of the automatic gain control amplifying portion, resulting in applicability to a communication system for use in the high-speed transmission of signals.

Further, the offset compensation feedback portion feeds back the reference signal to the input side of the automatic gain control amplifying portion. There is no need to mount an automatic threshold value setting portion to set a threshold value, resulting in an advantage in that the signal amplifier circuit can simply be configured.

Further, according to the present invention, there is provided a signal amplifier circuit including at least one signal amplification basic block portion having an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal so as to feed a gain control signal according to amplitude of the input signal to the automatic gain control amplifying portion as a feedforward signal, and at least one limiter amplification basic block portion having an automatic threshold value setting portion to automatically set a threshold value depending upon a "1" side level and a "0" side level of an input signal, and a limiter amplifying portion to take as inputs the input signal and the threshold value from the automatic threshold value setting portion so as to perform differential amplification. In the signal amplifier circuit, the at least one limiter amplification basic block portion is connected at a subsequent stage of the at least one signal amplification basic block portion.

Thus, according to the signal amplifier circuit of the present invention, there is one advantage in that it is possible to prevent limitation of a signal amplified in the automatic gain control amplifying portion. In addition, the gain control portion controls the automatic gain control amplifying portion in a feedforward manner. It is thereby possible to provide a more rapid rise of the automatic gain control amplifying portion, resulting in another advantage of applicability to a communication system for use in the high-speed transmission of signals.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIG. 24 is a block diagram showing a configuration of a bottom detecting circuit;

DESCRIPTION OF THE PREFERRED EMBODIMENTS (a) Aspects of the Invention

A description will now be given of aspects of the present invention referring to the accompanying drawings.

Figure 1:
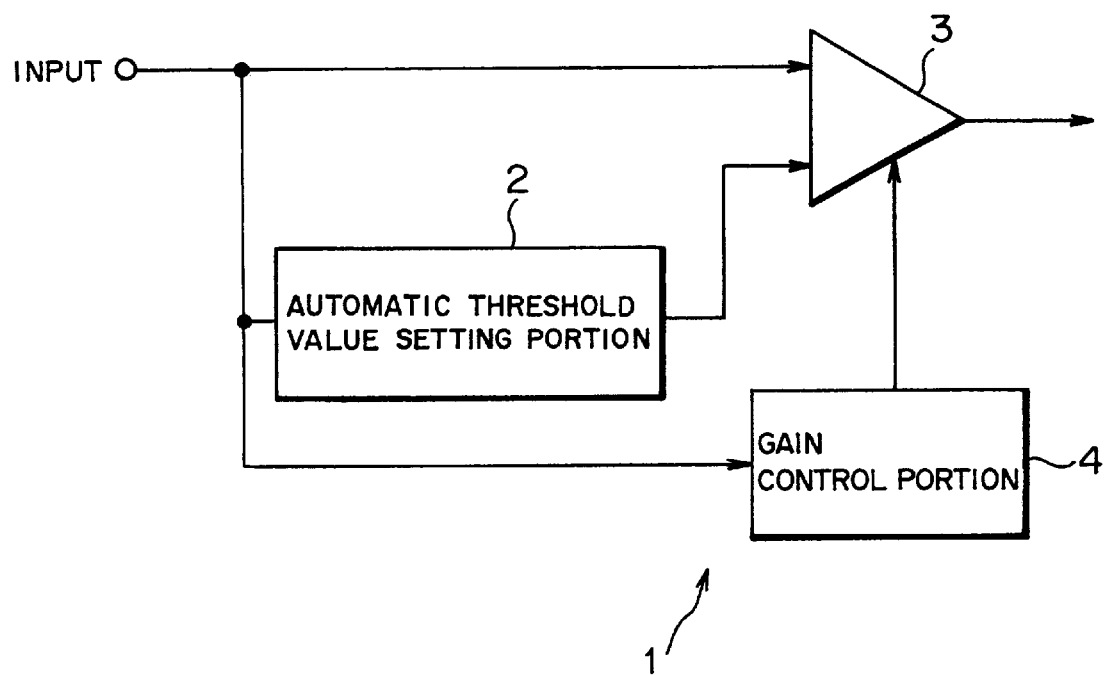
FIGS. 1 to 4 are block diagrams showing aspects of a signal amplifier circuit of the present invention.

FIG. 1 is a block diagram showing one aspect of a signal amplifier circuit of the present invention. A signal amplifier circuit 1 shown in FIG. 1 includes an automatic threshold value setting portion 2, an automatic gain control amplifying portion 3, and a gain control portion 4.

Here, the automatic threshold value setting portion 2 automatically sets a threshold value depending upon a "1" side level and a "0" side level of an input signal.

Further, the automatic gain control amplifying portion 3 takes as inputs the input signal and the threshold value from the automatic threshold value setting portion 2, and performs differential amplification.

Further, the gain control portion 4 detects amplitude information of the input signal, and feeds a gain control signal according to amplitude of the input signal to the automatic gain control amplifying portion 3 as a feedforward signal.

Figure 2:
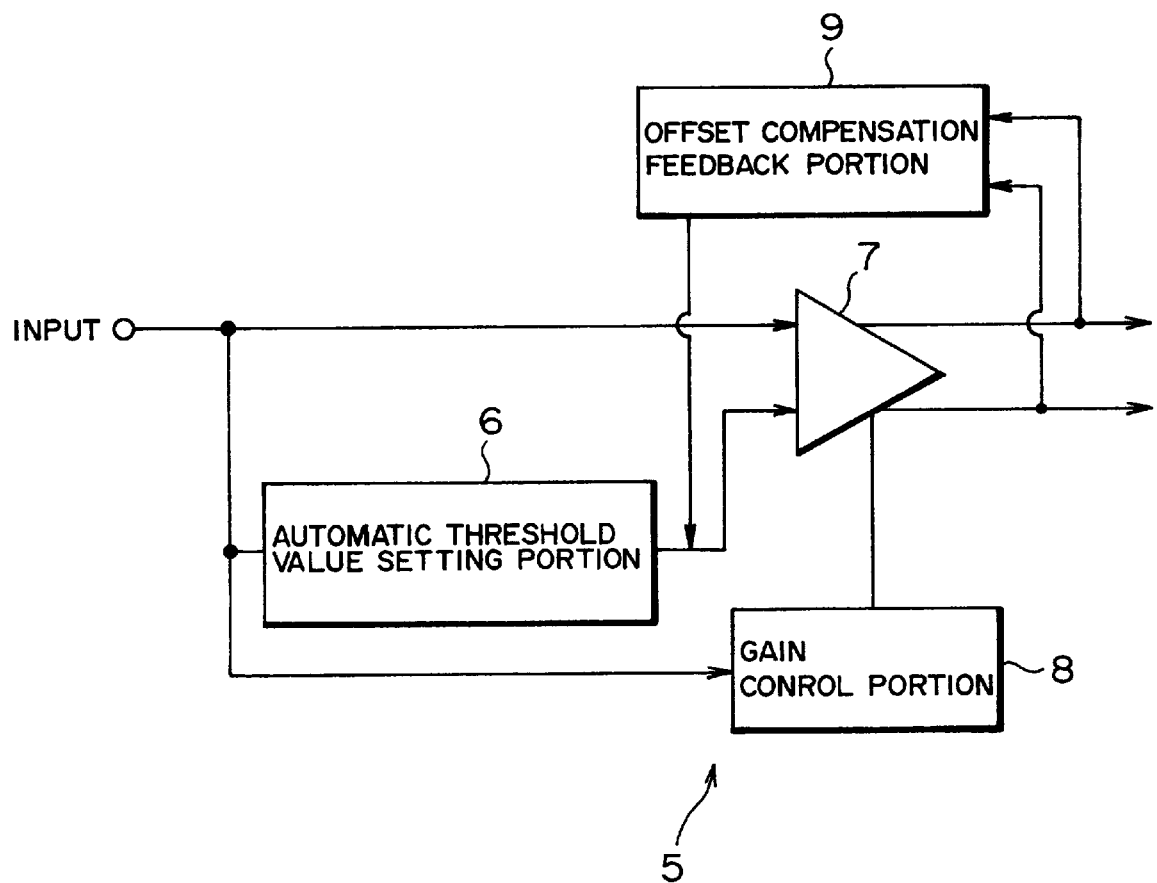

Meanwhile, FIG. 2 is a block diagram showing another aspect of the signal amplifier circuit of the present invention. A signal amplifier circuit 5 shown in FIG. 2 includes an automatic threshold value setting portion 6, an automatic gain control amplifying portion 7, a gain control portion 8, and an offset compensation feedback portion 9.

Here, the automatic threshold value setting portion 6 automatically sets a threshold value depending upon a "1" side level and a "0" side level of an input signal.

Further, the automatic gain control amplifying portion 7 takes as inputs the input signal and the threshold value from the automatic threshold value setting portion 6, and performs differential amplification.

Further, the gain control portion 8 detects amplitude information of the input signal, and feeds a gain control signal according to amplitude of the input signal to the automatic gain control amplifying portion 7 as a feedforward signal.

Further, the offset compensation feedback portion 9 feeds back difference information of an output signal from the automatic gain control amplifying portion 7 to an input side of the automatic gain control amplifying portion 7 so as to compensate for offset of the automatic gain control amplifying portion 7.

Figure 3:
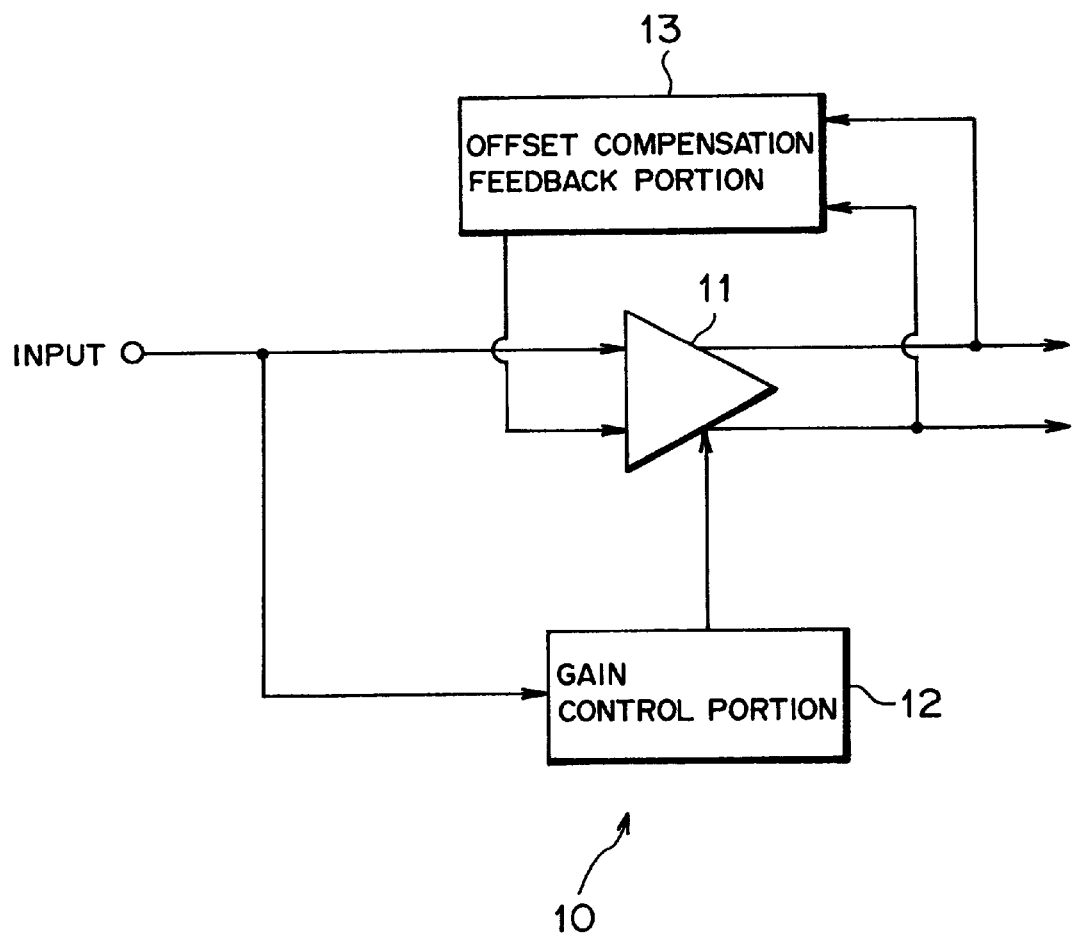

Meanwhile, FIG. 3 is a block diagram showing a further aspect of the signal amplifier circuit of the present invention. A signal amplifier circuit 10 shown in FIG. 3 includes an automatic gain control amplifying portion 11, a gain control portion 12, and an offset compensation feedback portion 13.

Here, the automatic gain control amplifying portion 11 takes as inputs an input signal and a reference signal to perform differential amplification.

Further, the gain control portion 12 detects amplitude information of the input signal, and feeds a gain control signal according to amplitude of the input signal to the automatic gain control amplifying portion 11 as a feedforward signal.

Further, the offset compensation feedback portion 13 feeds back difference information of an output signal from the automatic gain control amplifying portion 11 to an input side of the automatic gain control amplifying portion 11 as the reference signal so as to compensate for offset of the automatic gain control amplifying portion 11.

Here, the automatic threshold value setting portions 2, 6 can respectively include a "1" side level output circuit to output the "1" side level of the input signal, a "0" side level output circuit to output the "0" side level of the input signal, and a voltage dividing circuit to generate a threshold level by dividing the "1" side level and the "0" side level of the input signal respectively obtained in the "1" side level output circuit and the "0" side level output circuit.

Specifically, the "1" side level output circuit can be configured as a peak detecting circuit to detect a peak level of the input signal, and the "0" side level output circuit can be configured as a bottom detecting circuit to detect a bottom level of the input signal.

Alternatively, the "1" side level output circuit may be configured as the peak detecting circuit to detect the peak level of the input signal, and the "0" side level output circuit may be configured as a reference level generating circuit to generate a reference level corresponding to the "0" side level of the input signal.

In addition, the automatic threshold value setting portion 6 may include the "1" side level output circuit to output the "1" side level of the input signal, the "0" side level output circuit to output the "0" side level of the input signal, and the voltage dividing circuit to generate the threshold level by dividing the "1" side level and the "0" side level of the input signal respectively obtained in the "1" side level output circuit and the "0" side level output circuit. Concurrently, the "1" side level output circuit may be configured as the peak detecting circuit to detect the peak level of the input signal, and the offset compensation feedback portion 9 may also serve as the "0" side level output circuit.

Alternatively, a delay circuit may be connected to the automatic gain control amplifying portions 3, 7, and 11 on the side into which the input signal is input.

Specifically, in the automatic gain control amplifying portions 3, 7, and 11, a plurality of transistor pairs having different transconductances can be connected to the same load resistance, and common differential input terminals can be connected to inputs of the plurality of transistor pairs so as to control an amplification gain by varying a ratio of current while holding an entire amount of current flowing in the plurality of transistor pairs substantially constant.

Specifically, the gain control portions 4, 8, and 12 may include a differential amplifier circuit to take as inputs the "1" side level and the "0" side level of the input signal. Alternatively, the gain control portions 4, 8, and 12 may include a level shift circuit, and a differential amplifier circuit to take as input any one of the "1" side level and the "0" side level of the input signal through the level shift circuit.

Further, the gain control portions 4, 8, and 12, and the automatic gain control amplifying portions 3, 7, and 11 may be configured such that a minimum gain $G_{min}$ determined by the gain control portions 4, 8, and 12, and the automatic gain control amplifying portions 3, 7, and 11 can take a value which does not exceed a linear range of the automatic gain control amplifying portions 3, 7, and 11 even at a maximum level of the input signal.

Specifically, the gain control portions 4, 8, and 12, and the automatic gain control amplifying portions 3, 7, and 11 can be configured such that the minimum gain $G_{min}$, which does not exceed the linear range of the automatic gain control amplifying portions 3, 7, and 11, can take a value defined as:

$$G_{min}=V_{linear}/inmax$$

where $V_{linear}$: linear range of output from automatic gain control amplifying portion; and $V_{inmax}$: maximum input level Meanwhile, the offset compensation feedback portions 9, 13 can feed back as the difference information of the output signal from the automatic gain control amplifying portions 7, 11 a difference level between peak values of differential outputs from the automatic gain control amplifying portions 7, 11 to the input side of the automatic gain control amplifying portions 7, 11 so as to compensate for the offset of the automatic gain control amplifying portions 7, 11.

Alternatively, the offset compensation feedback portions 9, 13 may make low-pass filter processing to the difference level between the peak values of the differential outputs of the automatic gain control amplifying portions 7, 11, and may feed back the result as the difference information of the output signal from the automatic gain control amplifying portions 7, 11 to the input side of the automatic gain control amplifying portions 7, 11 so as to compensate for the offset of the automatic gain control amplifying portions 7, 11.

Further, the offset compensation feedback portions 9, 13 may feed back as the difference information of the output signal from the automatic gain control amplifying portions 7, 11 a difference level between bottom values of the differential outputs of the automatic gain control amplifying portions 7, 11 to the input side of the automatic gain control amplifying portions 7, 11 so as to compensate for the offset of the automatic gain control amplifying portions 7, 11.

Alternatively, the offset compensation feedback portions 9, 13 may make the low-pass filter processing to the difference level between the bottom values of the differential outputs of the automatic gain control amplifying portions 7, 11, and may feed back the result as the difference information of the output signal from the automatic gain control amplifying portions 7, 11 to the input side of the automatic gain control amplifying portions 7, 11 so as to compensate for the offset of the automatic gain control amplifying portions 7, 11.

Further, the offset compensation feedback portions 9, 13 may feed back as the difference information of the output signal from the automatic gain control amplifying portions 7, 11 a difference level between values obtained by dividing the peak value and the bottom value of the differential outputs of the automatic gain control amplifying portions 7, 11 to the input side of the automatic gain control amplifying portions 7, 11 so as to compensate for the offset of the automatic gain control amplifying portions 7, 11.

Alternatively, the offset compensation feedback portions 9, 13 may make the low-pass filter processing to the difference level between the values obtained by dividing the peak value and the bottom value of the differential outputs of the automatic gain control amplifying portions 7, 11, and may feed back the result as the difference information of the output signal from the automatic gain control amplifying portions 7, 11 to the input side of the automatic gain control amplifying portions 7, 11 so as to compensate for the offset of the automatic gain control amplifying portions 7, 11.

Further, when the input signal is an optical signal, a light-to-electricity converting portion for light-to-electricity conversion of the input signal, and a preamplifier circuit to amplify an output signal of the light-to-electricity converting portion may be connected to an input side of the signal amplifier circuits 1, 5, and 10 described above.

Thus, according to the present invention, the signal amplifier circuit 1 includes the automatic threshold value setting portion 2, the automatic gain control amplifying portion 3, and the gain control portion 4. Thereby, the automatic gain control amplifying portion 3 can be operated in its linear range throughout an amplitude level of the input signal. Consequently, there is an advantage in that it is possible to avoid limitation of a signal amplified in the automatic gain control amplifying portion 3.

Further, the gain control portion 4 controls the automatic gain control amplifying portion 3 in a feedforward manner. It is thereby possible to provide a smaller time constant of response than would be in an automatic gain control amplifying portion according to a typically employed feedback control. Hence, it is possible to provide a more rapid rise of the automatic gain control amplifying portion 3, resulting in applicability to a communication system for use in high-speed transmission of signals.

Further, according to the present invention, the signal amplifier circuit 5 includes the automatic threshold value setting portion 6, the automatic gain control amplifying portion 7, the gain control portion 8, and the offset compensation feedback portion 9. Thus, there are advantages in that it is possible to avoid the limitation of the signal amplified in the automatic gain control amplifying portion 7, and compensate for the offsets present in the respective circuits forming the signal amplifier circuit 5 so as to suppress a variation in pulse width of an output signal. In addition, the gain control portion 8 controls the automatic gain control amplifying portion 7 in a feedforward manner. It is thereby possible to provide a more rapid rise of the automatic gain control amplifying portion 7. Hence, there is another advantage of applicability to the communication system for use in the high-speed transmission of signals.

Further, according to the present invention, the signal amplifier circuit 10 includes the automatic gain control amplifying portion 11, the gain control portion 12, and the offset compensation feedback portion 13. Thus, there are advantages in that it is possible to avoid the limitation of the signal amplified in the automatic gain control amplifying portion 11, and compensate for the offsets present in the respective circuits forming the signal amplifier circuit 10 so as to suppress a variation in pulse width of an output signal. In addition, the gain control portion 12 controls the automatic gain control amplifying portion 11 in the feedforward manner. It is thereby possible to provide a more rapid rise of the automatic gain control amplifying portion 11, resulting in applicability to the communication system for use in the high-speed transmission of signals.

Further, the offset compensation feedback portion 13 feeds back the reference signal to the input side of the automatic gain control amplifying portion 11. As a result, there is no need to mount an automatic threshold value setting portion to set a threshold value, resulting in an advantage in that the signal amplifier circuit 10 can simply be configured.

Further, according to the present invention, in the signal amplifier circuits 1 and 5, the reference level generating circuit to generate the reference level corresponding to the "0" side level of the input signal can be used as the "0" side level output circuit in the automatic threshold value setting portion. In this case, it is possible to simplify the configuration of the signal amplifier circuit.

Further, when the offset compensation feedback portion 9 also serves as the "0" side level output circuit, it is possible to reduce the number of circuits forming the signal amplifier circuit 5, resulting in an advantage in that the configuration of the signal amplifier circuit 5 can more be simplified.

Further, according to the present invention, in the signal amplifier circuits 1, 5, and 10, the delay circuit may be connected to the automatic gain control amplifying portions 3, 7, and 11 on the side into which the input signal is input. This enables the automatic gain control amplifying portions 3, 7, and 11 to take as input the signal after a rise of the gain control signal from the gain control portions 4, 8, and 12. As a result, there are advantages in that overshoot of the signal can be prevented in the automatic gain control amplifying portions 3, 7, and 11, and a malfunction can be avoided in the signal amplifier circuits 1, 5, and 10.

Further, according to the present invention, in the signal amplifier circuits 5, 10, the offset compensation feedback portions 9, 13 may feed back the difference level between the values obtained by dividing the peak value and the bottom value of the differential outputs of the automatic gain control amplifying portions 7, 11 to the input side of the automatic gain control amplifying portions 7, 11 so as to compensate for the offset of the automatic gain control amplifying portions 7, 11. This ensures stable offset compensation even when a variation is caused in input level of the signal.

Figure 4:
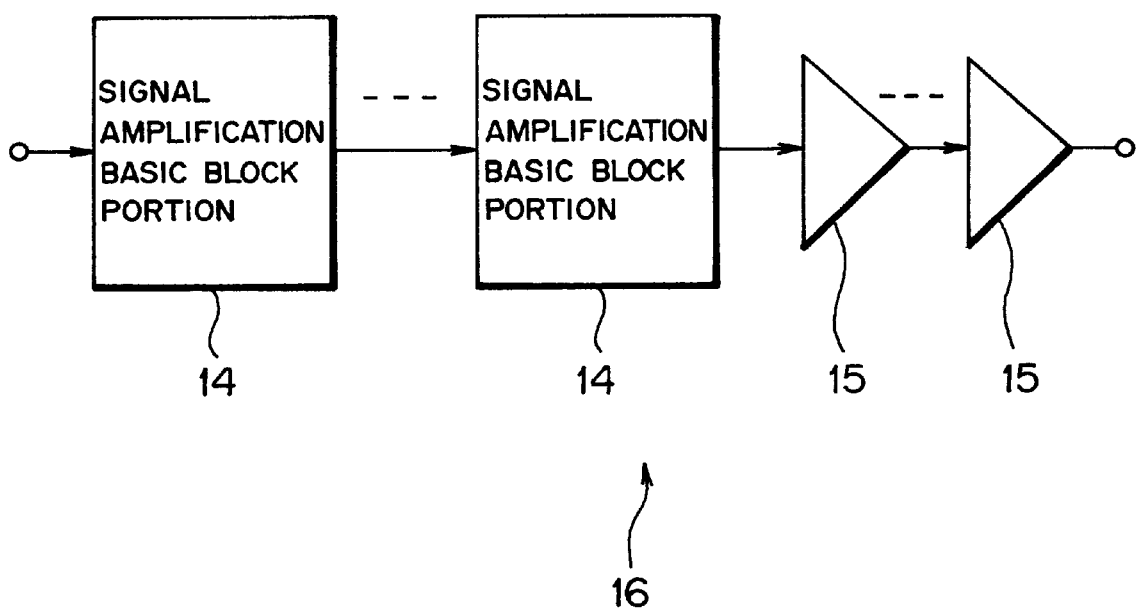

Meanwhile, FIG. 4 is a block diagram showing a still further aspect of the signal amplifier circuit of the present invention. A signal amplifier circuit 16 shown in FIG. 4 includes at least one signal amplification basic block portion 14 and at least one limiter amplification basic block portion 15, and the at least one limiter amplification basic block portion 15 is connected at a subsequent stage of the at least one signal amplification basic block portion 14.

Here, the signal amplification basic block portion 14 includes an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal, and feed a gain control signal according to amplitude of the input signal to the automatic gain control amplifying portion as a feedforward signal.

Further, the limiter amplification basic block portion 15 includes a limiter amplifying portion to perform differential amplification of a differential input signal.

Further, the signal amplification basic block portion 14 may include an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, a gain control portion to detect amplitude information of the input signal, and feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion so as to compensate for offset of the automatic gain control amplifying portion. Alternatively, the signal amplification basic block portion 14 may include an automatic gain control amplifying portion to take as inputs an input signal and a reference signal so as to perform differential amplification, a gain control portion to detect amplitude information of the input signal, and feed a gain control signal according to amplitude of the input signal to the automatic gain control amplifying portion as a feedforward signal, and an offset compensation feedback portion to feed back as the reference signal difference information of an output signal from the automatic gain control amplifying portion to an input side of the automatic gain control amplifying portion so as to compensate for offset of the automatic gain control amplifying portion.

Alternatively, the signal amplification basic block portion 14 may include an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal, and feed a gain control signal according to amplitude of the input signal to the automatic gain control amplifying portion as a feedforward signal. Concurrently, the limiter amplification basic block portion 15 may include an automatic threshold value setting portion to automatically set a threshold value depending upon a "0" side level and a "0" side level of an input signal, and a limiter amplifying portion to take as inputs the input signal and the threshold value from the automatic threshold value setting portion so as to perform differential amplification.

Further, the automatic threshold value setting portion of the limiter amplification basic block portion 15 may be provided with a guard voltage generating circuit to control a threshold level such that the threshold level is held higher than a level in the absence of an input signal by a predetermined guard voltage even when no signal is input into the automatic threshold value setting portion of the at least one limiter amplification basic block portion 15. In particular, the guard voltage generating circuit may be mounted in an automatic threshold value setting portion of a limiter amplification basic block portion at a last stage.

Thus, according to the present invention, the signal amplifier circuit 16 includes the at least one signal amplification basic block portion 14 having the automatic threshold value setting portion, the automatic gain control amplifying portion, and the gain control portion, and the at least one limiter amplification basic block portion 15 having the limiter amplifying portion. Further, the at least one limiter amplification basic block portion 15 is connected at the subsequent stage of the at least one signal amplification basic block portion 14. As a result, there is one advantage in that it is possible to prevent limitation of a signal amplified in the automatic gain control amplifying portion. Additionally, the gain control portion controls the automatic gain control amplifying portion in a feedforward manner. It is thereby possible to provide a more rapid rise of the automatic gain control amplifying portion, resulting in another advantage of applicability to a communication system for use in the high-speed transmission of signals.

Further, according to the present invention, the signal amplifier circuit 16 includes the at least one signal amplification basic block portion 14 having the automatic threshold value setting portion, the automatic gain control amplifying portion, the gain control portion, and the offset compensation feedback portion, and the at least one limiter amplification basic block portion 15 having a limiter amplifier circuit portion. Further, the at least one limiter amplification basic block portion 15 is connected at the subsequent stage of the at least one signal amplification basic block portion 14. As a result, there are advantages in that it is possible to prevent limitation of a signal amplified in the automatic gain control amplifying portion, and compensate for the offsets present in the respective circuits forming the signal amplifier circuit so as to suppress the variation in pulse width of the output signal. Additionally, the gain control portion controls the automatic gain control amplifying portion in a feedforward manner. It is thereby possible to provide a more rapid rise of the automatic gain control amplifying portion, resulting in another advantage of applicability to a communication system for use in the high-speed transmission of signals.

Further, according to the present invention, the signal amplifier circuit 16 includes the at least one signal amplification basic block portion 14 having the automatic gain control amplifying portion, the gain control portion, the offset compensation feedback portion, and the at least one limiter amplification basic block portion 15 having the limiter amplifying portion. Further, the at least one limiter amplification basic block portion 15 is connected at the subsequent stage of the at least one signal amplification basic block portion 14. As a result, there are advantages in that it is possible to prevent limitation of a signal amplified in the automatic gain control amplifying portion, and compensate for the offsets present in the respective circuits forming the signal amplifier circuit so as to suppress the variation in pulse width of the output signal. Additionally, the gain control portion controls the automatic gain control amplifying portion in a feedforward manner. It is thereby possible to provide a more rapid rise of the automatic gain control amplifying portion, resulting in applicability to a communication system for use in the high-speed transmission of signals.

Further, the offset compensation feedback portion feeds back the reference signal to the input side of the automatic gain control amplifying portion. Hence, there is no need to mount an automatic threshold value setting portion to set a threshold value, resulting in an advantage in that the signal amplifier circuit can be simply configured.

Further, according to the present invention, the signal amplifier circuit 16 includes the at least one signal amplification basic block portion 14 having the automatic threshold value setting portion, the automatic gain control amplifying portion, the gain control portion, and the at least one limiter amplification basic block portion 15 having the automatic threshold value setting portion and the limiter amplifying portion. Further, the at least one limiter amplification basic block portion 15 is connected at the subsequent stage of the at least one signal amplification basic block portion 14. As a result, there is one advantage in that it is possible to prevent limitation of a signal amplified in the automatic gain control amplifying portion. In addition, the gain control portion controls the automatic gain control amplifying portion in a feedforward manner. It is thereby possible to provide a more rapid rise of the automatic gain control amplifying portion, resulting in another advantage of applicability to a communication system for use in high-speed transmission of signals.

Further, according to the present invention, in the signal amplifier circuit 16, the guard voltage generating circuit may be mounted in the automatic threshold value setting portion of the limiter amplification basic block portion 15. This results in an advantage in that it is possible to avoid erroneous recognition of a signal due to input noise.

In particular, the guard voltage generating circuit may be mounted in the automatic threshold value setting portion of the limiter amplification basic block portion 15 at the last stage. This results in an advantage in that it is possible to surely avoid the erroneous recognition of a signal due to the input noise.

(b) Description of First Embodiment

A description will now be given of an embodiment of the present invention referring to the accompanying drawings.

Figure 5:
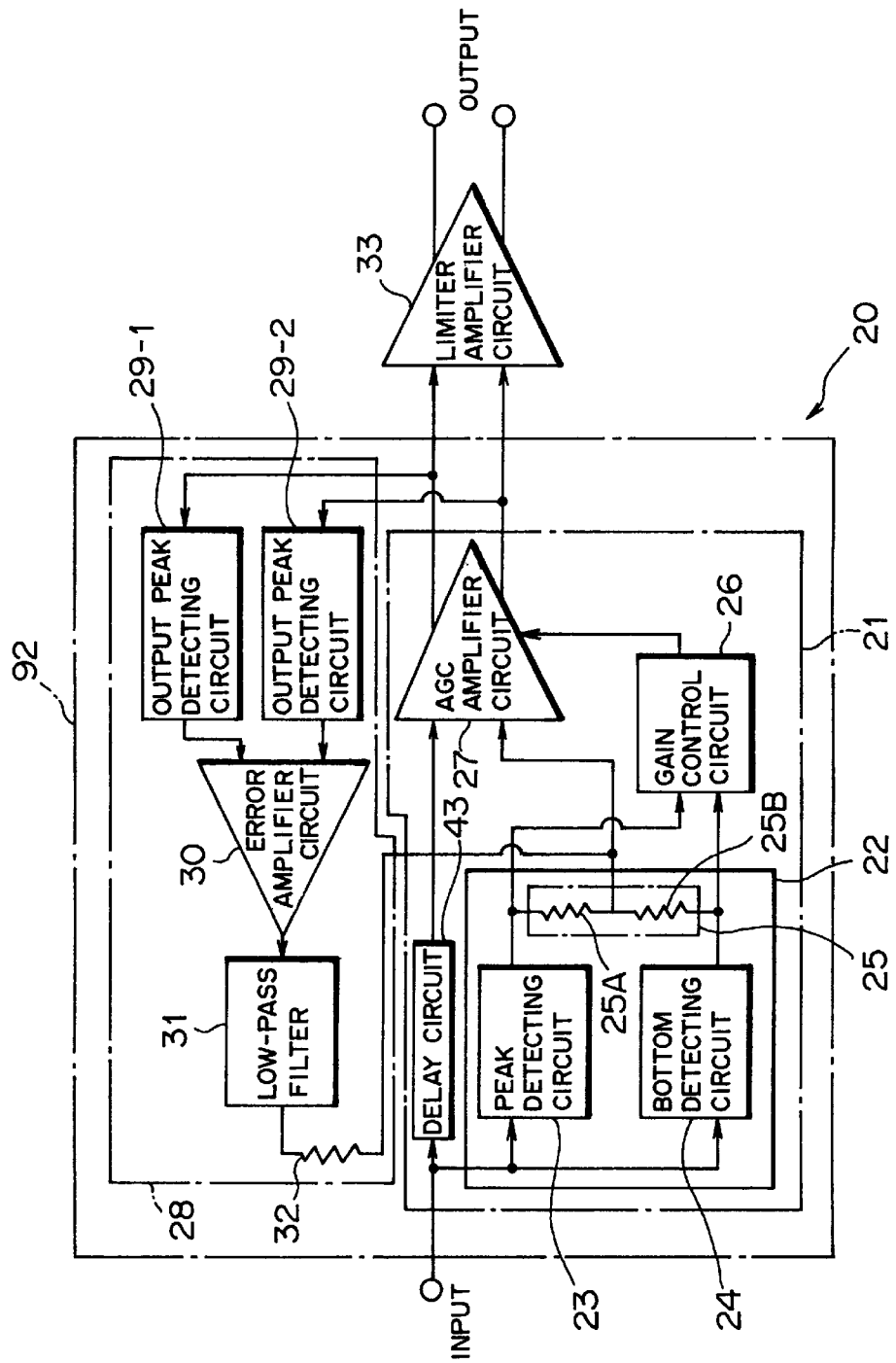
FIG. 5 is a block diagram showing a configuration of a signal amplifier circuit according to the first embodiment of the present invention.

FIG. 5 is a block diagram showing a configuration of a signal amplifier circuit according to the first embodiment of the present invention.

A signal amplifier circuit 20 shown in FIG. 5 is used as a signal interface circuit to shape a waveform of an optical signal attenuated at a time of transmission in, for example, a receiving portion in an optical communication system.

Figure 6:
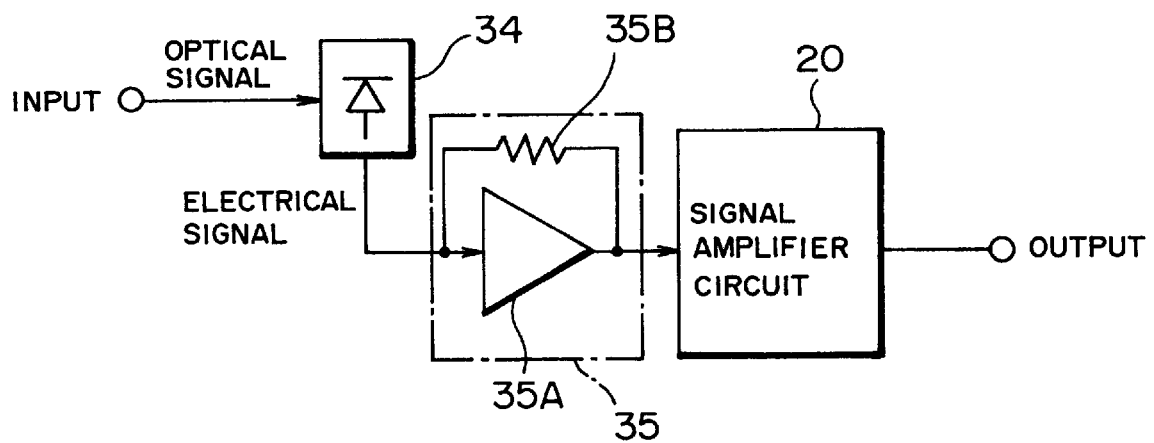
FIG. 6 is a block diagram showing a partial configuration of a receiving portion in an optical communication system to which the signal amplifier circuit according to the first embodiment of the present invention is applied.

That is, as shown in FIG. 6, to an input side of the signal amplifier circuit 20 are connected a photodiode 34 serving as a light-to-electricity converting portion for light-to-electricity conversion of an input signal, and a preamp 35 serving as a preamplifier circuit to amplify an output signal of the photodiode 34 to a predetermined value. The signal amplifier circuit 20 shapes the waveform of the optical signal attenuated at the time of transmission by reproducing a pulse signal from a very weak analog signal from the preamp 35.

Moreover, the preamp 35 is a preamp of transimpedance type including an amplifier circuit 35A and a resistance 35B, and a current signal from the photodiode 34 is converted from current to voltage by the preamp 35, and is thereafter input into the signal amplifier circuit 20.

Specifically, as shown in FIG. 5, the signal amplifier circuit 20 includes a signal amplification basic block portion 92, and a limiter amplifier circuit 33 serving as a limiter amplification basic block portion at a subsequent stage of the signal amplification basic block portion 92.

Here, the signal amplification basic block portion 92 includes an ATC-AGC amplifier circuit 21 including an automatic threshold control (ATC) circuit 22, an automatic gain control (AGC) amplifier circuit 27, a gain control circuit 26, and a delay circuit 43, and an offset compensation feedback loop 28.

The ATC circuit 22 detects a peak value and a bottom value of an input signal to automatically set an intermediate value between the values as a threshold value, and includes a peak detecting circuit 23, a bottom detecting circuit 24, and a voltage dividing circuit 25.

Here, the peak detecting circuit 23 detects the peak value of the input signal to output the result as a "1" side level, and functions as a "1" side level output circuit.

Further, the bottom detecting circuit 24 detects the bottom value of the input signal to output the result as a "0" side level, and functions as a "0" side level output circuit.

Moreover, the peak detecting circuit 23 and bottom detecting circuit 24 respectively include a diode, a holding capacitor, and an amplifier circuit which are unillustrated.

Further, as shown in FIG. 5, the voltage dividing circuit 25 includes resistances 25A, 25B connected in series between an output terminal of the peak detecting circuit 23 and an output terminal of the bottom detecting circuit 24, and divides the peak value and the bottom value of the input signal respectively obtained in the peak detecting circuit 23 and the bottom detecting circuit 24, thereby generating a threshold level.

Specifically, the voltage dividing circuit 25 finds a divided voltage level of the peak value from the peak detecting circuit 23 and the bottom value from the bottom detecting circuit 24 by resistive division of the resistances 25A, 25B, thereby setting the divided voltage level as a threshold value (threshold level), and outputting the value to an inverting input portion of the AGC amplifier circuit 27. Typically, a voltage division ratio is set to one-half so that the threshold level becomes an intermediate value between the "1" level and the "0" level.

That is, the ATC circuit 22 functions as an automatic threshold value setting portion to automatically set the threshold value depending upon the "1" side level and "0" side level of the input signal.

Further, the AGC amplifier circuit 27 takes as inputs the input signal and the threshold value from the ATC circuit 22, and performs differential amplification of the input signal with center at the threshold level from the ATC circuit 22 by a gain depending upon a gain control signal from the gain control circuit 26, resulting in functioning as an automatic gain control amplifying portion.

Figure 8:
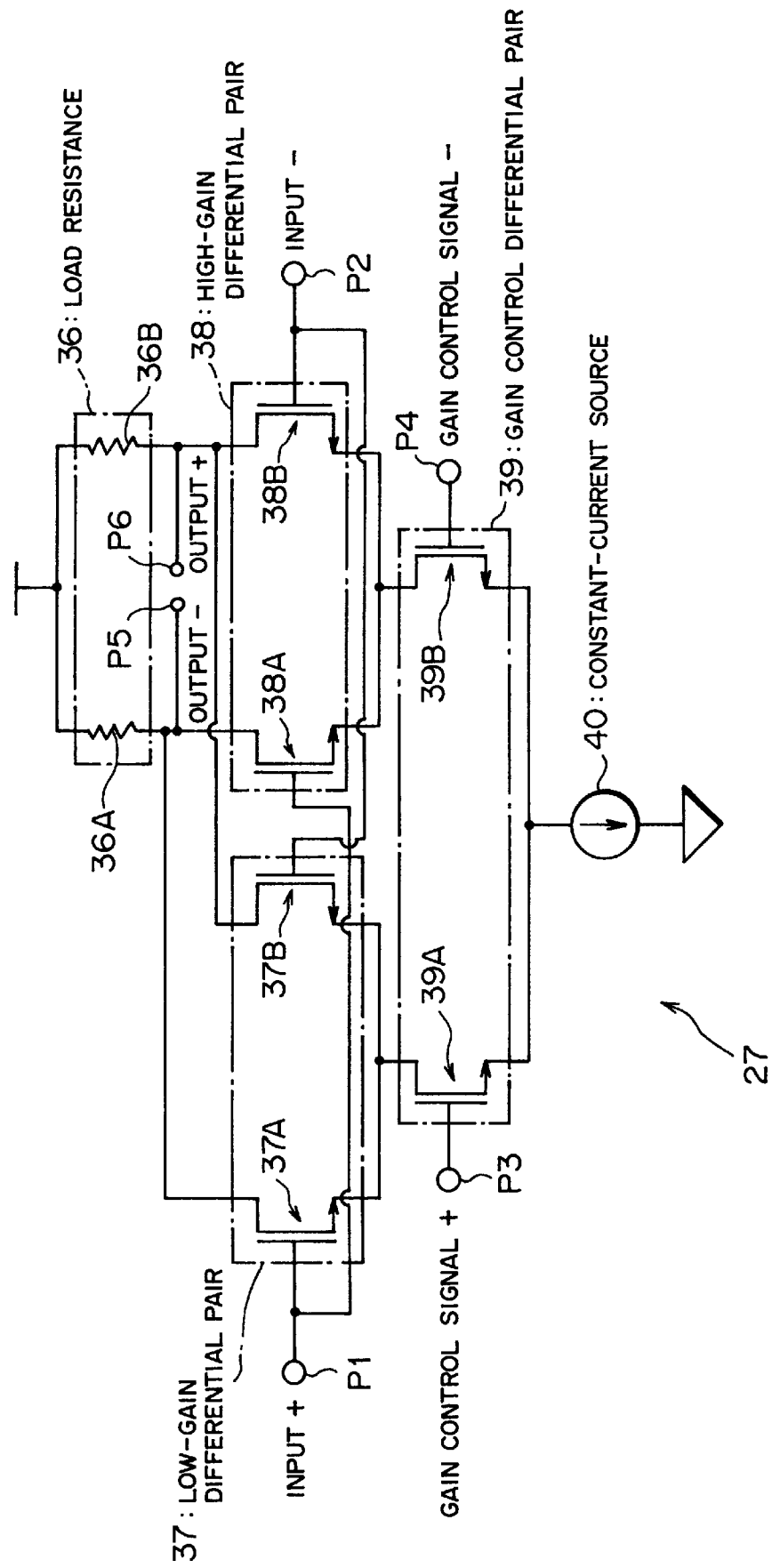
FIG. 8 is a circuit diagram showing one illustrative configuration of an AGC amplifier circuit.

Specifically, as shown in FIG. 8, the AGC amplifier circuit 27 includes a load resistance 36, a low-gain transistor pair 37, a high-gain transistor pair 38, a gain control transistor pair 39, and a constant-current source 40.

Further, the load resistance 36 includes two resistances 36A, 36B, the low-gain transistor pair 37 includes MOS-FETs 37A, 37B, the high-gain transistor pair 38 includes MOS-FETs 38A, 38B, and the gain control transistor pair 39 includes MOS-FETs 39A, 39B.

Here, the low-gain transistor pair 37 and the high-gain transistor pair 38 are designed to have different transconductances. The gain control transistor pair 39 controls a ratio of current values flowing in the two transistor pairs 37, 38, thereby varying a transconductance value of the entire AGC amplifier circuit 27.

Further, since a current flowing in the entire AGC amplifier circuit 27 is determined by the constant-current source 40, limiter amplitude obtained by the product of the current value and the load resistance 36 can be held constant even when a variation is caused in gain.

That is, in the AGC amplifier circuit 27, the two transistor pairs 37, 38 having the different transconductances are connected to the same load resistance 36, and common differential input terminals P1, P2 are connected to inputs of the two transistor pairs so as to control an amplification gain by varying a ratio of current while keeping the entire amount of current flowing in the two transistor pairs 37, 38 substantially constant.

According to such a configuration, in the AGC amplifier circuit 27, as shown in FIG. 8, the input signal and the threshold value from the ATC circuit 22 are respectively input into the low-gain transistor pair 37, and the high-gain transistor pair 38 through the input terminals P1, P2. Further, when the gain control signal from the gain control circuit 26 is input into the gain control transistor pair 39 through gain control terminals P3, P4, differential amplification of the input signal is performed by the gain depending upon the gain control signal with center at the threshold level, and an amplified signal is output through output terminals P5, P6.

Figure 10:
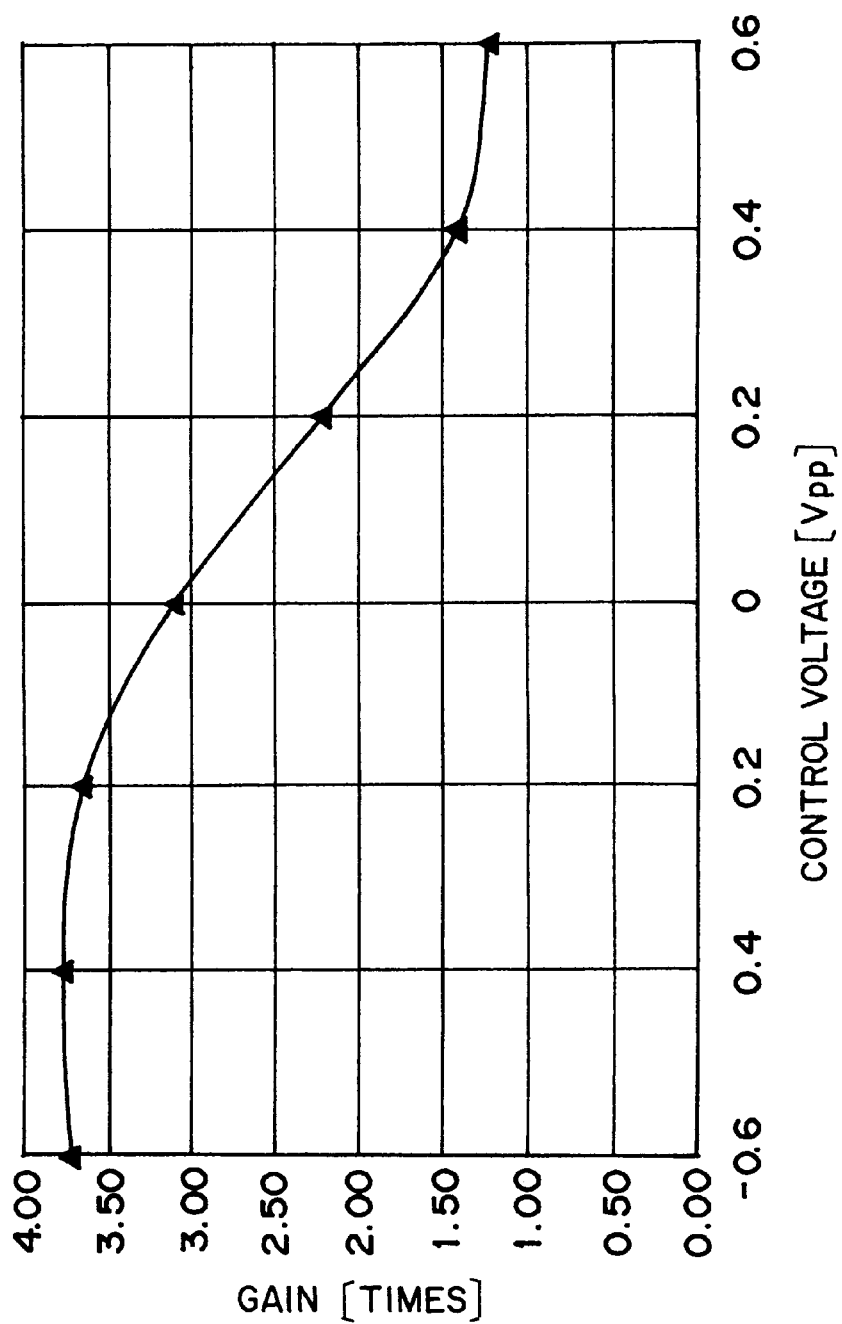
FIG. 10 is a diagram showing one illustrative relationship between a gain control signal and a gain of the AGC amplifier circuit.

FIG. 10 shows one illustrative relationship between the gain control signal (control voltage) and a gain of the AGC amplifier circuit 27. That is, the AGC amplifier circuit 27 has such a gain characteristic that the gain starts to decrease when the control voltage (gain control signal) applied to the gain control terminals P3, P4 becomes $-0.2 V_{pp}$ or more, and the gain is substantially constant with the control voltage of $+0.4 V_{pp}$.

Figure 21:
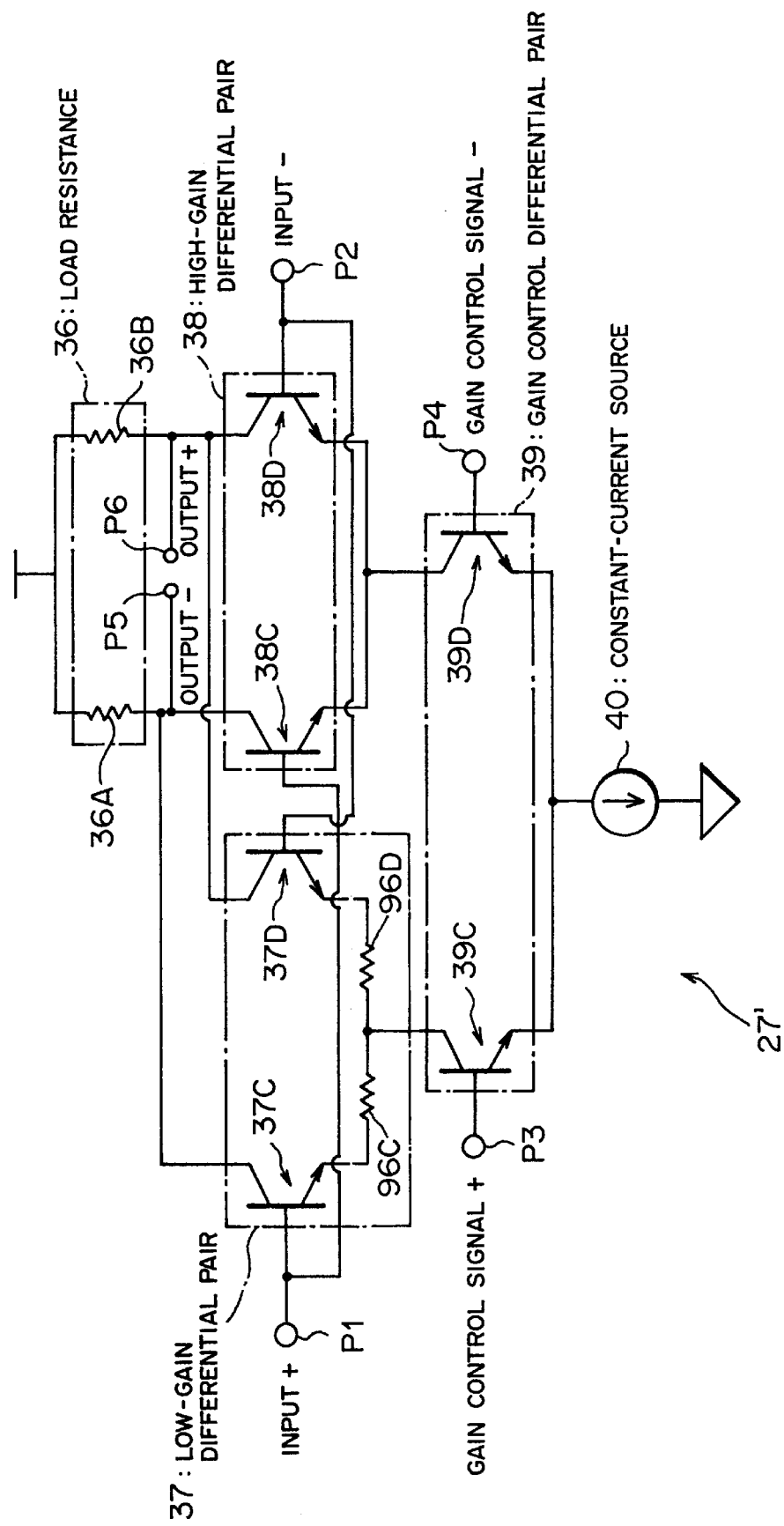
FIG. 21 is a circuit diagram showing another illustrative configuration of an AGC amplifier circuit.

Alternatively, the low-gain transistor pair 37, the high-gain transistor pair 38, and the gain control transistor pair 39 may include a bipolar transistor instead of the MOS-FET. FIG. 21 shows a configuration of an AGC amplifier circuit (the AGC amplifier circuit being shown by reference numeral 27') using the bipolar transistors.

That is, in the AGC amplifier circuit 27' shown in FIG. 21, the low-gain transistor pair 37 includes bipolar transistors 37C, 37D, and emitter resistors 96C, 96D, the high-gain transistor pair 38 includes bipolar transistors 38C, 38D, and the gain control transistor pair 39 includes bipolar transistors 39C, 39D.

Meanwhile, the gain control circuit 26 detects amplitude information (input amplitude level) of the input signal depending upon a difference between the peak value from the peak detecting circuit 23 and the bottom value from the bottom detecting circuit 24, and feeds a gain control signal according to the input amplitude level to the AGC amplifier circuit 27 as a feedforward signal, resulting in functioning as a gain control portion.

Figure 7:
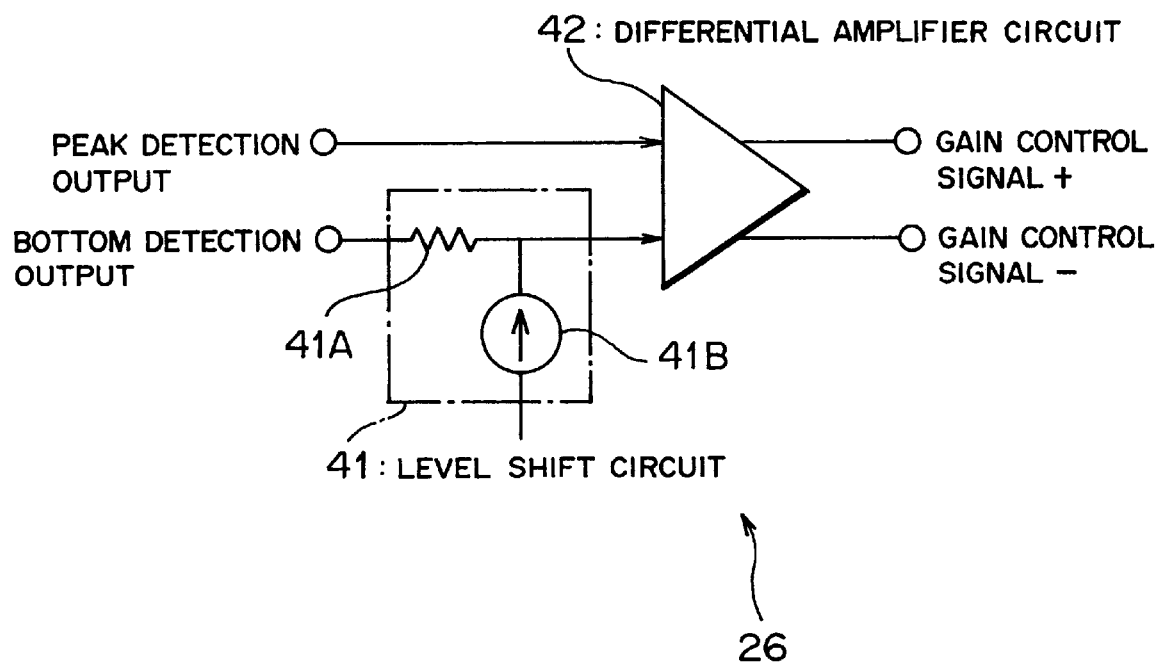
FIG. 7 is a block diagram showing one illustrative configuration of a gain control circuit.

Specifically, as shown in FIG. 7, the gain control circuit 26 includes a level shift circuit 41 and a differential amplifier circuit 42.

Here, the differential amplifier circuit 42 takes as inputs the output (peak value) from the peak detecting circuit 23 and the output (bottom value) from the bottom detecting circuit 24 in the ATC circuit 22 to perform differential amplification, thereby converting a difference level (i.e., input amplitude level) between the peak value and the bottom value into a gain control signal (positive and negative gain control signals) of the AGC amplifier circuit 27.

Further, the level shift circuit 41 is mounted on the input side of an input terminal of the differential amplifier circuit 42 to take as input either the peak value or the bottom value (the bottom value in FIG. 7) so as to shift either the input peak value or bottom value by a predetermined level, and includes a resistance 41A and a constant-current source 41B.

A description will now be given of a gain control made to the AGC amplifier circuit 27 by the gain control circuit 26.

In the embodiment, in order to avoid limitation of a signal amplified in the AGC amplifier circuit 27, a control is made by the gain control circuit 26 such that the gain of the AGC amplifier circuit 27 is varied according to the amplitude level (input amplitude) of the input signal.

Figure 9:
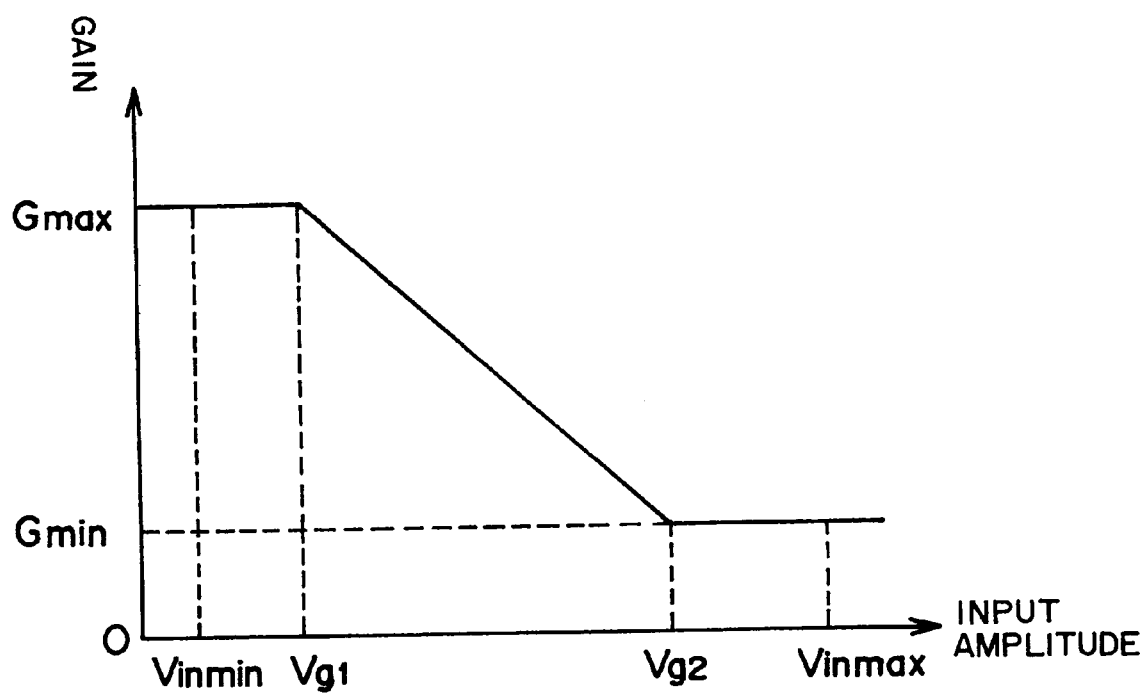
FIG. 9 is a diagram showing one illustrative relationship between an amplitude of an input signal and a gain of the AGC amplifier circuit.

Here, FIG. 9 shows one illustrative relationship between the amplitude of the input signal and the gain of the AGC amplifier circuit 27. That is, as shown in FIG. 9, the gain control circuit 26 controls the gain of the AGC amplifier circuit 27 in a feedforward manner by using the amplitude information of the input signal such that a maximum gain $G_{max}$ can be obtained for small input amplitude, the gain is reduced according to the input amplitude when the input amplitude increases to exceed $V_{g1}$, and a minimum gain $G_{min}$ can be obtained when the input amplitude further increases to exceed $V_{g2}$.

In this case, the maximum gain $G_{max}$ is a value designed such that a signal having minimum input amplitude can be limited in the limiter amplifier circuit 33 shown in FIG. 5.

Figure 11:
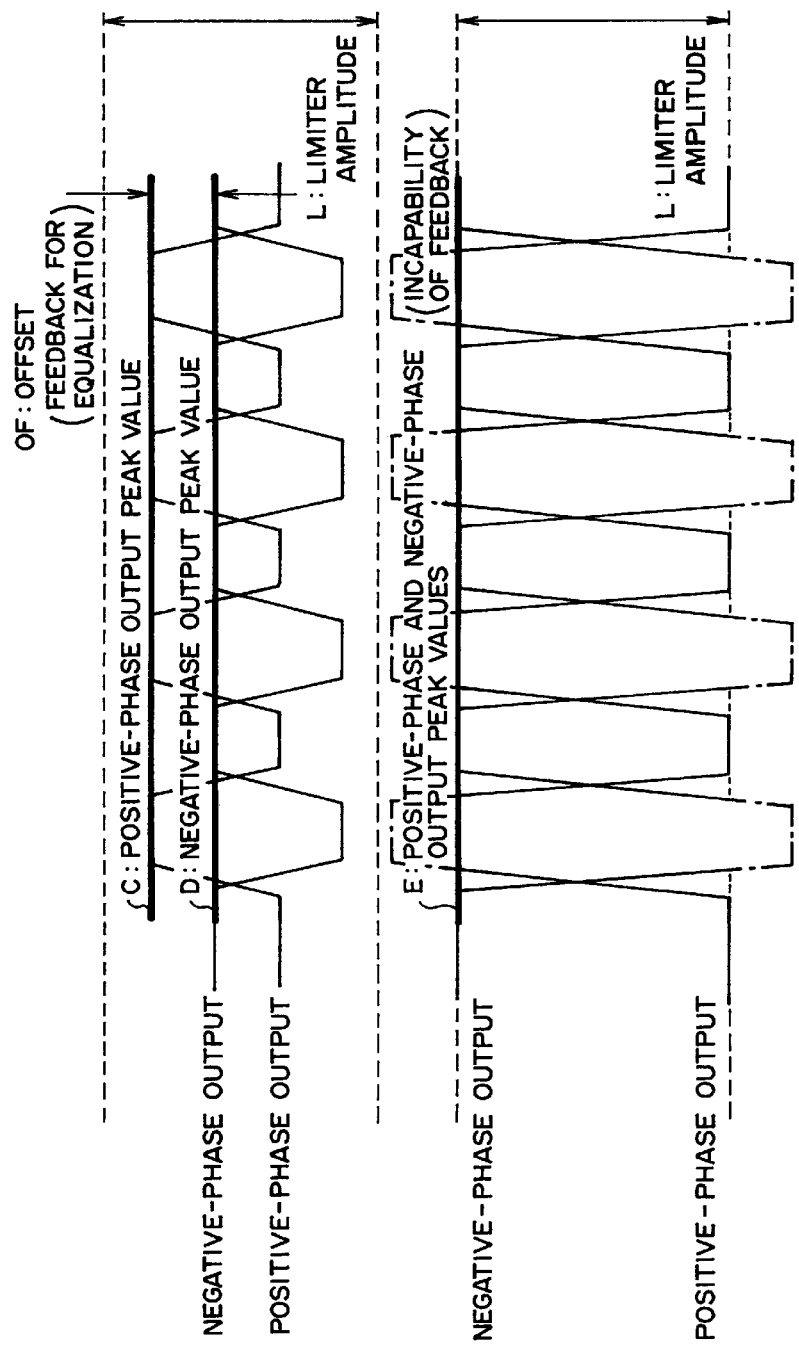
FIGS. 11(a), 11(b), and 12(a) to 12(c) are diagrams for illustrating the operation of the signal amplifier circuit according to the first embodiment of the present invention.

On the other hand, the minimum gain $G_{min}$ is a value designed such that a value of a signal amplified in the AGC amplifier circuit 27 does not exceed a linear range [see limiter amplitude L shown in FIG. 11(a)] of the AGC amplifier circuit 27 (in other words, does not fall within a limiter area of the AGC amplifier circuit 27) even when a signal having maximum amplitude (maximum input level) is input into the AGC amplifier circuit 27.

Specifically, the minimum gain $G_{min}$ which does not exceed the linear range of the AGC amplifier circuit 27 can illustratively be described as:

$$G_{min} = V_{linear}/V_{inmax}$$

where $V_{linear}$: linear range of output from AGC amplifier circuit 27; and $V_{inmax}$: maximum input level That is, the AGC amplifier circuit 27 is controlled by the gain control circuit 26 to provide an output signal whose level does not exceed the liner range.

Moreover, the output signal from the AGC amplifier circuit 27 does not have a constant level. However, this is a minor problem because it is an object to avoid the limitation of the signal amplified in the AGC amplifier circuit 27 at a first stage in the gain control in the signal amplifier circuit 20 according to the embodiment, and the level of the output signal is determined by the limiter amplifier circuit 33 positioned on the side of a subsequent stage of the AGC amplifier circuit 27.

Further, a specific description will now be given of the gain control made to the AGC amplifier circuit 27 by the gain control circuit 26.

It is necessary to control the AGC amplifier circuit 27 so as to provide the maximum gain $G_{max}$ when no signal is input into the signal amplifier circuit 20 (when the input signal has amplitude of zero) as shown in FIG. 9.

However, when a peak value and a bottom value are directly input into the gain control circuit 26 in case of the input signal having the amplitude of zero, a difference level between the peak value and the bottom value also becomes zero. Hence, the gain control circuit 26 outputs a gain control signal of $0V_{pp}$.

In this case, since the AGC amplifier circuit 27 has the gain characteristic as shown in FIG. 10, the gain of the AGC amplifier circuit 27 is naturally set to a value of the maximum gain $G_{max}$ or less.

Thus, in the embodiment, in order to appropriately control the gain of the AGC amplifier circuit 27, the level shift circuit 41 is mounted in the gain control circuit 26 to shift either the peak value or the bottom value by the predetermined level.

A level shift value in the level shift circuit 41 and a gain in the differential amplifier circuit 42 are designed such that, for example, with respect to the AGC amplifier circuit 27 having the characteristic as shown in FIG. 10, the output (gain control signal) from the gain control circuit 26 becomes $-0.2V_{pp}$ (see FIG. 10) for the input signal having the amplitude of $V_{g1}$ (see FIG. 9), and output from the gain control circuit 26 becomes $+0.4V_{pp}$ (see FIG. 10) for the input signal having the amplitude of $V_{g2}$ (see FIG. 9).

Meanwhile, the offset compensation feedback loop 28 shown in FIG. 5 makes low-pass filter processing to a difference level between peak values of differential outputs of the AGC amplifier circuit 27, and feeds back the result as difference information of the output signal from the AGC amplifier circuit 27 to the input side of the AGC amplifier circuit 27 (an output portion of the ATC circuit 22 in FIG. 5) to provide offset compensation so as to provide equal peak values of the differential outputs from the AGC amplifier circuit 27. The offset compensation feedback loop 28 includes output peak detecting circuits 29-1, 29-2, an error amplifier circuit 30, a low-pass filter 31, and a resistance 32.

Here, the output peak detecting circuits 29-1, 29-2 respectively detect peak values [a positive-phase output peak value C and a negative-phase output peak value D shown in FIG. 11(a)] of the differential outputs (positive-phase output and negative-phase output) from the AGC amplifier circuit 27.

Further, the error amplifier circuit 30 amplifies as offset OF shown in FIG. 11(a) a difference between the respective peak values C and D detected by the output peak detecting circuits 29-1, 29-2.

Further, the low-pass filter 31 makes the low-pass filter processing to the offset OF amplified by the error amplifier circuit 30, thereby removing a high frequency component to obtain a DC component as offset information. An output portion of the low-pass filter 31 is connected to an output portion of the voltage dividing circuit 25 of the ATC circuit 22 through the resistance 32.

Here, the used resistance 32 has a greater value of resistance than values of resistance of the resistances 25A, 25B in the voltage dividing circuit 25, and is operated like a constant-current source, thereby removing current from the resistances 25A, 25B, or feeding current to the resistances 25A, 25B so as to compensate for the offset.

Further, the offset information obtained by the offset compensation feedback loop 28 is fed back to the input side (the inverting input portion of the AGC amplifier circuit 27 in FIG. 5) of the AGC amplifier circuit 27.

Moreover, even when no signal is input into the signal amplifier circuit 20 (in the absence of an input signal), the offset compensation feedback loop 28 compares dc levels of differential output signals of the AGC amplifier circuit 27 to output the offset information.

Figure 30:
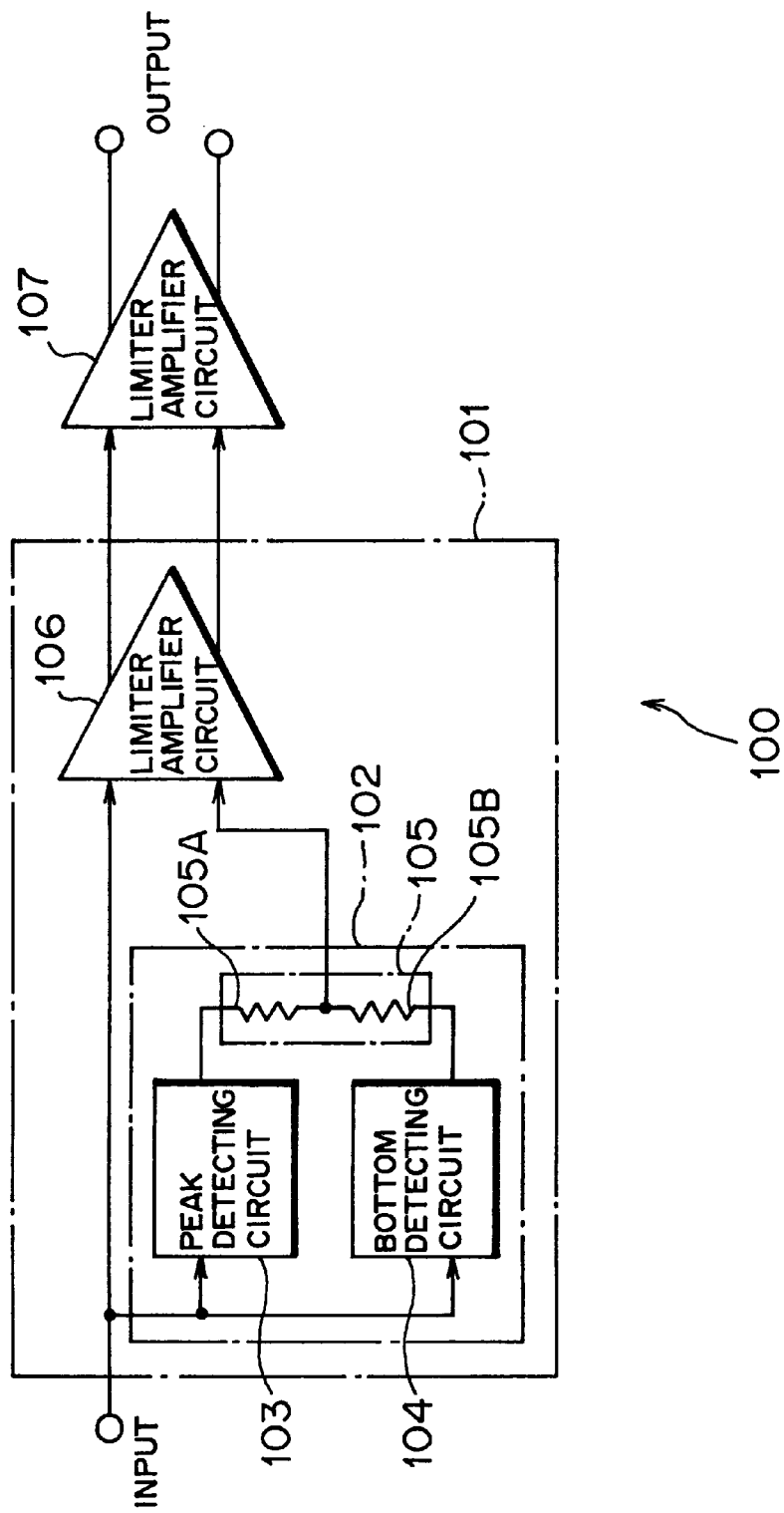
FIG. 30 is a block diagram showing a configuration of a conventional signal amplifier circuit.
Figures 31A, 31B, 31C:
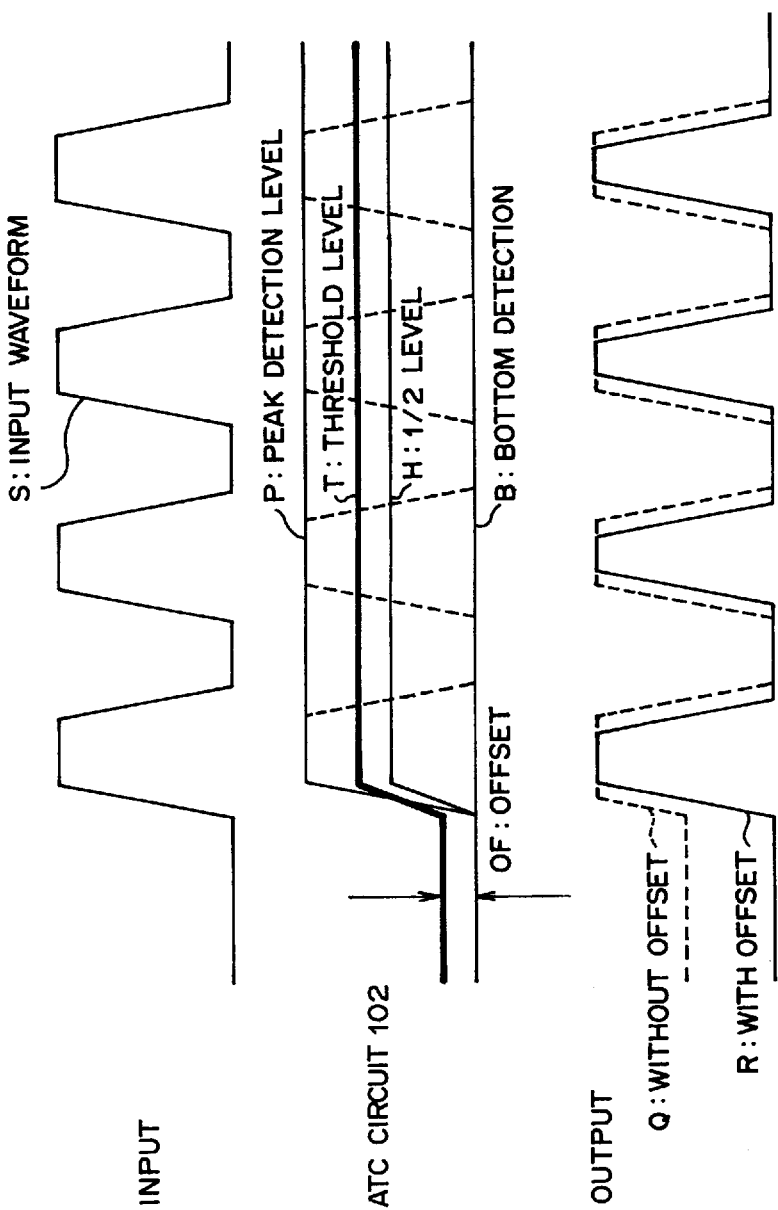
FIGS. 31(a) to 31(c) are diagrams for illustrating the operation of the conventional signal amplifier circuit.
Figure 32A:
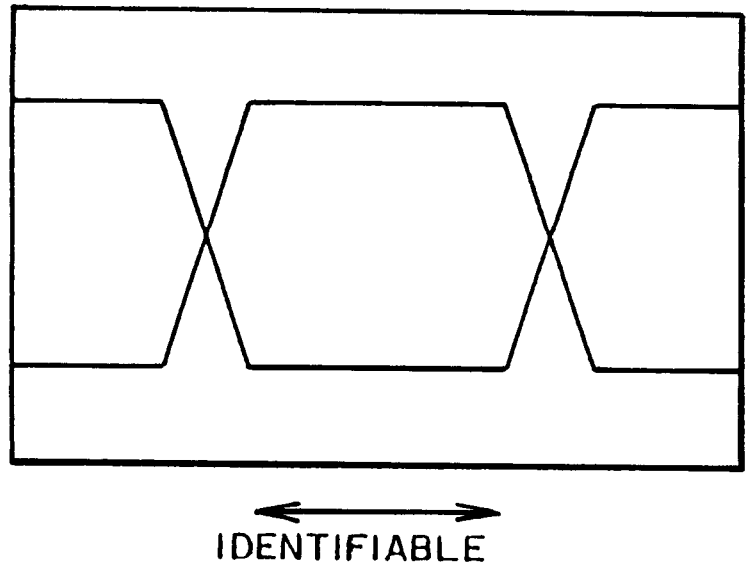
FIGS. 32(a), 32(b) are diagrams showing eye patterns of output signals from the conventional signal amplifier circuit.
Figure 32B:
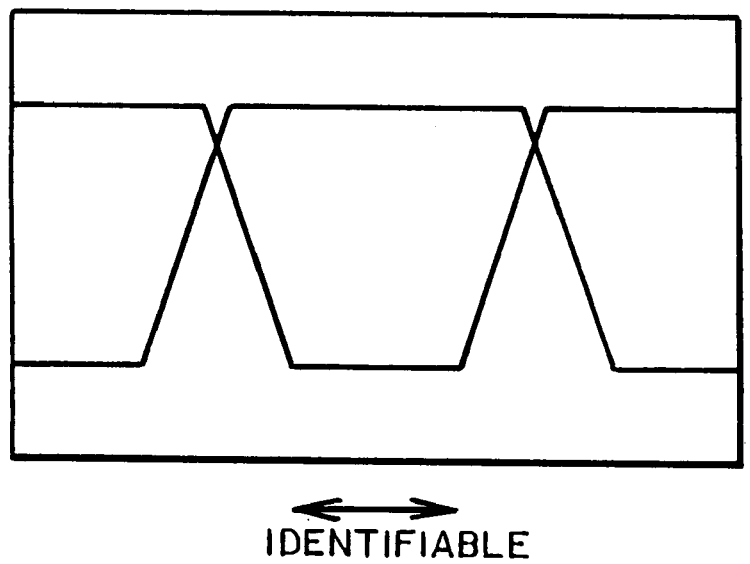

Here, as shown in FIG. 30, the signal amplifier circuit may include a limiter amplifier circuit (see reference numeral 106 in FIG. 30) instead of the AGC amplifier circuit 27. In this case, since a peak value of an output signal is limited as shown in FIG. 11(b) [see reference numeral E in FIG. 11(b)], the limiter amplifier circuit continuously provides an output signal with constant amplitude irrespective of amplitude of an input signal. As a result, it is impossible to configure an offset compensation feedback loop using the peak value of the output signal as described above.

Nevertheless, in the embodiment, as stated above, the gain control circuit 26 controls the AGC amplifier circuit 27 to operate in the linear range. Then, it is possible to configure the offset compensation feedback loop 28 using the peak value of the output signal from the AGC amplifier circuit 27.

Meanwhile, the delay circuit 43 is connected to the input side of the AGC amplifier circuit 27 so as to input a signal into the AGC amplifier circuit 27 with time delay sufficient for a rise of the gain control signal from the gain control circuit 26.

In the ATC-AGC amplifier circuit 21, the gain control signal from the gain control circuit 26 cannot rise before detection of the peak value and the bottom value is completed in the peak detecting circuit 23 and the bottom detecting circuit 24 of the ATC circuit 22. Thus, it is impossible to normally control the gain of the AGC amplifier circuit 27.

Figure 12:
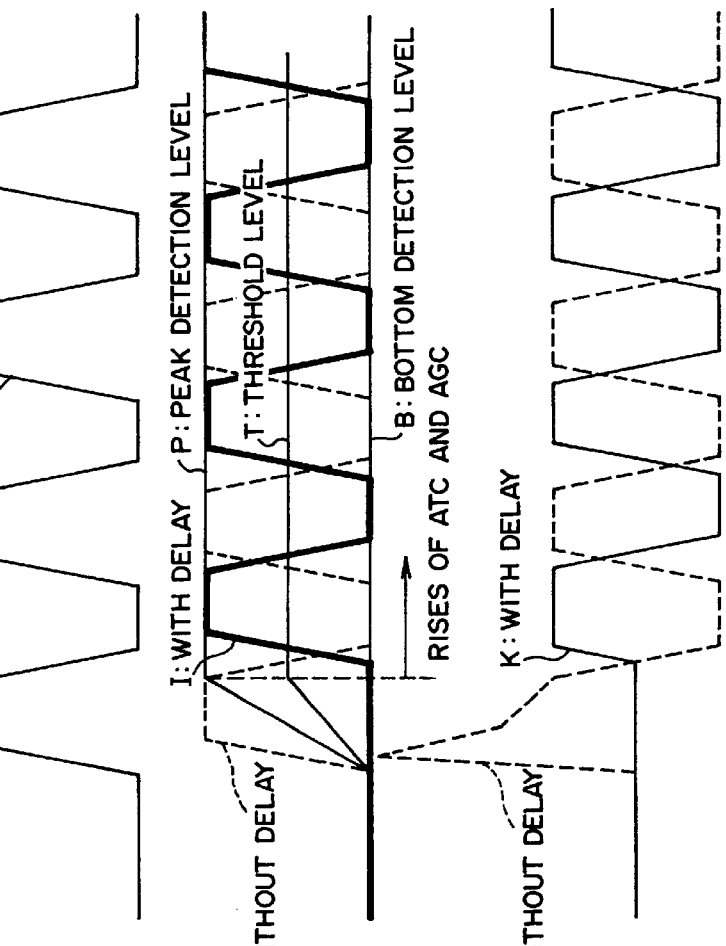

FIG. 12(a) shows a waveform of a signal input into the signal amplifier circuit 20, FIG. 12(b) is a waveform of a signal input into the AGC amplifier circuit 27, and FIG. 12(c) is a waveform of a signal output from the AGC amplifier circuit 27.

When the signal (see reference numeral S) having the waveform as shown in FIG. 12(a) is input, in the ATC circuit 22, as shown in FIG. 12(b), a peak value and a bottom value (see reference numerals P, B) are detected from the input waveform S to set a threshold level to a one-half level depending upon the value (see reference numeral T).

However, when a signal is input before the detection of the peak value and the bottom value is completed [see reference numeral G in FIG. 12(b)], the gain of the AGC amplifier circuit 27 has not been controlled at the time point. Therefore, the gain of the AGC amplifier circuit 27 is greater than a proper value so that an initial portion of the signal (in particular, a first bit of the signal) overshoots excessively greater than later signals [see reference numeral J in FIG. 12(c)].

When the overshooting signal is output from the AGC amplifier circuit 27, the overshooting signal is detected by the output peak detecting circuits 29-1, 29-2 in the offset compensation feedback loop 28. Hence, the circuits at the subsequent stages may be adversely affected, resulting in abnormal feedback or the like.

Alternatively, when limiter amplification of the overshooting signal is performed in the limiter amplifier circuit 33, an output signal may have a pulse width greater than an actual pulse width.

Hence, in the embodiment, in order to avoid the overshoot of the signal, the delay circuit 43 is mounted on the input side of the AGC amplifier circuit 27 such that the signal is input into the AGC amplifier circuit 27 after the rise of the gain control signal from the gain control circuit 26, and the gain of the AGC amplifier circuit 27 is completely set when the signal is input into the AGC amplifier circuit 27 [see reference numeral I in FIG. 12(b) and reference numeral K in FIG. 12(c)].

In a receiving portion of an optical communication system to which the signal amplifier circuit 20 is applied (see FIG. 6), the delay circuit 43 may be removed if no problem is caused even when the initial portion of the signal overshoots.

Meanwhile, the limiter amplifier circuit 33 shown in FIG. 5 takes as input a differential signal from the AGC amplifier circuit 27 of the signal amplification basic block portion 92 to perform differential amplification of the input signal, and thereafter limit the result to a predetermined signal level, resulting in serving as a limiter amplifying portion. Moreover, in the limiter amplifier circuit 33, output amplitude is limited to a constant level throughout an input range.

According to the configuration described above, in the signal amplifier circuit 20 according to the first embodiment of the present invention, when the signal is input, the ATC circuit 22 of the signal amplification basic block portion 92 automatically sets the threshold value depending upon the peak value and the bottom value of the input signal.

Further, the offset compensation feedback loop 28 detects the offset information from the differential output of the AGC amplifier circuit 27 to feed back the result to the input side of the AGC amplifier circuit 27, and operates such that current flows therein out of the offset compensation feedback loop 28 for the offset on the negative side, or current flows into the offset compensation feedback loop 28 for the offset on the positive side. It is thereby possible to compensate for the offset so as to provide the equal peak values of the differential outputs from the AGC amplifier circuit 27, and appropriately compensate for a threshold level.

Further, the gain control circuit 26 detects the input amplitude level from the difference between the peak value and the bottom value detected in the ATC circuit 22 to generate the gain control signal such that, as shown in FIG. 9, the gain of the AGC amplifier circuit 27 is increased for lesser amplitude of the input signal, and the gain of the AGC amplifier circuit 27 is decreased for greater amplitude of the input signal. The gain control signal is fed to the AGC amplifier circuit 27 as the feedforward signal.

Subsequently, the AGC amplifier circuit 27 takes as inputs the signal input through the delay circuit 43, and the threshold value appropriately compensated by the offset compensation feedback loop 28 and sent from the ATC circuit 22. With the gain depending upon the gain control signal from the gain control circuit 26, the AGC amplifier circuit 27 performs the differential amplification of the input signal with center at the threshold level from the ATC circuit 22.

Then, the limiter amplifier circuit 33 takes as input the signal obtained through the differential amplification by the AGC amplifier circuit 27 of the signal amplification basic block portion 92. The limiter amplifier circuit 33 performs the differential amplification of the input signal, and thereafter limits the result to the predetermined signal level.

As set forth above, according to the first embodiment of the present invention, the signal amplifier circuit 20 includes the ATC-AGC amplifier circuit 21 having the ATC circuit 22, the gain control circuit 26, and the AGC amplifier circuit 27, and the gain control circuit 26 is used to control such that the AGC amplifier circuit 27 can be operated in its linear range throughout an amplitude level of the input signal. It is thereby possible to avoid the limitation of the signal amplified in the AGC amplifier circuit 27.

Thus, since there is no loss of the amplitude information of the signal output from the AGC amplifier circuit 27, the offset compensation feedback loop 28 using the peak value of the output signal can be mounted. It is thereby possible to compensate for the offsets present in the respective circuits forming the signal amplifier circuit 20 so as to suppress the variation in pulse width of the output signal, and obtain a good output waveform over a wide dynamic range with respect to an input signal level.

Further, the gain control circuit 26 is used to control the AGC amplifier circuit 27 in a feedforward manner. It is thereby possible to provide a smaller time constant of response than would be in an AGC amplifying portion according to a typically employed feedback control. Hence, it is possible to provide a more rapid rise of the AGC amplifier circuit 27, resulting in particularly effective function at a time of high-speed transmission of signals in, for example, the optical communication.

Further, the ATC circuit 22 sets the threshold value depending upon the amplitude of the input signal. It is thereby possible to rapidly set the threshold value even when the signal is intermittently input.

Further, the delay circuit 43 is mounted such that the signal can be input into the AGC amplifier circuit 27 after the rise of the gain control signal from the gain control circuit 26. It is thereby possible to completely set the gain of the AGC amplifier circuit 27 when the signal is input into the AGC amplifier circuit 27. Consequently, it is possible to avoid the overshoot of the signal so as to prevent a malfunction of the signal amplifier circuit 20.

This embodiment has been described with respect to a case where the offset compensation feedback loop 28 includes the output peak detecting circuits 29-1, 29-2, makes the low-pass filter processing to the difference level between the respective peak values of the differential outputs of the AGC amplifier circuit 27, and feeds back the result to the input side of the AGC amplifier circuit 27 to compensate for the offset of the AGC amplifier circuit 27. However, the offset compensation feedback loop 28 may include two output bottom detecting circuits instead of the output peak detecting circuits 29-1, 29-2, and may make low-pass filter processing to a difference level between bottom values of the differential outputs of the AGC amplifier circuit 27 to feed back the result to the input side of the AGC amplifier circuit 27 so as to compensate for the offset of the AGC amplifier circuit 27. In such a manner, the signal amplifier circuit 20 can be configured suitably for its use.

In this case, the two output bottom detecting circuits respectively detect the bottom values of the differential outputs (positive-phase output and negative-phase output) from the AGC amplifier circuit 27. Concurrently, the error amplifier circuit 30 amplifies the difference between the bottom values detected by the output bottom detecting circuits to define the result as offset information.

Further, this embodiment has been described by way of example with respect to a case where the signal amplifier circuit 20 is used as the signal interface circuit to shape the waveform of the optical signal attenuated at the time of transmission in the receive portion in the optical communication system. However, the signal amplifier circuit 20 may be used as a high-speed/small-amplitude signal interface circuit in the field of information processing.

(c) Description of Second Embodiment

Figure 13:
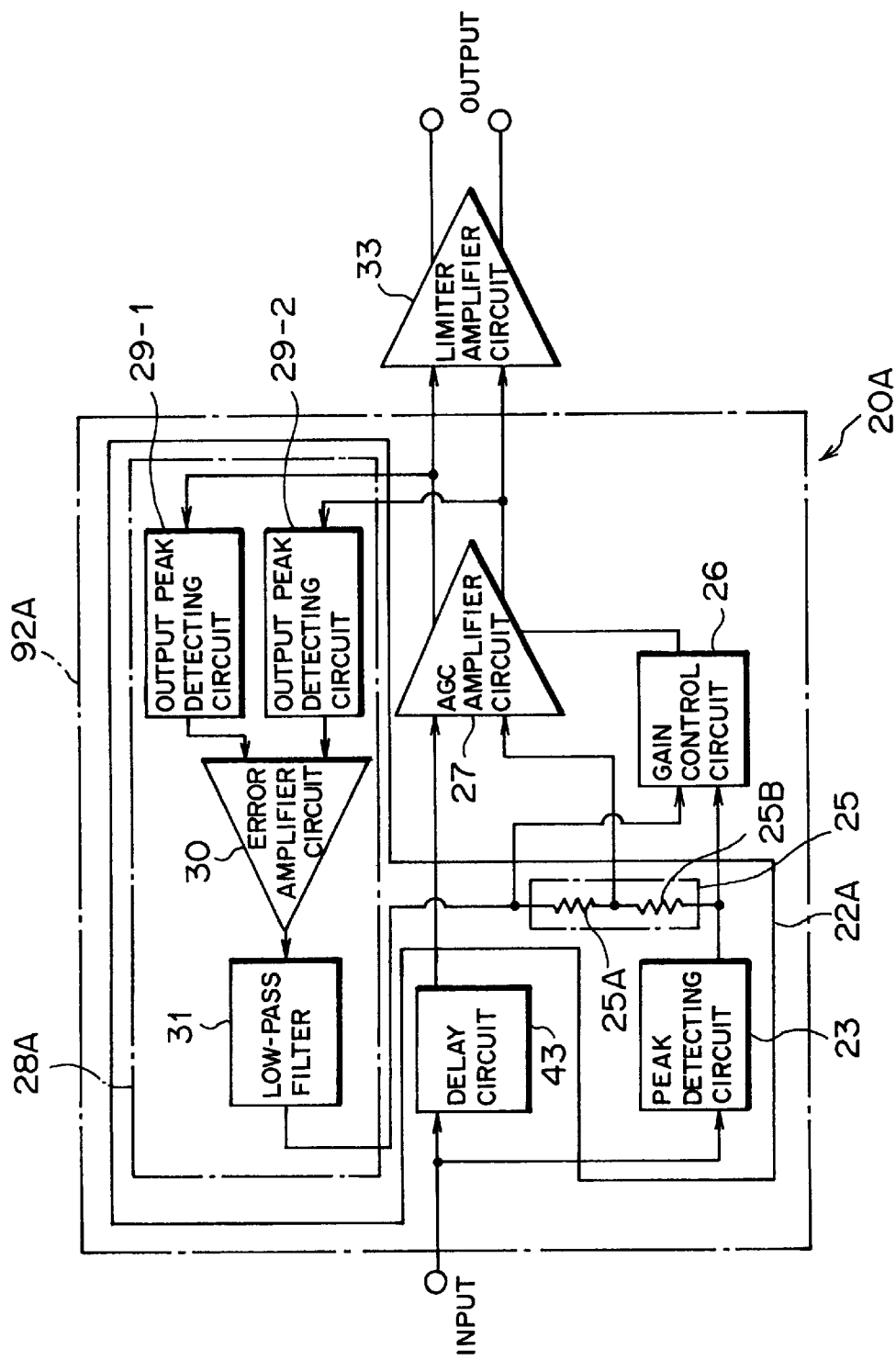
FIG. 13 is a block diagram showing a configuration of a signal amplifier circuit according to the second embodiment of the present invention.

FIG. 13 is a block diagram showing a configuration of a signal amplifier circuit according to the second embodiment of the present invention.

As in the first embodiment described above, a signal amplifier circuit 20A shown in FIG. 13 is also used as a signal interface circuit to shape a waveform of an optical signal attenuated at a time of transmission in, for example, a receiving portion in an optical communication system. The signal amplifier circuit 20A includes a signal amplification basic block portion 92A, and a limiter amplifier circuit 33 serving as a limiter amplification basic block portion at a subsequent stage of the signal amplification basic block portion 92A.

In this embodiment, the signal amplification basic block portion 92A includes an ATC circuit 22A having an offset compensation feedback loop 28A, an AGC amplifier circuit 27, a gain control circuit 26, and a delay circuit 43.

Here, like the ATC circuit 22 in the first embodiment described above, the ATC circuit 22A detects a peak value and a bottom value of an input signal to automatically set an intermediate value between the values as a threshold value. In this embodiment, the ATC circuit 22A includes a peak detecting circuit 23, the offset compensation feedback loop 28A, and a voltage dividing circuit 25.

As in the first embodiment described above, the offset compensation feedback loop 28A makes low-pass filter processing to a difference level between peak values of differential outputs of the AGC amplifier circuit 27, and feeds back the result to an input side of the AGC amplifier circuit 27 (an input portion of the voltage dividing circuit 25 in FIG. 13) to provide offset compensation so as to provide equal peak values of the differential outputs from the AGC amplifier circuit 27. The offset compensation feedback loop 28A has the same configuration as that in the first embodiment except that the resistance 32 shown in FIG. 5 is not mounted.

A resistance corresponding to the resistance 32 is not mounted in this embodiment because feedback output of the offset compensation feedback loop 28A is input into a bottom level input terminal of the voltage dividing circuit 25. In this way, it is also possible to compensate for offset as in the above-mentioned first embodiment.

Here, when the signal amplifier circuit 20A according to this embodiment is used as the signal interface circuit particularly in the optical communication system, output from the offset compensation feedback loop 28A is stabilized at a level corresponding to a "0" side level of the input signal since the input signal is a unipolar signal.

Hence, in the embodiment, the ATC circuit 22A uses a peak value from the peak detecting circuit 23 as a "1" side level, and concurrently uses output information from the offset compensation feedback loop 28A as the "0" side level (offset information being reflected in the "0" side level), thereby generating a threshold value.

That is, in the embodiment, the offset compensation feedback loop 28A also serves as a "0" side level output circuit. Output from the offset compensation feedback loop 28A is fed back to the input side (i.e., the voltage dividing circuit 25) of the AGC amplifier circuit 27, and is input into the gain control circuit 26.

Moreover, as set forth above, even when no signal is input into the signal amplifier circuit 20A (in the absence of an input signal), the offset compensation feedback loop 28A compares dc levels of differential output signals of the AGC amplifier circuit 27 to output the offset information.

Further, the AGC amplifier circuit 27, the gain control circuit 26, the limiter amplifier circuit 33, the peak detecting circuit 23, the voltage dividing circuit 25, and the delay circuit 43 are the same in function and configuration as the corresponding component parts described in the first embodiment.

According to this configuration, in the signal amplifier circuit 20A according to the second embodiment of the present invention, in response to input of a signal, the offset compensation feedback loop 28A of the signal amplification basic block portion 92A causes a variation in "0" side level of the input signal for the offset compensation, thereby compensating for the offset so as to provide the equal peak values of the differential outputs from the AGC amplifier circuit 27. The ATC circuit 22A automatically sets the threshold value appropriately compensated depending upon the peak value of the input signal and the "0" side level (i.e., the output information from the offset compensation feedback loop 28A) of the input signal.

Further, the gain control circuit 26 generates a gain control signal according to a difference between the peak value detected in the ATC circuit 22A and the "0" side level of the input signal, and feeds the signal to the AGC amplifier circuit 27 as a feedforward signal.

Subsequently, when the AGC amplifier circuit 27 takes as inputs the signal input through the delay circuit 43 and the threshold value appropriately compensated by the offset compensation feedback loop 28A and sent from the ATC circuit 22A, the AGC amplifier circuit 27 performs differential amplification of the input signal with center at the threshold level from the ATC circuit 22A by using a gain depending upon the gain control signal from the gain control circuit 26.

Thereafter, when the limiter amplifier circuit 33 takes as input a signal obtained through the differential amplification by the AGC amplifier circuit 27 of the signal amplification basic block portion 92A, the limiter amplifier circuit 33 performs differential amplification of an input signal, and thereafter limits the result to a predetermined signal level.

As set forth above, according to the second embodiment of the present invention, the signal amplifier circuit 20A includes the ATC circuit 22 having the offset compensation feedback loop 28A, the gain control circuit 26, the AGC amplifier circuit 27, and the delay circuit 43. It is thereby possible to provide the same advantages as those of the signal amplifier circuit 20 according to the first embodiment described above. In addition, since the offset compensation feedback loop 28A can also serve as the "0" side level output circuit, it is possible to reduce the number of circuits forming the signal amplifier circuit 20A so as to simplify the configuration of the signal amplifier circuit 20A.

(d) Description of Third Embodiment

Figure 14:
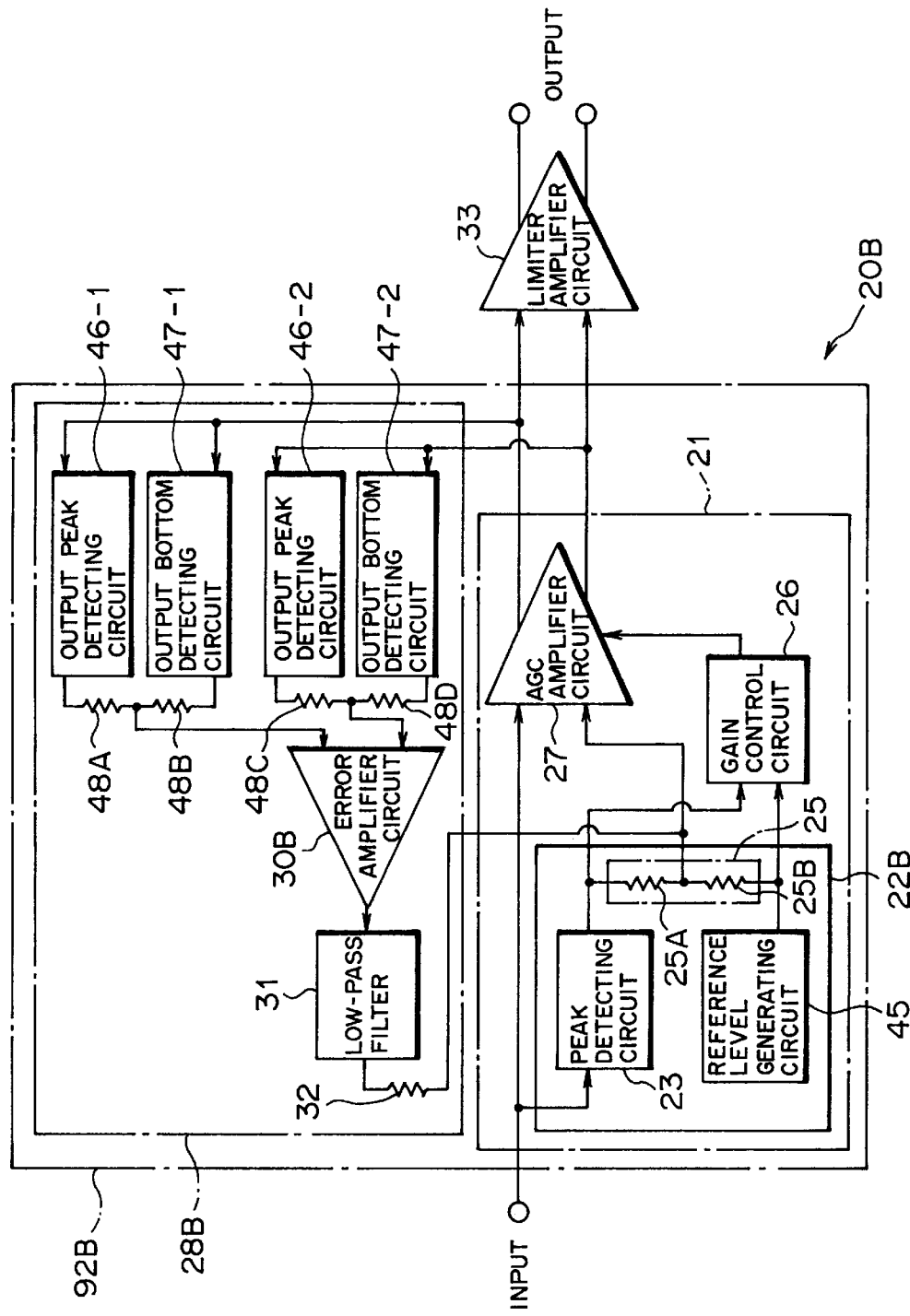
FIG. 14 is a block diagram showing a configuration of a signal amplifier circuit according to the third embodiment of the present invention.

FIG. 14 is a block diagram showing a configuration of a signal amplifier circuit according to the third embodiment of the present invention.

As in the above-mentioned first and second embodiments, a signal amplifier circuit 20B shown in FIG. 14 is also used as a signal interface circuit to shape a waveform of an optical signal attenuated at a time of transmission in, for example, a receive portion in an optical communication system. The signal amplifier circuit 20B includes a signal amplification basic block portion 92B, and a limiter amplifier circuit 33 serving as a limiter amplification basic block portion at a subsequent stage of the signal amplification basic block portion 92B.

Here, the signal amplification basic block portion 92B includes an ATC-AGC amplifier circuit 21 including an ATC circuit 22B, an AGC amplifier circuit 27, and a gain control circuit 26, and an offset compensation feedback loop 28B.

Like the ATC circuit 22 in the first embodiment, the ATC circuit 22B detects a peak value and a bottom value of an input signal to automatically set an intermediate value between the values as a threshold value. In this embodiment, the ATC circuit 22B includes a peak detecting circuit 23, a reference level generating circuit 45, and a voltage dividing circuit 25.

Here, when the signal amplifier circuit 20B according to the embodiment is used as the signal interface circuit in the optical communication system, an input signal is a unipolar signal. In such a case, a "0" side level is kept constant irrespective of the amplitude of the input signal. Therefore, it is not particularly necessary to detect the "0" side level of the input signal.

Hence, in this embodiment, in order to simplify a circuit configuration, there is provided the reference level generating circuit 45 to generate a reference level signal corresponding to the "0" side level of the input signal instead of the bottom detecting circuit (see, for example, reference numeral 24 in FIG. 5) described in the first and second embodiments. The ATC circuit 22B uses a peak value from the peak detecting circuit 23 as a "1" side level, and concurrently uses the reference level from the reference level generating circuit 45 as the "0" side level, thereby generating a threshold value.

Further, in this embodiment, the offset compensation feedback loop 28B makes low-pass filter processing to a difference level between values obtained by dividing a peak value and a bottom value of differential outputs of the AGC amplifier circuit 27, and feeds back the result to an input side of the AGC amplifier circuit 27 (an output portion of the ATC circuit 22B in FIG. 14) to provide offset compensation so as to provide the equal voltages by dividing the peak value and the bottom value of the differential outputs from the AGC amplifier circuit 27.

That is, as shown in FIG. 14, the offset compensation feedback loop 28B includes output peak detecting circuits 46-1, 46-2, output bottom detecting circuits 47-1, 47-2, resistances 48A to 48D, an error amplifier circuit 30B, a low-pass filter 31, and a resistance 32. An output terminal of the output peak detecting circuit 46-1 is connected to an output terminal of the output bottom detecting circuit 47-1 through the resistances 48A, 48B connected in series, and an output terminal of the output peak detecting circuit 46-2 is connected to an output terminal of the output bottom detecting circuit 47-2 through the resistances 48C, 48D connected in series.

In this case, the output peak detecting circuits 46-1, 46-2 detect the peak values of the differential output (positive-phase output and negative-phase output) signals from the AGC amplifier circuit 27. The output bottom detecting circuits 47-1, 47-2 detect the bottom values of the differential output (positive-phase output and negative-phase output) signals from the AGC amplifier circuit 27.

The peak value detected by the output peak detecting circuit 46-1 and the bottom value detected by the output bottom detecting circuit 47-1 are divided by the resistances 48A, 48B, and the peak value detected by the output peak detecting circuit 46-2 and the bottom value detected by the output bottom detecting circuit 47-2 are divided by the resistances 48C, 48D. The respective results are output to the error amplifier circuit 30B.

Further, the error amplifier circuit 30B amplifies as offset a difference between divided voltage values obtained by dividing the peak values and the bottom values of the differential outputs of the AGC amplifier circuit 27 by the resistances 48A to 48D.

Moreover, the AGC amplifier circuit 27, the gain control circuit 26, the limiter amplifier circuit 33, the peak detecting circuit 23, the voltage dividing circuit 25, the low-pass filter 31, and the resistance 32 are the same in function and configuration as the corresponding component parts described in the first embodiment.

According to the above-mentioned configuration, in the signal amplifier circuit 20B according to the third embodiment of the present invention, in response to input of a signal, the ATC circuit 22B of the signal amplification basic block portion 92B automatically sets the threshold value depending upon the peak value of the input signal and the reference level.

Further, the offset compensation feedback loop 28B detects offset information from the differential outputs of the AGC amplifier circuit 27, and feeds back the result to the input side of the AGC amplifier circuit 27, thereby compensating for the offset so as to provide the equal voltages by dividing the peak value and the bottom value of the differential outputs from the AGC amplifier circuit 27, thereby appropriately compensating for the threshold level.

Further, the gain control circuit 26 generates a gain control signal according to a difference between the peak value detected in the ATC circuit 22B and the reference level, and feeds the signal to the AGC amplifier circuit 27 as a feedforward signal.

Subsequently, when the input signal and the threshold value from the ATC circuit 22B are input into the AGC amplifier circuit 27, the AGC amplifier circuit 27 performs differential amplification of the input signal with a center at the threshold level from the ATC circuit 22B by using a gain depending upon the gain control signal from the gain control circuit 26.

Thereafter, when the limiter amplifier circuit 33 takes as input a signal obtained through the differential amplification by the AGC amplifier circuit 27 of the signal amplification basic block portion 92B, the limiter amplifier circuit 33 performs differential amplification of the input signal, and limits the result to a predetermined signal level.

As set forth above, according to the third embodiment of the present invention, the signal amplifier circuit 20B includes the ATC circuit 22, the gain control circuit 26, the AGC amplifier circuit 27, and the offset compensation feedback loop 28B. It is thereby possible to provide the same advantages as those of the signal amplifier circuit 20 according to the first embodiment described above. In addition, since the ATC circuit 22 includes the reference level generating circuit 45, it is possible to simplify the configuration of the signal amplifier circuit 20B.

Further, the offset compensation feedback loop 28B includes the output peak detecting circuits 46-1, 46-2, and the output bottom detecting circuits 47-1, 47-2 to compensate for the offset of the AGC amplifier circuit 27 by using the voltage obtained by dividing the peak value and the bottom value of the differential outputs of the AGC amplifier circuit 27 (i.e., an intermediate value between the peak value and the bottom value of the differential outputs of the AGC amplifier circuit 27 like the threshold level from the ATC circuit 22B). It is thereby possible to provide stable offset compensation even when a variation is caused in the input level of the signal.

Moreover, in this embodiment, if a delay circuit (see reference numeral 43 in FIG. 5) is mounted on the input side of the AGC amplifier circuit 27, as stated above, the signal can be input into the AGC amplifier circuit 27 after a rise of the gain control signal from the gain control circuit 26. It is thereby possible to avoid overshoot [see reference numeral J in FIG. 12(c)] of the signal.

Alternatively, in this embodiment, the offset compensation feedback loop 28B may include two output peak detecting circuits as shown in FIG. 5 to compensate for the offset of the AGC amplifier circuit 27 by using the peak values of the differential outputs of the AGC amplifier circuit 27, or may include two output bottom detecting circuits as shown in FIG. 5 to compensate for the offset of the AGC amplifier circuit 27 by using the bottom values of the differential outputs of the AGC amplifier circuit 27.

Further, if a bottom detecting circuit (see reference numeral 24 in FIG. 5) is used instead of the reference level generating circuit 45, it is also possible to use the signal amplifier circuit 20B according to this embodiment as a high-speed/small-amplitude signal interface circuit in the field of information processing.

(e) Description of Fourth Embodiment

Figure 15:
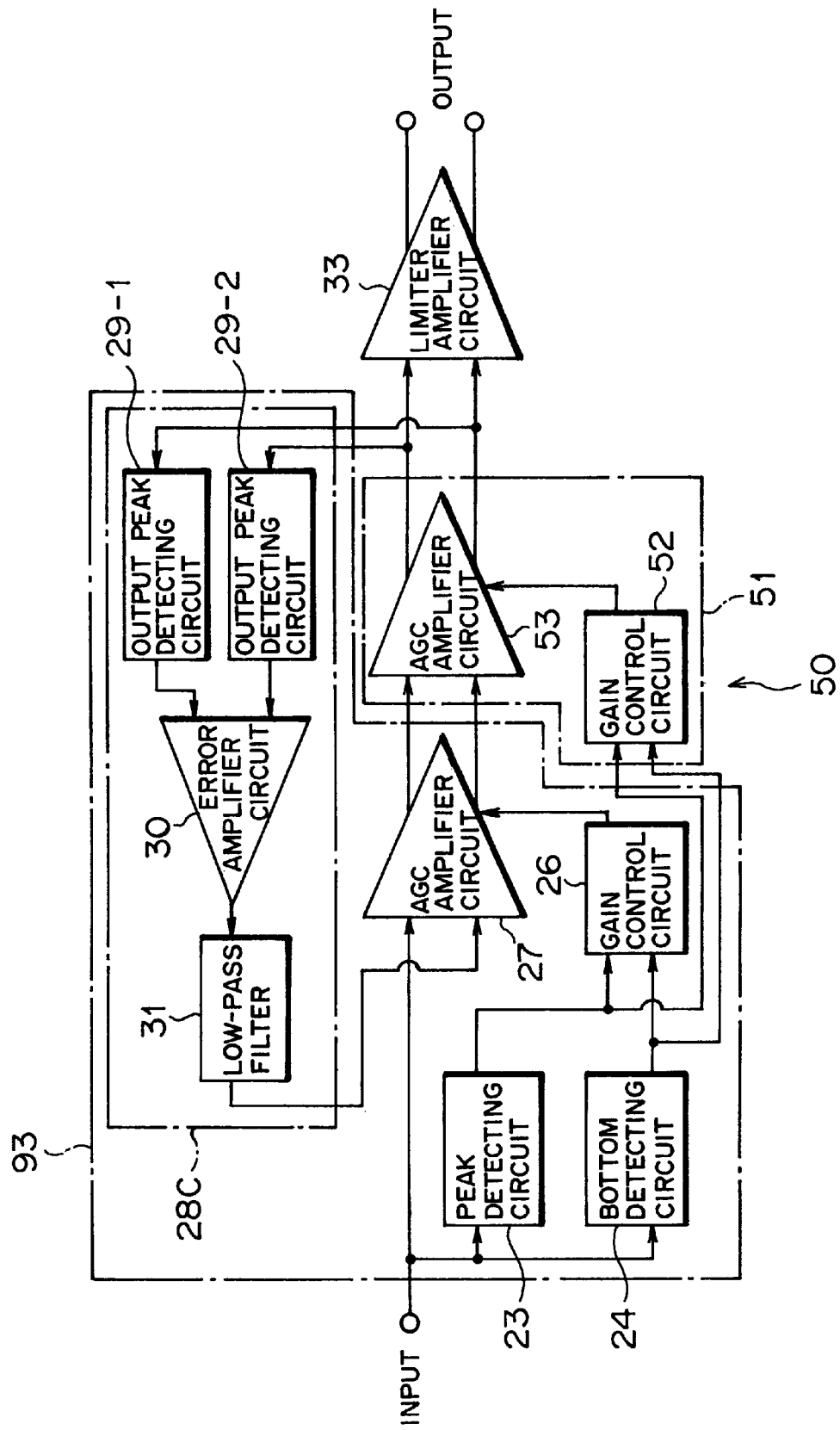
FIG. 15 is a block diagram showing a configuration of a signal amplifier circuit according to the fourth embodiment of the present invention.

FIG. 15 is a block diagram showing a configuration of a signal amplifier circuit according to the fourth embodiment of the present invention.

As in the above-mentioned first to third embodiments, a signal amplifier circuit 50 shown in FIG. 15 is also used as a signal interface circuit to shape a waveform of an optical signal attenuated at a time of transmission in, for example, a receiving portion in an optical communication system.

The signal amplifier circuit 50 according to this embodiment includes a signal amplification basic block portion 93 having an AGC amplifier circuit 27, an AGC amplifier circuit block portion 51 having an AGC amplifier circuit 53, and a limiter amplifier circuit 33 serving as a limiter amplification basic block portion at a subsequent stage of the signal amplification basic block portion 93.

In the embodiment, in order to increase the degree of freedom for design of the signal amplifier circuit 50, the signal amplifier circuit 50 includes a plurality of AGC amplifier circuits (the AGC amplifier circuits 27, 53 in FIG. 15). For example, when AGC amplifier circuits having different gain characteristics are used as the AGC amplifier circuits 27, 53 forming the signal amplification basic block portion 93 and AGC amplifier circuit block portion 51, it is possible to optionally set a signal amplification characteristic of the signal amplifier circuit 50.

Here, as shown in FIG. 15, the signal amplification basic block portion 93 includes a peak detecting circuit 23, a bottom detecting circuit 24, a gain control circuit 26, the AGC amplifier circuit 27, and an offset compensation feedback loop 28C.

The peak detecting circuit 23, the bottom detecting circuit 24, the gain control circuit 26, and the AGC amplifier circuit 27 are the same in function and configuration as the corresponding component parts in the first embodiment described above.

Further, the offset compensation feedback loop 28C has the same configuration as that of the corresponding component part in the first embodiment except that the resistance 32 shown in FIG. 5 is not mounted.

For example, in the signal amplifier circuit 20 as shown in FIG. 5, the offset compensation feedback loop 28 determines a threshold level (reference voltage) of the AGC amplifier circuit 27 so as to provide equal peak values of differential outputs from the AGC amplifier circuit 27.

That is, the fact that the differential outputs from the AGC amplifier circuit 27 can have the equal peak values indicates that the input signal is amplified in the AGC amplifier circuit 27 with a center at an intermediate level of signal amplitude. In other words, the offset compensation feedback loop 28 itself has the function of setting the threshold level to the center of signal (i.e., the center of amplitude of the input signal).

Hence, in this embodiment, as shown in FIG. 15, the signal amplifier circuit 50 is configured without the ATC circuit (see reference numeral 22 shown in FIG. 5).

In this case, the offset compensation feedback loop 28C makes low-pass filter processing to a difference level of peak values of the differential outputs of the AGC amplifier circuit 27, and feeds back the result as the threshold value [reference voltage (reference signal)] to an input side of the AGC amplifier circuit 27 to set the threshold value so as to provide equal dc levels of the differential outputs of the AGC amplifier circuit 27. That is, offset information is also reflected in the threshold value.

Further, the AGC amplifier circuit 27 takes as inputs the signal input and the reference signal to perform differential amplification of the input signal with a center at a reference signal level (reference level) set by the offset compensation feedback loop 28C by using a gain depending upon a gain control signal from the gain control circuit 26.

Moreover, as set forth above, the offset compensation feedback loop 28C is operated even when no signal is input into the signal amplifier circuit 50 (in the absence of an input signal). However, when signals are intermittently input, a large time constant thereof results in a delay in output of the reference signal corresponding to the input signal. Therefore, the signal amplifier circuit 50 according to the embodiment can particularly effectively function at a time of successive input of signals.

Meanwhile, the AGC amplifier circuit block portion 51 includes the AGC amplifier circuit 53 and a gain control circuit 52.

Here, the gain control circuit 52 detects amplitude information (input amplitude level) of the input signal from a difference between a peak value from the peak detecting circuit 23 and a bottom value from the bottom detecting circuit 24 of the signal amplification basic block portion 93, and feeds a gain control signal according to the input amplitude level to the AGC amplifier circuit 53 as a feedforward signal, resulting in serving as a gain control portion.

Further, the AGC amplifier circuit 53 takes as inputs the differential outputs from the AGC amplifier circuit 27 of the signal amplification basic block portion 93, and performs differential amplification of the input signal with the gain depending upon the gain control signal from the gain control circuit 52, resulting in serving as an automatic gain control amplifying portion.

Moreover, it is possible to use the AGC amplifier circuit 53 and the gain control circuit 52 having the same configurations as those of the AGC amplifier circuit 27 and the gain control circuit 26 (see FIGS. 7 and 8).

Meanwhile, the limiter amplifier circuit 33 takes as an input a differential signal from the AGC amplifier circuit 53 of the AGC amplifier circuit block portion 51, and performs differential amplification of the input signal to thereafter limit the result to a predetermined signal level.

According to the configuration described above, in the signal amplifier circuit 50 according to the fourth embodiment of the present invention, in response to the input of signal, the offset compensation feedback loop 28C of the signal amplification basic block portion 93 automatically sets the reference level in which the offset information is reflected depending upon the differential output from the AGC amplifier circuit 53.

Further, the gain control circuit 26 generates the gain control signal according to the difference between the peak value from the peak detecting circuit 23 and the bottom value from the bottom detecting circuit 24, and feeds the signal to the AGC amplifier circuit 27 as a feedforward signal.

Subsequently, when the input signal and the reference signal from the offset compensation feedback loop 28C are input into the AGC amplifier circuit 27, the AGC amplifier circuit 27 performs differential amplification of the input signal with a center at the reference level from the offset compensation feedback loop 28C by using a gain depending upon the gain control signal from the gain control circuit 26.

Further, the gain control circuit 52 of the AGC amplifier circuit block portion 51 generates the gain control signal according to the difference between the peak value from the peak detecting circuit 23 and the bottom value from the bottom detecting circuit 24, and feeds the signal to the AGC amplifier circuit 53 of the signal amplification basic block portion 93 as the feedforward signal.

Further, when a signal obtained through the differential amplification by the AGC amplifier circuit 27 of the signal amplification basic block portion 93 is input into the AGC amplifier circuit 53 of the AGC amplifier circuit block portion 51, the AGC amplifier circuit 53 performs the differential amplification of the input signal by using the gain depending upon the gain control signal from the gain control circuit 52.

Then, when a signal obtained through the differential amplification by the AGC amplifier circuit 53 of the AGC amplifier circuit block portion 51 is input into the limiter amplifier circuit 33, the limiter amplifier circuit 33 performs differential amplification of the input signal, and limits the result to the predetermined signal level.

As set forth above, according to the fourth embodiment of the present invention, the signal amplifier circuit 50 includes the peak detecting circuit 23, the bottom detecting circuit 24, the gain control circuit 26, the AGC amplifier circuit 27, and the offset compensation feedback loop 28C. It is thereby possible to provide the same advantages as those of the signal amplifier circuit 20 according to the first embodiment described above.

Further, the offset compensation feedback loop 28C has the function of setting the threshold level at the signal center (i.e., the center of the amplitude of the input signal), and the threshold value is set by the offset compensation feedback loop 28C. As a result, there is no need to provide the ATC circuit to set the threshold value so that the signal amplifier circuit 50 can be simply configured.

Further, the signal amplifier circuit 50 includes the AGC amplifier circuits 27, 53 in a multistage configuration. It is thereby possible to increase the degree of freedom for design of the signal amplifier circuit 50.

Moreover, in this embodiment, if a delay circuit (see reference numeral 43 in FIG. 5) is mounted on the input side of the AGC amplifier circuit 27, as stated above, the signal can be input into the AGC amplifier circuit 27 after a rise of the gain control signal from the gain control circuit 26. It is possible to avoid overshoot [see reference numeral J in FIG. 12(c)] of the signal.

Alternatively, in this embodiment, the offset compensation feedback loop 28C may include two output bottom detecting circuits to compensate for the offset of the AGC amplifier circuit 27 by using the bottom values of the differential outputs of the AGC amplifier circuit 27, or may include two output peak detecting circuits, two output bottom detecting circuits, and four resistances as shown in FIG. 14 to compensate for the offset of the AGC amplifier circuit 27 by using voltages obtained by dividing the peak value and the bottom value of the differential outputs of the AGC amplifier circuit 27.

In particular, when the signal amplifier circuit 50 according to this embodiment is used as the signal interface circuit in the optical communication system, a reference level generating circuit (see reference numeral 45 in FIG. 14) may be used instead of the bottom detecting circuit 24 to simplify the configuration of the signal amplifier circuit 50.

Further, this embodiment has been described by way of example with respect to a case where the signal amplifier circuit 50 is used as the signal interface circuit to shape the waveform of the optical signal attenuated at the time of transmission in the receiving portion in the optical communication system. However, the signal amplifier circuit 50 may be used as a high-speed/small-amplitude signal interface circuit in the field of information processing.

(f) Description of Fifth Embodiment

Figure 16:
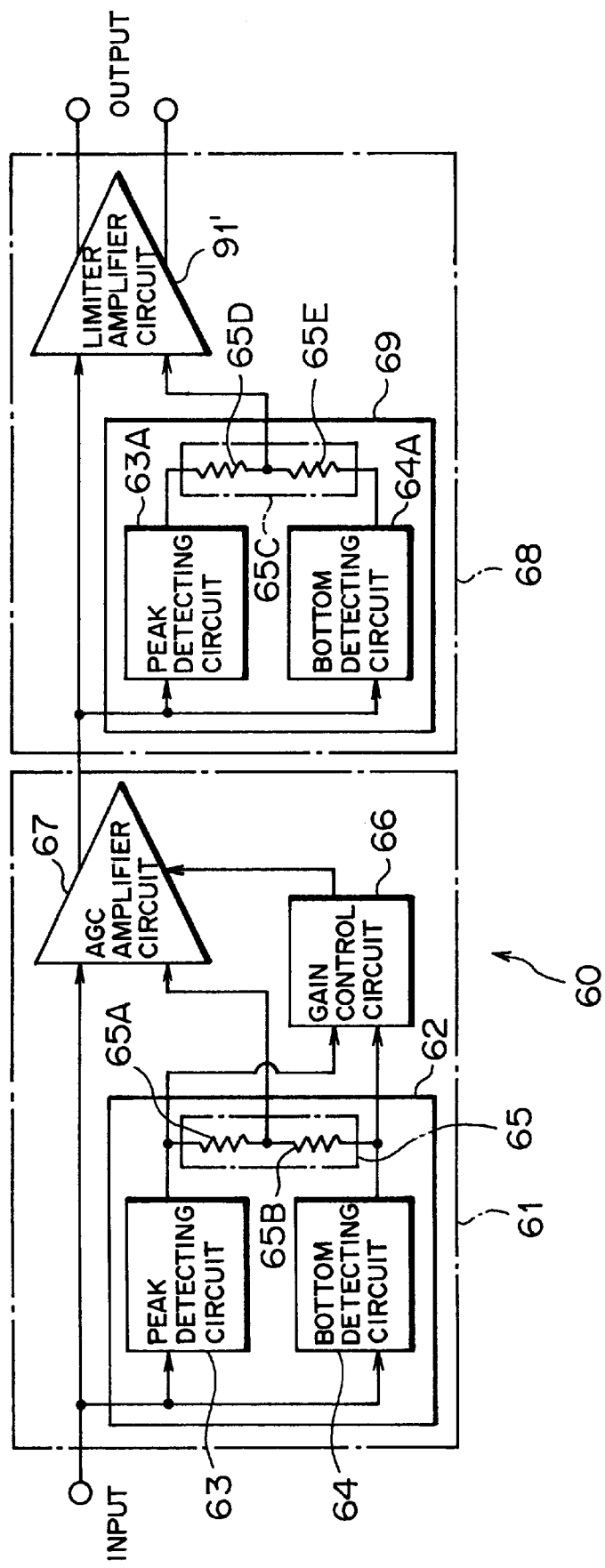
FIG. 16 is a block diagram showing a configuration of a signal amplifier circuit according to the fifth embodiment of the present invention.

FIG. 16 is a block diagram showing a configuration of a signal amplifier circuit according to the fifth embodiment of the present invention.

As in the above-mentioned first to fourth embodiments, a signal amplifier circuit 60 shown in FIG. 16 is used as a signal interface circuit to shape a waveform of an optical signal attenuated at a time of transmission in, for example, a receiving portion in an optical communication system.

As shown in FIG. 16, the signal amplifier circuit 60, according to this embodiment, includes an ATC-AGC amplifier circuit 61 serving as a signal amplification basic block portion, and an ATC-limiter amplifier circuit 68 serving as a limiter amplification basic block portion at a subsequent stage of the ATC-AGC amplifier circuit 61.

Here, the ATC-AGC amplifier circuit 61 includes an ATC circuit 62, a gain control circuit 66, and an AGC amplifier circuit 67.

The ATC circuit 62 detects a peak value and a bottom value of an input signal to automatically set an intermediate value between the values as a threshold value. The ATC circuit 62 includes a peak detecting circuit 63, a bottom detecting circuit 64, and a voltage dividing circuit 65 including resistances 65A, 65B. Moreover, the peak detecting circuit 63, the bottom detecting circuit 64, and the voltage dividing circuit 65 are the same in function and configuration as the corresponding component parts (see FIG. 5) in the above first embodiment.

Further, the gain control circuit 66 detects amplitude information (input amplitude level) of the input signal depending upon a difference between the peak value from the peak detecting circuit 63 and the bottom value from the bottom detecting circuit 64 in the ATC circuit 62, and feeds a gain control signal according to the input amplitude level to the AGC amplifier circuit 67 as a feedforward signal.

Further, the AGC amplifier circuit 67 takes as inputs the input signal and the threshold value from the ATC circuit 62 to perform differential amplification of the input signal with center at the threshold level from the ATC circuit 62 by using a gain depending upon the gain control signal from the gain control circuit 66.

Moreover, the gain control circuit 66 and the AGC amplifier circuit 67 are the same in function and configuration as the corresponding component parts in the above first embodiment (see FIGS. 7 and 8).

Further, the ATC-limiter amplifier circuit 68 includes an ATC circuit 69 and a limiter amplifier circuit 91'.

Here, as in the ATC circuit 62 described above, the ATC circuit 69 detects the peak value and the bottom value of the input signal (i.e., an output signal from the AGC amplifier circuit 67) to automatically set an intermediate value between the values as a threshold value. The ATC circuit 69 includes a peak detecting circuit 63A, a bottom detecting circuit 64A, and a voltage dividing circuit 65C including resistances 65D, 65E. Moreover, the peak detecting circuit 63A, the bottom detecting circuit 64A, and the voltage dividing circuit 65C are the same in function and configuration as the corresponding component parts (see FIG. 5) in the above first embodiment.

Further, the limiter amplifier circuit 91' takes as inputs positive-phase output from the AGC amplifier circuit 67 of the ATC-AGC amplifier circuit 61, and the threshold value from the ATC circuit 69, and performs differential amplification of the input signal from the AGC amplifier circuit 67 with center at the threshold level from the ATC circuit 69, thereafter limiting the amplified input to a predetermined signal level, and outputting the result. Moreover, in the limiter amplifier circuit 91', output amplitude is limited to a constant level throughout an input range.

Figures 17A, 17B:
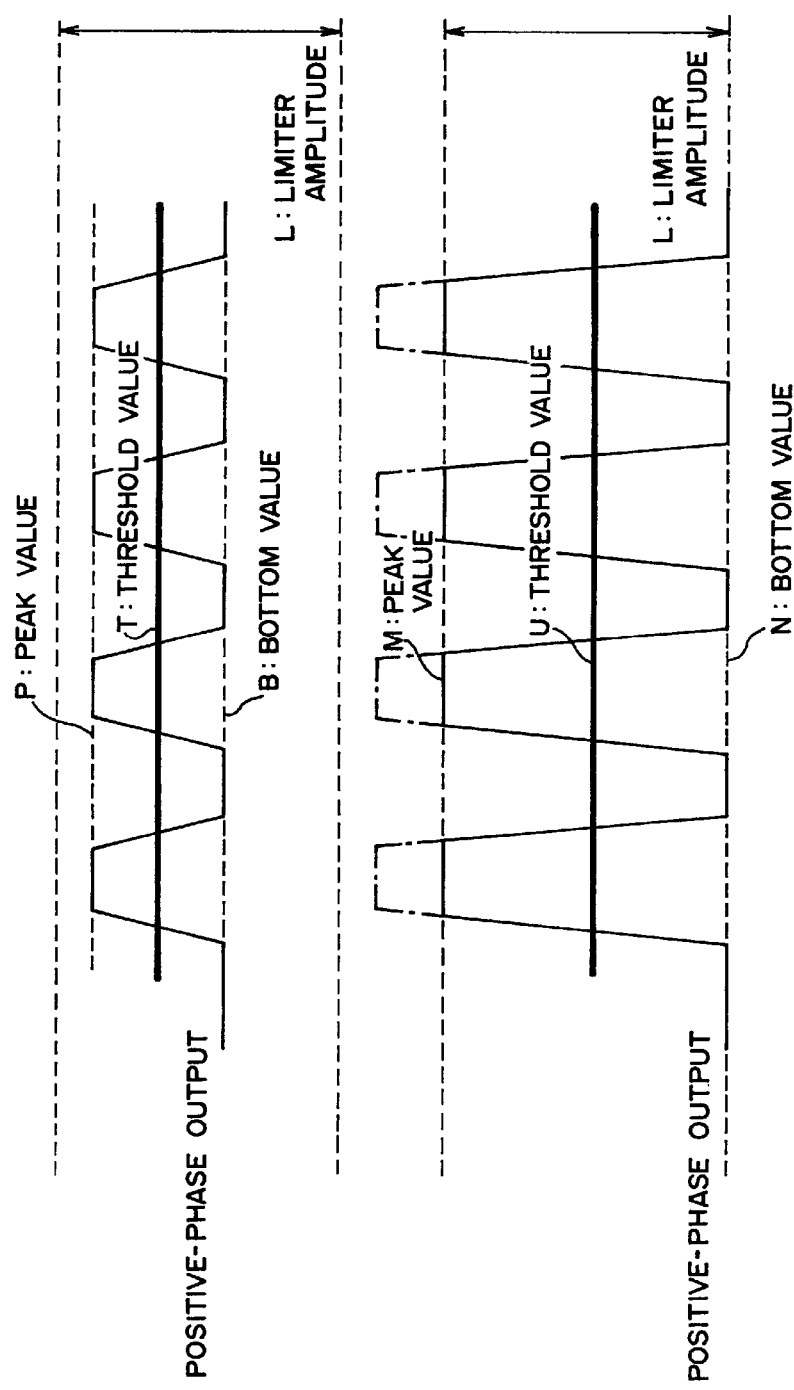
FIGS. 17(a), 17(b) are diagrams for illustrating the operation of the signal amplifier circuit according to the fifth embodiment of the present invention.

FIG. 17(a) is a waveform diagram of the differential output (positive-phase output) signals from the AGC amplifier circuit 67. As shown in FIG. 17(a), the output from the AGC amplifier circuit 67 continuously falls within a linear range [limiter amplitude L shown in FIG. 17(a)] of the AGC amplifier circuit 27.

Hence, even when a threshold value T determined by a peak value P and a bottom value B is shifted, offset present in the ATC-AGC amplifier circuit 61 causes only a variation in dc level, and causes little variation in the pulse width in the output from the AGC amplifier circuit 67 of the ATC-AGC amplifier circuit 61.

Thus, in this embodiment, in order to compensate for the offset present in the ATC-AGC amplifier circuit 61, the ATC-limiter amplifier circuit 68 is mounted at the subsequent stage of the ATC-AGC amplifier circuit 61. Thereby, the variation in output level from the AGC amplifier circuit 67 is followed and compensated by the ATC circuit 69 of the ATC-limiter amplifier circuit 68.

In other words, in the ATC-limiter amplifier circuit 68, the limiter amplifier circuit 91' is controlled by the ATC circuit 69 in a feedforward manner, thereby compensating for the offset present in the ATC-AGC amplifier circuit 61.

Moreover, the signal amplifier circuit in which the ATC circuits are connected to form the multistage configuration as described above may include a signal amplifier circuit in which the ATC-limiter amplifier circuits (see reference numeral 68) are connected to form the multistage configuration. For example, there is a possible signal amplifier circuit including the ATC-limiter amplifier circuit instead of the ATC-AGC amplifier circuit 61.

However, in case of a high input level of a signal, a limiter amplifier circuit at the preceding stage limits a portion exceeding a linear range [limiter amplitude L shown in FIG. 17(*b*)] of the limiter amplifier circuit as shown in FIG. 17(*b*), resulting in a loss of linearity of the signal. In this case, in a limiter amplifier circuit at the subsequent stage, a threshold value U is determined by a peak value M and a bottom value N shown in FIG. 17(*b*).

On the other hand, as shown in FIG. 17(*a*), the AGC amplifier circuit 67 of the ATC-AGC amplifier circuit 61 is continuously operated in the linear range without limitation of signal. Therefore, even in case of input of a signal having a high level sufficient to lose the linearity in the limiter amplifier circuit, it is possible to reflect a threshold level deviation produced by the offset in the linearity as the variation in output level.

Thus, in this embodiment, the ATC-AGC amplifier circuit 61 is employed as the amplifier circuit at the preceding stage, thereby extending a range of the input signal such that the offset can be compensated by the ATC circuit 69 at the subsequent stage, and providing a greater effect of multistage connection of the ATC circuits.

According to the above configuration, in the signal amplifier circuit 60 according to the fifth embodiment of the present invention, in response to input of signal, the ATC circuit 62 of the ATC-AGC amplifier circuit 61 automatically sets the threshold value depending upon the peak value and the bottom value of the input signal.

Further, the gain control circuit 66 generates the gain control signal according to the difference between the peak value and the bottom value detected in the ATC circuit 62, and feeds the signal to the AGC amplifier circuit 67 as the feedforward signal.

Subsequently, when the input signal and the threshold value from the ATC circuit 62 are input into the AGC amplifier circuit 67, the AGC amplifier circuit 67 performs the differential amplification of the input signal with center at the threshold level from the ATC circuit 62 by using the gain depending upon the gain control signal from the gain control circuit 66.

Further, when the signal obtained through the differential amplification by the AGC amplifier circuit 67 of the ATC-AGC amplifier circuit 61 is output to the ATC-limiter amplifier circuit 68, the ATC circuit 69 of the ATC-limiter amplifier circuit 68 automatically sets the threshold value depending upon the peak value and the bottom value of the output signal from the AGC amplifier circuit 67.

Further, when the positive-phase output from the AGC amplifier circuit 67 and the threshold value from the ATC circuit 69 are input into the limiter amplifier circuit 91', the limiter amplifier circuit 91' performs the differential amplification of the input signal from the AGC amplifier circuit 67 with center at the threshold level from the ATC circuit 69, thereafter limiting the amplified input to the predetermined signal level, and outputting the result.

As set forth above, according to the fifth embodiment of the present invention, the signal amplifier circuit 60 includes the ATC-AGC amplifier circuit 61, and the ATC-limiter amplifier circuit 68 at the subsequent stage thereof. It is thereby possible to provide the same advantages as those of the signal amplifier circuit 20 according to the first embodiment described above. In addition, the ATC-limiter amplifier circuit 68 compensates for the offset through the feedforward control. It is thereby possible to reduce the variation in pulse width of the signal without an offset compensation feedback loop (see reference numeral 28 in FIG. 5), resulting in applicability even at a time of high-speed signal amplification in which a time constant of response is limited.

Moreover, in the embodiment, if a delay circuit (see reference numeral 43 in FIG. 5) is mounted on the input side of the AGC amplifier circuit 67 of the ATC-AGC amplifier circuit 61, as stated above, the signal can be input into the AGC amplifier circuit 67 after a rise of the gain control signal from the gain control circuit 66. It is possible to avoid overshoot [see reference numeral J in FIG. 12(*c*)] of the signal.

In particular, when the signal amplifier circuit 60 according to this embodiment is used as a signal interface circuit in an optical communication system, a reference level generating circuit (see reference numeral 45 in FIG. 14) may be used instead of the bottom detecting circuit 24 to simplify the configuration of the signal amplifier circuit 60.

Further, this embodiment has been described by way of example with respect to a case where the signal amplifier circuit 60 is used as the signal interface circuit to shape the waveform of the optical signal attenuated at the time of transmission in the receiving portion in the optical communication system. However, the signal amplifier circuit 60 may be used as a high-speed/small-amplitude signal interface circuit in the field of information processing.

(g) Description of Sixth Embodiment

Figure 18:
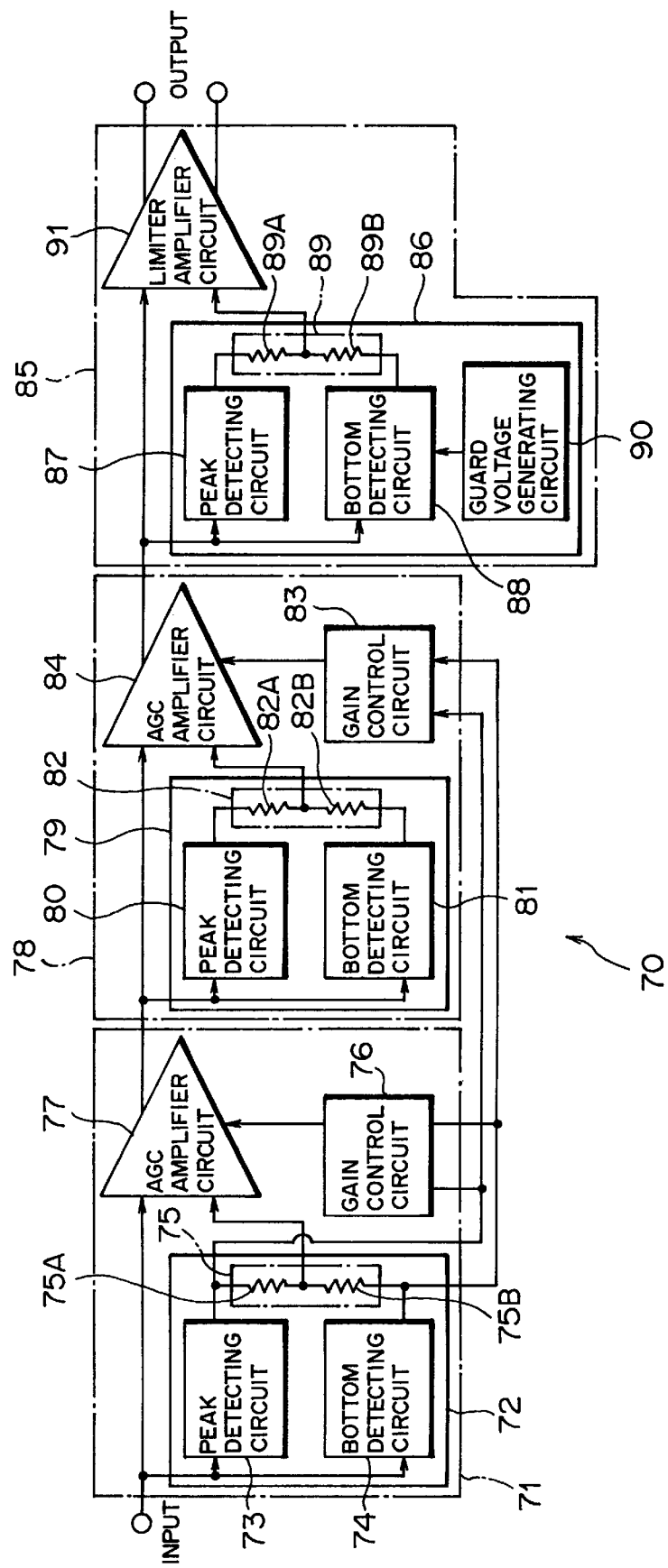
FIG. 18 is a block diagram showing a configuration of a signal amplifier circuit according to the sixth embodiment of the present invention.

FIG. 18 is a block diagram showing a configuration of a signal amplifier circuit according to the sixth embodiment of the present invention.

As in the above first to fifth embodiments, a signal amplifier circuit 70 shown in FIG. 18 is also used as a signal interface circuit to shape a waveform of an optical signal attenuated at a time of transmission in, for example, a receiving portion in an optical communication system.

As shown in FIG. 18, the signal amplifier circuit 70, according to the embodiment, includes ATC-AGC amplifier circuits 71, 78 serving as a signal amplification basic block portion, and an ATC-limiter amplifier circuit 85 serving as a limiter amplification basic block portion at a subsequent stage of the ATC-AGC amplifier circuit 78.

In this embodiment, in order to increase the degree of freedom for design of the signal amplifier circuit 70, the signal amplifier circuit 70 includes the ATC-AGC amplifier circuits 71, 78 in a two-stage configuration. For example, when AGC amplifier circuits (see reference numerals 77, 84 in FIG. 18) having different gain characteristics are used as the ATC-AGC amplifier circuits 71, 78, it is possible to optionally set a signal amplification characteristic of the signal amplifier circuit 70.

Here, the ATC-AGC amplifier circuit 71 includes an ATC circuit 72, a gain control circuit 76, and an AGC amplifier circuit 77.

The ATC circuit 72 detects a peak value and a bottom value of an input signal to automatically set an intermediate value between the values as a threshold value. The ATC circuit 72 includes a peak detecting circuit 73, a bottom detecting circuit 74, and a voltage dividing circuit 75 including resistances 75A, 75B.

Here, the peak detecting circuit 73 detects the peak value of the input signal to output the result as a "1" side level, and functions as a "1" side level output circuit.

Figure 22:
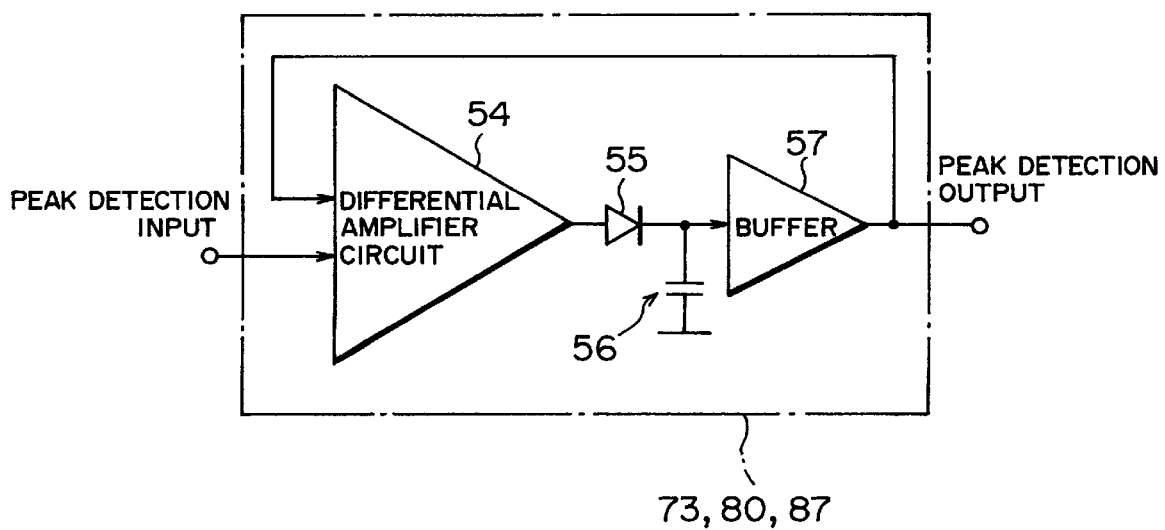
FIG. 22 is a block diagram showing a configuration of a peak detecting circuit.

As shown in, for example, FIG. 22, the peak detecting circuit 73 includes a differential amplifier circuit 54, a diode 55, a detecting capacitor 56, and a buffer 57. The peak detecting circuit 73 charges the detecting capacitor 56 when the input signal is high level (the "1" side level), and uses the diode 55 to increase output impedance of the differential amplifier circuit 54 so as to cut off a discharge path when the input signal is low level ("0" side level), thereby detecting and holding the peak value of the input signal.

Moreover, the buffer 57 is a circuit which has low output impedance at high input impedance, and is mounted to prevent electric charges held in the detecting capacitor 56 from flowing out to another circuit (for example, the voltage dividing circuit 75 connected at the subsequent stage of the peak detecting circuit 73).

Figure 23:
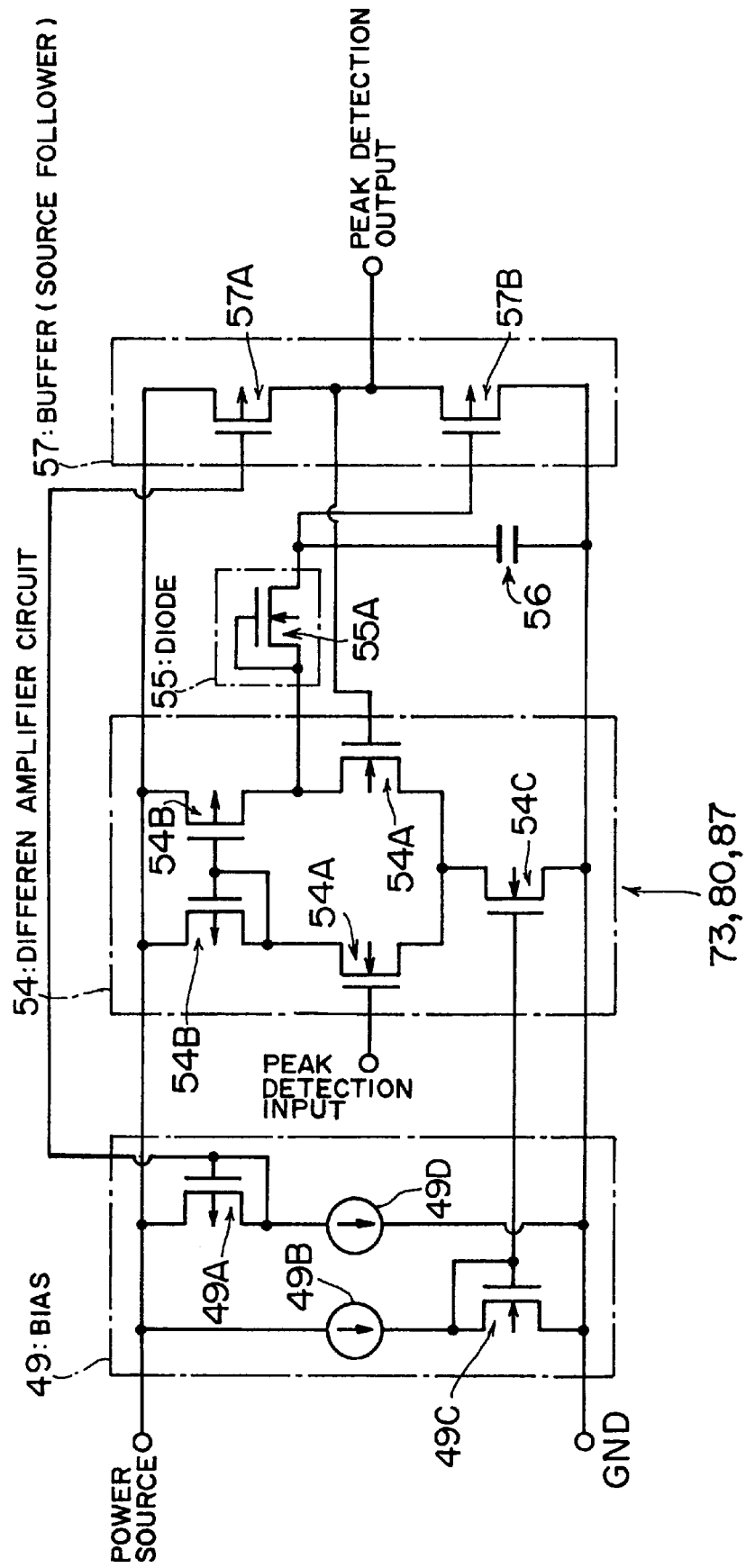
FIG. 23 is a circuit diagram showing a configuration of the peak detecting circuit.

More specifically, the peak detecting circuit 73 has, for example, a configuration as shown in FIG. 23, and the differential amplifier circuit 54 includes a transistor pair including two MOS-FETs 54A, and three MOS-FETs 54B, 54C.

Further, the diode 55 includes a MOS-FET 55A, and the buffer 57 includes a pair of MOS-FETs 57A, 57B in a source follower configuration with a drain grounded.

Moreover, reference numeral 49 designates a bias circuit serving as a constant-current source to feed current to the MOS-FET 54C of the differential amplifier circuit 54 and the MOS-FET 57B of the buffer 57 in the peak detecting circuit 73. As shown in FIG. 23, the bias circuit 49 includes two MOS-FETs 49A, 49C and two constant-current sources 49B, 49D.

Further, the bottom detecting circuit 74 detects the bottom value of the input signal to output the result as a "0" side level, and functions as a "0" side level output circuit.

As shown in, for example, FIG. 24, the bottom detecting circuit 74 includes a differential amplifier circuit 54', a diode 55', a detecting capacitor 56, and a buffer 57. Unlike the peak detecting circuit 73 described above, the bottom detecting circuit 74 charges the detecting capacitor 56 when the input signal is low level (the "0" side level), and uses the diode 55' to increase output impedance of the differential amplifier circuit 54' so as to cut off a discharge path when the input signal is high level ("1" side level), thereby detecting and holding the bottom value of the input signal.

Moreover, the buffer 57 is a circuit which has low output impedance at low input impedance, and is mounted to prevent electric charges held in the detecting capacitor 56 from flowing out to another circuit (for example, the voltage dividing circuit 75 connected at the subsequent stage of the bottom detecting circuit 74).

Figure 25:
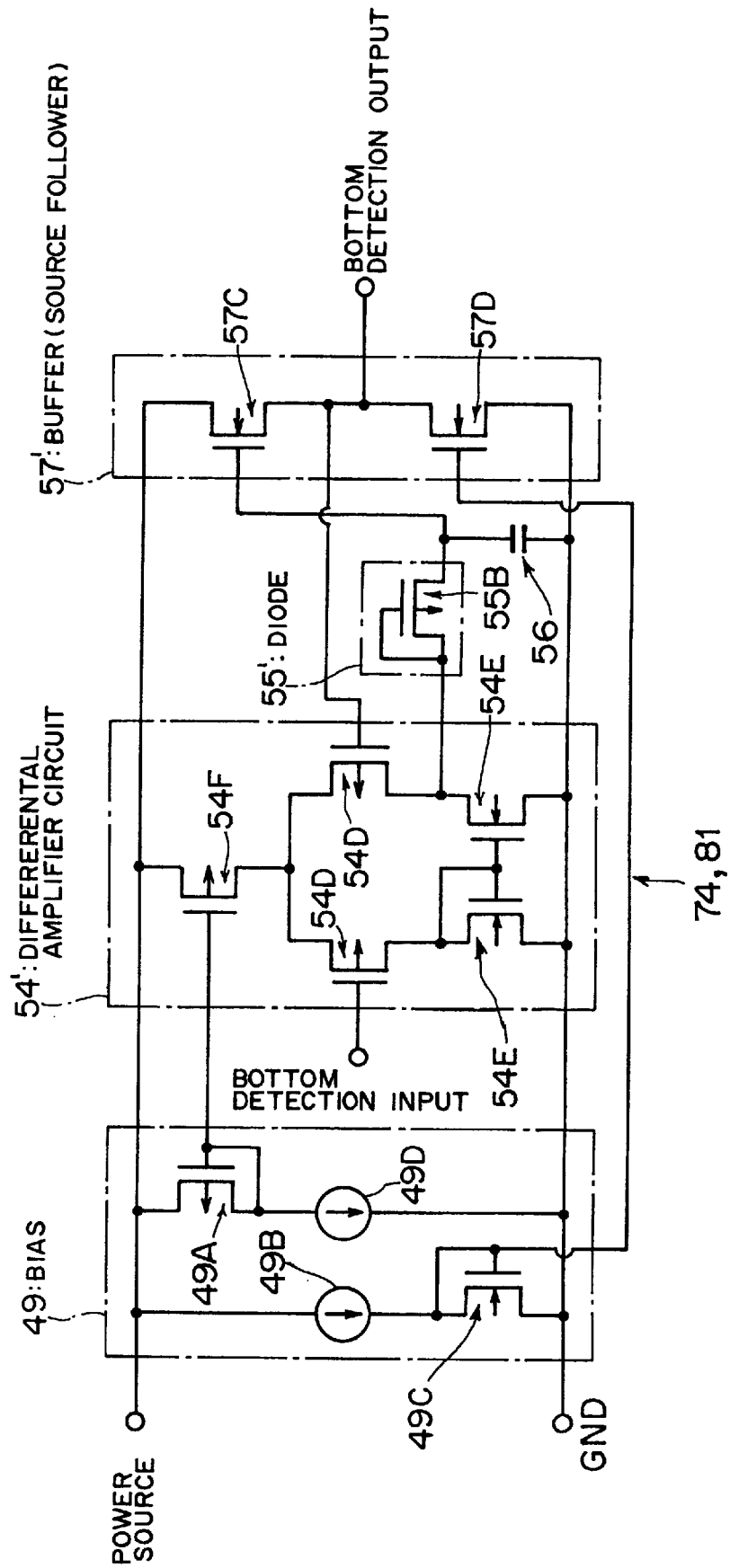
FIG. 25 is a circuit diagram showing a configuration of the bottom detecting circuit.

More specifically, the bottom detecting circuit 74 has, for example, a configuration as shown in FIG. 25, and the differential amplifier circuit 54' includes a transistor pair including two MOS-FETs 54D, and three MOS-FETs 54E, 54F.

Further, the diode 55' includes a MOS-FET 55B, and the buffer 57' includes a pair of MOS-FETs 57C, 57D in a source follower configuration with a drain grounded.

Further, like the peak detecting circuit 73 described above, the bottom detecting circuit 74 is provided with a bias circuit 49 serving as a constant-current source to feed current to the MOS-FET 54F of the differential amplifier circuit 54' and the MOS-FET 57D of the buffer 57' in the bottom detecting circuit 74. As shown in FIG. 25, the bias circuit 49 includes two MOS-FETs 49A, 49C and two constant-current sources 49B, 49D.

Moreover, the voltage dividing circuit 75 is the same in function and configuration as the corresponding component part (see FIG. 5) in the above first embodiment.

Further, the gain control circuit 76 detects amplitude information (input amplitude level) of the input signal from a difference between the peak value from the peak detecting circuit 73 and the bottom value from the bottom detecting circuit 74 of the ATC circuit 72, and feeds a gain control signal according to the input amplitude level to the AGC amplifier circuit 77 as a feedforward signal, resulting in functioning as a gain control portion.

Figure 27:
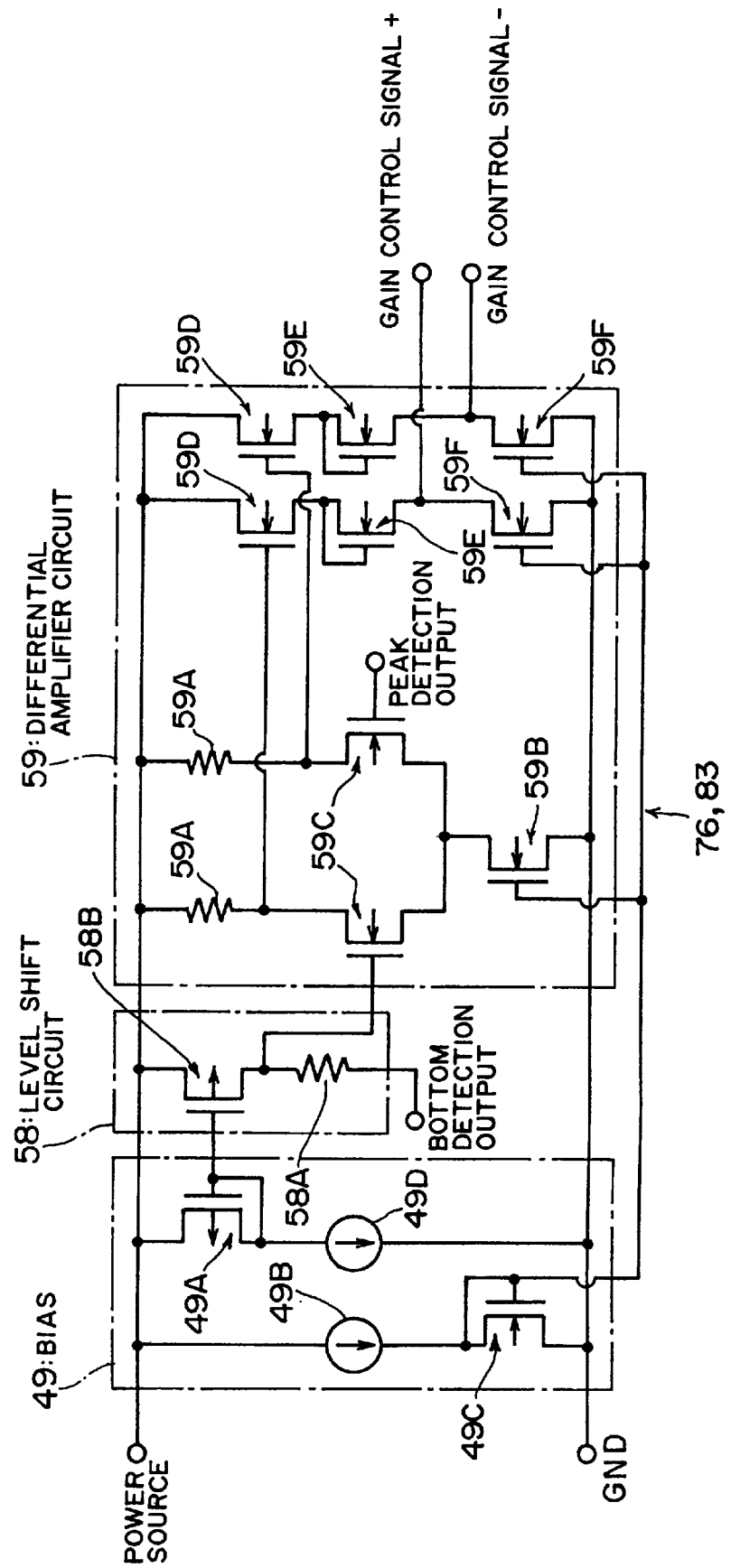
FIG. 27 is a circuit diagram showing another illustrative configuration of the gain control circuit.

Specifically, as shown in, for example, FIG. 27, the gain control circuit 76 includes a level shift circuit 58, a differential amplifier circuit 59, and the bias circuit 49.

Here, the differential amplifier circuit 59 includes a transistor pair including two MOS-FETs 59C, two resistances 59A, and seven MOS-FETs 59B, 59D, 59E, 59F. The differential amplifier circuit 59 takes as inputs the output (peak value) from the peak detecting circuit 73 and the output (bottom value) from the bottom detecting circuit 74 in the ATC circuit 72 to perform differential amplification, thereby converting a difference level (i.e., input amplitude level) between the peak value and the bottom value into gain control signals (including positive and negative gain control signals) for the AGC amplifier circuit 77.

Further, the level shift circuit 58 is mounted on the input side of an input terminal of the differential amplifier circuit 59 to take as input either the peak value or the bottom value (the bottom value in FIG. 27) so as to shift either the input peak value or bottom value by a predetermined level for the same reasons as those described in the first embodiment. Moreover, the level shift circuit 58 includes a resistance 58A, and a MOS-FET 58B serving as a constant-current source.

Further, the bias circuit 49 is a constant-current source to feed current to the MOS-FET 58B of the level shift circuit 58 and the MOS-FETs 59B, 59F of the differential amplifier circuit 59 in the gain control circuit 76. As shown in FIG. 27, the bias circuit 49 includes two MOS-FETs 49A, 49C and two constant-current sources 49B, 49D.

Meanwhile, the AGC amplifier circuit 77 takes as inputs the input signal and the threshold value from the ATC circuit 72, and performs differential amplification of the input signal with center at the threshold level from the ATC circuit 72 by a gain depending upon the gain control signal from the gain control circuit 76, resulting in functioning as an automatic gain control amplifying portion.

Figure 28:
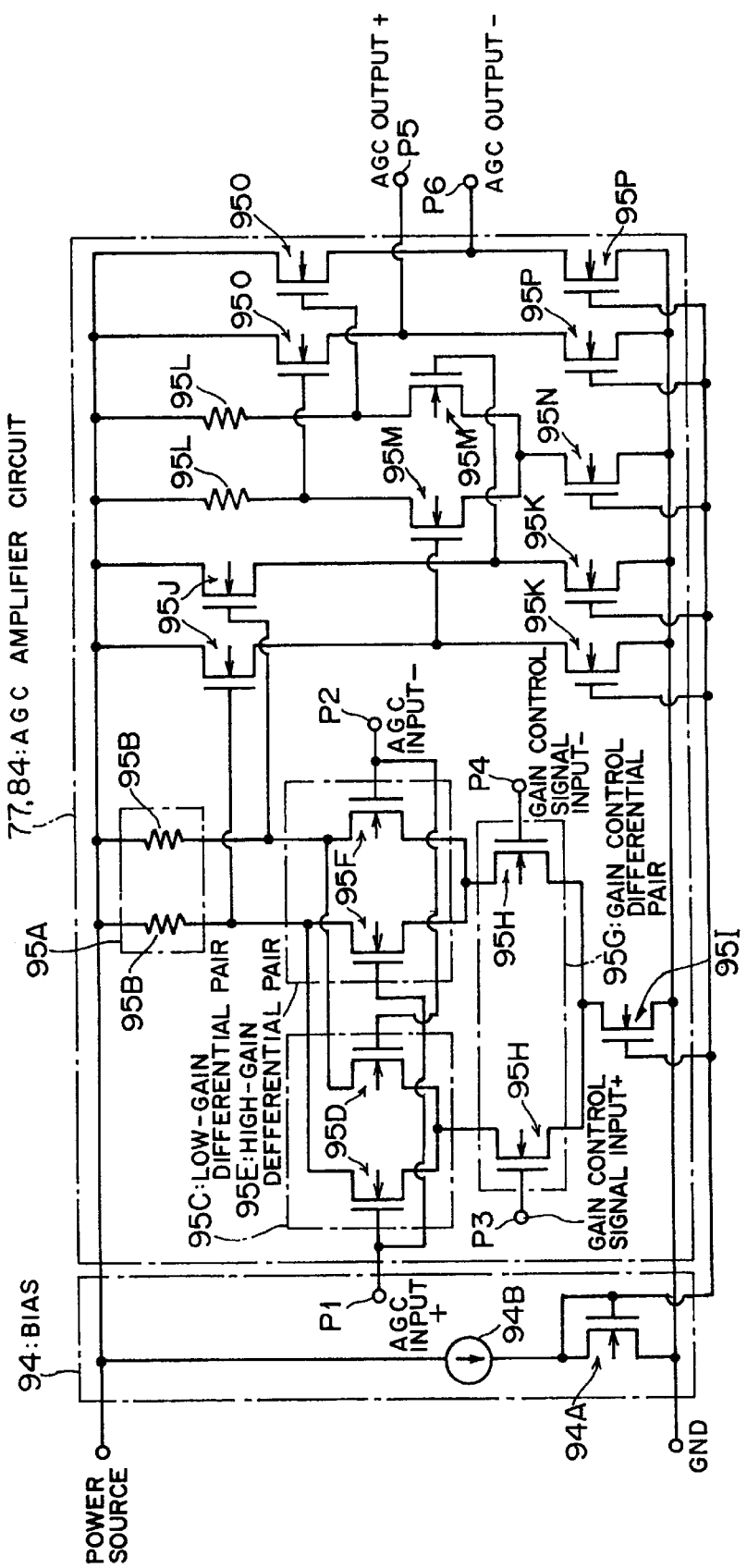
FIG. 28 is a circuit diagram showing another illustrative configuration of the AGC amplifier circuit.

Specifically, as shown in FIG. 28, the AGC amplifier circuit 77 includes a load resistance 95A, a low-gain transistor pair 95C, a high-gain transistor pair 95E, a gain control transistor pair 95G, and a MOS-FET 95I serving as a constant-current source.

Further, the load resistance 95A includes two resistances 95B, the low-gain transistor pair 95C includes two MOS-FETs 95D, the high-gain transistor pair 95E includes two MOS-FETs 95F, and the gain control transistor pair 95G includes two MOS-FETs 95H.

Here, like the corresponding component parts in the AGC amplifier circuit 27 described with reference to FIG. 8, the low-gain transistor pair 95C and the high-gain transistor pair 95E are designed to have different transconductances. The gain control transistor pair 95G controls a ratio of current values flowing in the two transistor pairs 95C, 95E, thereby varying a transconductance value of the entire AGC amplifier circuit 77.

Further, since a current flowing in the entire AGC amplifier circuit 77 is determined by the MOS-FET 95I serving as the constant-current source, limiter amplitude given by the product of the current value and the load resistance 95A can be held constant even when a variation is caused in gain.

That is, in the AGC amplifier circuit 77, the two transistor pairs 95C, 95E having the different transconductances are connected to the same load resistance 95A, and common differential input terminals P1, P2 are connected to inputs of the two transistor pairs so as to control an amplification gain by varying a ratio of current while keeping the entire amount of current flowing in the two transistor pairs 95C, 95E substantially constant.

Moreover, as shown in FIG. 28, in the AGC amplifier circuit 77, the amplified signal is output from output terminals P5, P6 through, for example, a plurality of MOS-FETs 95J to 95P and resistance 95L having a second stage differential amplifier circuit and two source follower circuits with a drain grounded.

Further, as shown in FIG. 28, a bias circuit 94 serving as a constant-current source to feed current to the MOS-FETs 95I, 95K, 95N, 95P of the AGC amplifier circuit 77 is added to the AGC amplifier circuit 77. In this case, the bias circuit 94 includes a MOS-FET 94A and a constant-current source 94B.

Further, as well as the MOS-FET as shown in FIG. 28, a bipolar transistor may be used as a transistor forming the AGC amplifier circuit 77 (see FIG. 21).

According to such a configuration, the AGC amplifier circuit 77 can be operated like the AGC amplifier circuit 27 described above with reference to FIG. 8.

That is, as shown in FIG. 28, the input signal and the threshold value from the ATC circuit 72 are respectively input into the low-gain transistor pair 95C, the high-gain transistor pair 95E through the input terminals P1, P2, and the gain control signal from the gain control circuit 76 is input into the gain control transistor pair 95G through the gain control terminals P3, P4. Then, the AGC amplifier circuit 77 performs the differential amplification of the input signal with center at the threshold level by using the gain depending upon the gain control signal, and outputs the amplified signal from the output terminals P5, P6, and so forth.

Meanwhile, like the ATC-AGC amplifier circuit 71 described above, the ATC-AGC amplifier circuit 78 includes an ATC circuit 79, a gain control circuit 83, and an AGC amplifier circuit 84.

Like the ATC circuit 72 described above, the ATC circuit 79 detects a peak value and a bottom value of an input signal (i.e., the output signal from the AGC amplifier circuit 77 of the ATC-AGC amplifier circuit 71) to automatically set an intermediate value between the values as a threshold value. The ATC circuit 79 includes a peak detecting circuit 80, a bottom detecting circuit 81, and a voltage dividing circuit 82 including resistances 82A, 82B.

Moreover, the peak detecting circuit 80 and the bottom detecting circuit 81 are respectively the same in function and configuration as the peak detecting circuit 73 and the bottom detecting circuit 74 described above, and the voltage dividing circuit 82 is the same in function and configuration as the corresponding component part (see FIG. 5) in the above first embodiment.

Further, the gain control circuit 83 detects amplitude information (input amplitude level) of the input signal from a difference between the peak value from the peak detecting circuit 73 and the bottom value from the bottom detecting circuit 74 of the ATC-AGC amplifier circuit 71, and feeds a gain control signal according to the input amplitude level to the AGC amplifier circuit 84 as a feedforward signal.

Further, the AGC amplifier circuit 84 takes as inputs the output signal from the AGC amplifier circuit 77 of the ATC-AGC amplifier circuit 71 and the threshold value from the ATC circuit 79, and performs differential amplification of the input signal from the AGC amplifier circuit 77 with center at the threshold level from the ATC circuit 79 by using the gain depending upon the gain control signal from the gain control circuit 83.

Moreover, the gain control circuit 83 and the AGC amplifier circuit 84 are respectively the same in function and configuration as the gain control circuit 76 and the AGC amplifier circuit 77 described above.

Further, the ATC-limiter amplifier circuit 85 includes an ATC circuit 86 and a limiter amplifier circuit 91.

Like the ATC circuit 72 described above, the ATC circuit 86 detects a peak value and a bottom value of an input signal (i.e., positive-phase output from the AGC amplifier circuit 84) to automatically set an intermediate value between the values as a threshold value. In this embodiment, the ATC circuit 86 includes a peak detecting circuit 87, a bottom detecting circuit 88, a voltage dividing circuit 89 including resistances 89A, 89B, and a guard voltage generating circuit 90.

Moreover, the peak detecting circuit 87 and the bottom detecting circuit 88 are respectively the same in function and configuration as the peak detecting circuit 73 and the bottom detecting circuit 74 described above, and the voltage dividing circuit 89 is the same in function and configuration as the corresponding component part (see FIG. 5) in the above first embodiment.

Figure 19:
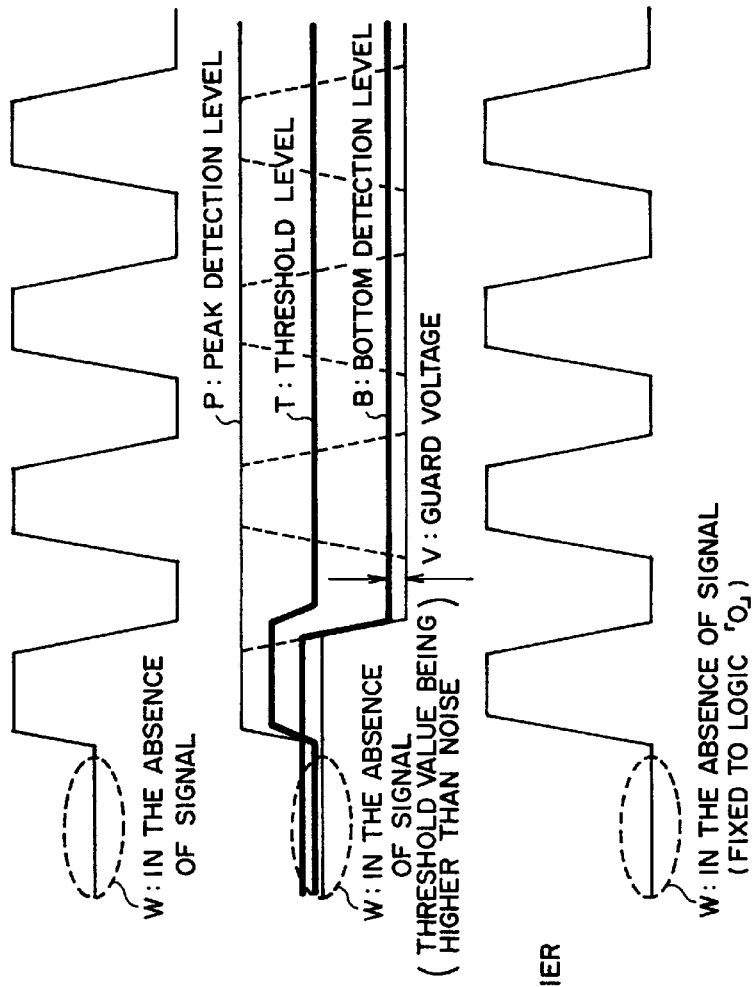
FIGS. 19(a) to 19(c) are diagrams for illustrating the operation of the signal amplifier circuit according to the sixth embodiment of the present invention.

Here, in the signal amplifier circuit employing the ATC circuit, when no signal is input [in the absence of an input signal; see reference numeral W in FIG. 19(a)], a signal level becomes equal to a threshold level. Hence, output of the signal amplifier circuit swings to 0 or 1 due to very weak input noise so that the signal may erroneously be recognized.

In order to avoid the erroneous recognition of the signal due to the input noise, as shown in FIG. 19(b), it is enough to simply make such a control that a threshold level T can be held higher than an input noise level even when no signal is input into the ATC circuit 86 (even in the absence of input signal W).

Here, as shown in FIG. 19(b), the guard voltage generating circuit 90 generates predetermined guard voltage V (having a higher level than that of the input noise). In this embodiment, the guard voltage generating circuit 90 controls output (bottom detection level B) of the bottom detecting circuit 88 such that the threshold level T can be held higher than a level in the absence of an input signal by a predetermined guard voltage (i.e., by a level exceeding the level of the input noise) even when no signal is input into the ATC circuit 86, thereby controlling the threshold level T.

Figure 26:
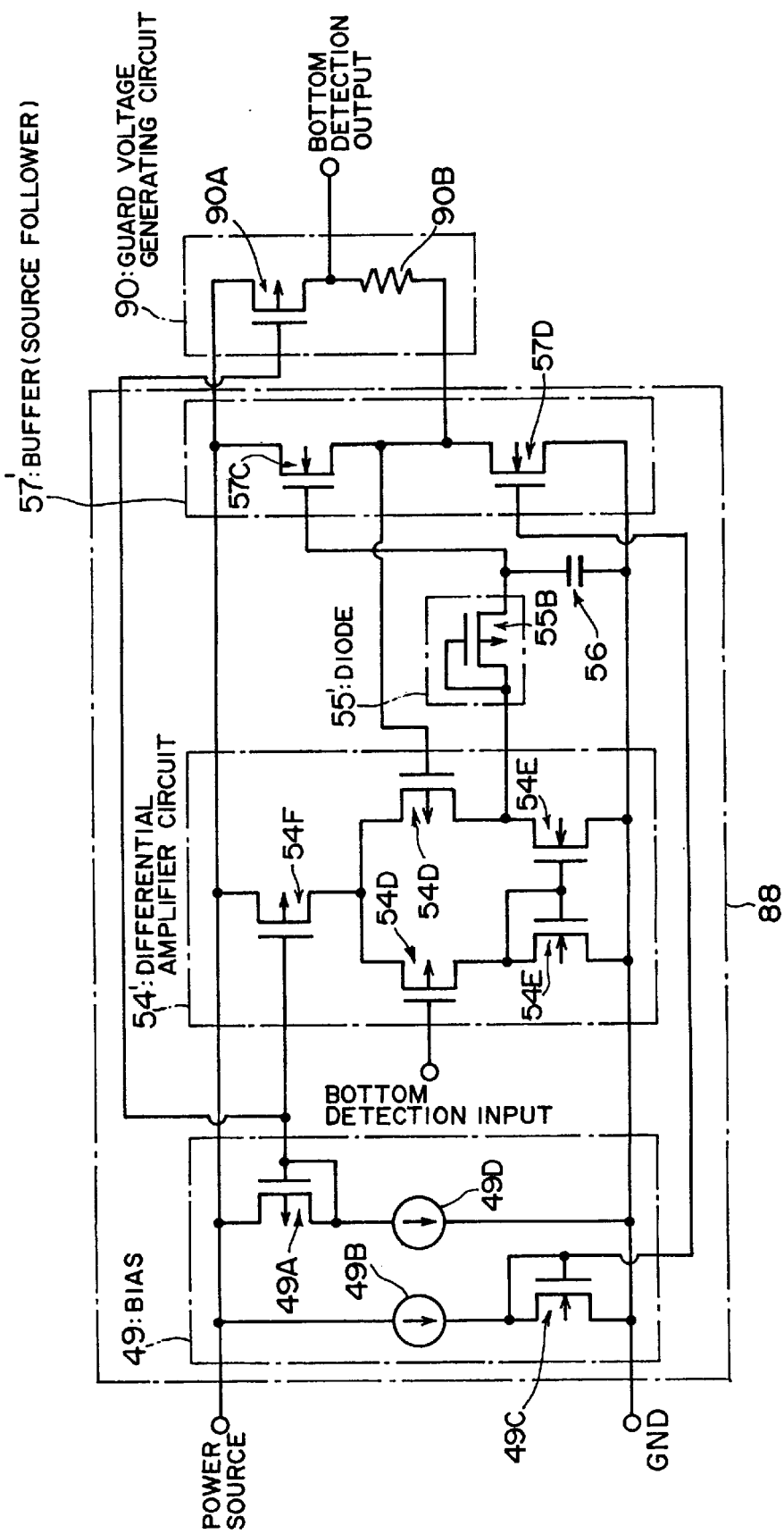
FIG. 26 is a diagram for illustrating connection between a bottom detecting circuit and a guard voltage generating circuit.

Moreover, the bottom detecting circuit 88 and the guard voltage generating circuit 90 are connected as shown in FIG. 26. Specifically, the guard voltage generating circuit 90 includes a MOS-FET 90A and a resistance 90B as shown in FIG. 26.

Meanwhile, the limiter amplifier circuit 91 takes as inputs the positive-phase output from the AGC amplifier circuit 84 of the ATC-AGC amplifier circuit 78 and the threshold value from the ATC circuit 86, and performs the differential amplification of the input signal from the AGC amplifier circuit 84 with center at the threshold level from the ATC circuit 86, thereafter limiting the amplified input to the predetermined signal level, and outputting the result.

Moreover, in the limiter amplifier circuit 91, output amplitude is limited to a constant level throughout an input range.

Figure 29:
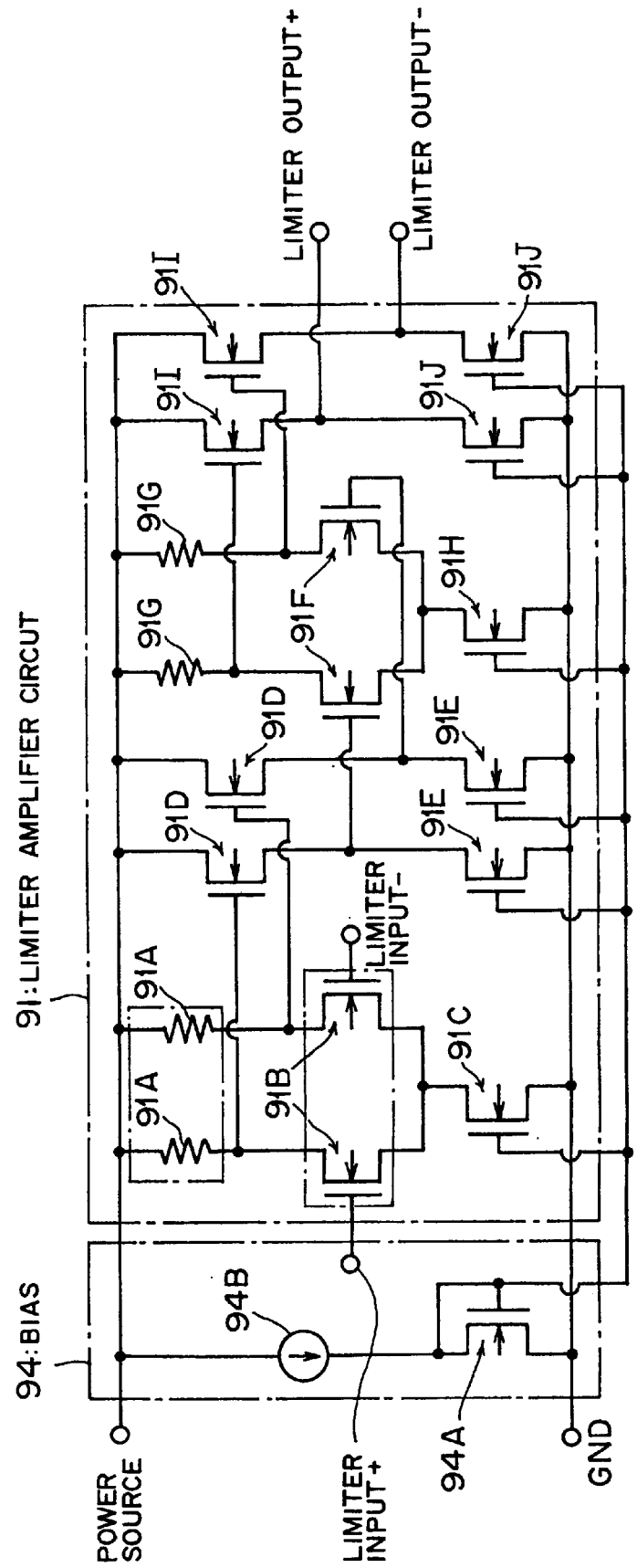
FIG. 29 is a circuit diagram showing a configuration of a limiter amplifier circuit.

Specifically, as shown in FIG. 29, the limiter amplifier circuit 91 includes a plurality of amplifier circuits. The first amplifier circuit includes a load resistance including two resistances 91A, a transistor pair including two MOS-FETs 91B, and a MOS-FET 91C serving as a constant-current source.

Moreover, in the limiter amplifier circuit 91, the amplified signal is output from output terminals through, for example, a plurality of MOS-FETs 91D to 91F, 91H to 91J having a second stage differential amplifier circuit or a source follower circuit with a drain grounded. Further, in FIG. 29, reference numeral 91G indicates a resistance.

Further, as shown in FIG. 29, a bias circuit 94 serving as a constant-current source to feed current to the MOS-FETs 91C, 91E, 91H, 91J of the limiter amplifier circuit 91 is added to the limiter amplifier circuit 91. In this case, the bias circuit 94 includes a MOS-FET 94A and a constant-current source 94B.

Further, as well as the MOS-FET as shown in FIG. 29, a bipolar transistor may be used as a transistor forming the limiter amplifier circuit 91 (see FIG. 21).

Thus, in this embodiment, as described in the above fifth embodiment, in order to compensate for the offsets present in the ATC-AGC amplifier circuits 71, 78, the ATC circuit 79 of the ATC-AGC amplifier circuit 78 is mounted at a subsequent stage of the AGC amplifier circuit 77 of the ATC-AGC amplifier circuit 71, and the ATC circuit 86 of the ATC-limiter amplifier circuit 85 is mounted at the subsequent stage of the AGC amplifier circuit 84 of the ATC-AGC amplifier circuit 78. Thereby, variations in output level from the AGC amplifier circuits 77, 84 are followed and compensated by the ATC circuits 79, 86 at the subsequent stages thereof.

In other words, the AGC amplifier circuit 84 is controlled by the ATC circuit 79 in a feedforward manner in the ATC-AGC amplifier circuit 78, and the limiter amplifier circuit 91 is controlled by the ATC circuit 86 in a feedforward manner in the ATC-limiter amplifier circuit 85, thereby compensating for the offsets present in the ATC-AGC amplifier circuits 71, 78.

According to the above configuration, in the signal amplifier circuit 70 according to the sixth embodiment of the present invention, in response to input of signal, the ATC circuit 72 of the ATC-AGC amplifier circuit 71 automatically sets the threshold value depending upon the peak value of the input signal and a reference level.

Further, the gain control circuit 76 generates the gain control signal according to the difference between the peak value detected in the ATC circuit 72 and the reference level to feed the signal to the AGC amplifier circuit 77 as the feedforward signal.

When the input signal and the threshold value from the ATC circuit 72 are input into the AGC amplifier circuit 77, the AGC amplifier circuit 77 performs the differential amplification of the input signal with center at the threshold level from the ATC circuit 72 by using the gain depending upon the gain control signal from the gain control circuit 76.

Further, in response of output of the signal obtained through the differential amplification by the AGC amplifier circuit 77 of the ATC-AGC amplifier circuit 71, the ATC circuit 79 of the ATC-AGC amplifier circuit 78 automatically sets the threshold value depending upon the peak value and the bottom value of the output signal from the AGC amplifier circuit 77.

Further, the gain control circuit 83 generates the gain control signal according to the difference between the peak value and the bottom value detected in the ATC circuit 79 to feed the signal to the AGC amplifier circuit 84 as the feedforward signal.

When the output signal from the AGC amplifier circuit 77 and the threshold value from the ATC circuit 79 are input into the AGC amplifier circuit 84, the AGC amplifier circuit 84 performs the differential amplification of the input signal with center at the threshold level from the ATC circuit 79 by using the gain depending upon the gain control signal from the gain control circuit 83.

Further, in response to output of the signal obtained through the differential amplification by the AGC amplifier circuit 84 of the ATC-AGC amplifier circuit 78, the ATC circuit 86 of the ATC-limiter amplifier circuit 85 automatically sets the threshold value depending upon the peak value of the output signal from the AGC amplifier circuit 84 and the bottom value controlled by the guard voltage generating circuit 90.

Subsequently, when the positive-phase output from the AGC amplifier circuit 84 and the threshold value from the ATC circuit 86 are input into the limiter amplifier circuit 91, the limiter amplifier circuit 91 performs the differential amplification of the input signal from the AGC amplifier circuit 67 with center at the threshold level from the ATC circuit 86, thereafter limiting the amplified input to the predetermined signal level, and outputting the result.

As set forth above, according to the sixth embodiment of the present invention, the signal amplifier circuit 70 includes the ATC-AGC amplifier circuits 71, 78, and the ATC-limiter amplifier circuit 85 at the subsequent stage thereof. It is thereby possible to provide the same advantages as those of the signal amplifier circuit 20 according to the first embodiment described above. In addition, in the ATC-AGC amplifier circuit 78 and the ATC-limiter amplifier circuit 85, the feedforward control is made to compensate for the offsets. It is thereby possible to reduce the variation in pulse width of the signal without an offset compensation feedback loop (see reference numeral 28 in FIG. 5), resulting in applicability even at a time of high-speed signal amplification in which a time constant of response is limited.

Further, since the signal amplifier circuit 70 includes the AGC amplifier circuits 77, 84 in a multistage configuration, it is possible to increase the degree of freedom for design of the signal amplifier circuit 70.

Additionally, the guard voltage generating circuit 90 controls the threshold level such that the threshold level can be held higher than the level in the absence of input signal by the predetermined guard voltage (i.e., by the level exceeding the level of the input noise) even when no signal is input into the ATC circuit 86. It is thereby possible to prevent the erroneous recognition of the signal due to the input noise, and fix to logic 0 the output level in the absence of a signal as shown in, for example, FIG. 19(c).

Moreover, this embodiment has been described with respect to a case where the guard voltage generating circuit 90 controls the output [the bottom detection level B shown in FIG. 19(b)] of the bottom detecting circuit 88, thereby controlling the threshold level. However, it must be noted that the invention should not be limited to this embodiment, and the threshold level may be controlled by, for example, controlling the output [the peak detection level P shown in FIG. 19(b)] of the peak detecting circuit 87 or the output of the voltage dividing circuit 89.

Further, in this embodiment, if a delay circuit (see reference numeral 43 in FIG. 5) is mounted on the input side of the AGC amplifier circuit 77 of the ATC-AGC amplifier circuit 71, as stated above, the signal can be input into the AGC amplifier circuit 77 after a rise of the gain control signal from the gain control circuit 76. It is possible to avoid overshoot [see reference numeral J in FIG. 12(c)] of the signal.

Further, the signal amplifier circuit 70 according to this embodiment may be used as a high-speed/small-amplitude signal interface circuit in the field of information processing.

(g1) Description of Modification of Sixth Embodiment

Moreover, the above sixth embodiment has been described with respect to a case where the signal amplifier circuit 70 includes the ATC-AGC amplifier circuits 71, 78 in the two-stage configuration, and the ATC-limiter amplifier circuit 85 in the one-stage configuration as shown in FIG. 18. However, it is enough to simply provide an ATC-limiter amplifier circuit at a last stage. Therefore, as shown in FIG. 20, the signal amplifier circuit may include a one-stage ATC-AGC amplifier circuit, and a two-stage ATC-limiter amplifier circuit.

Figure 20:
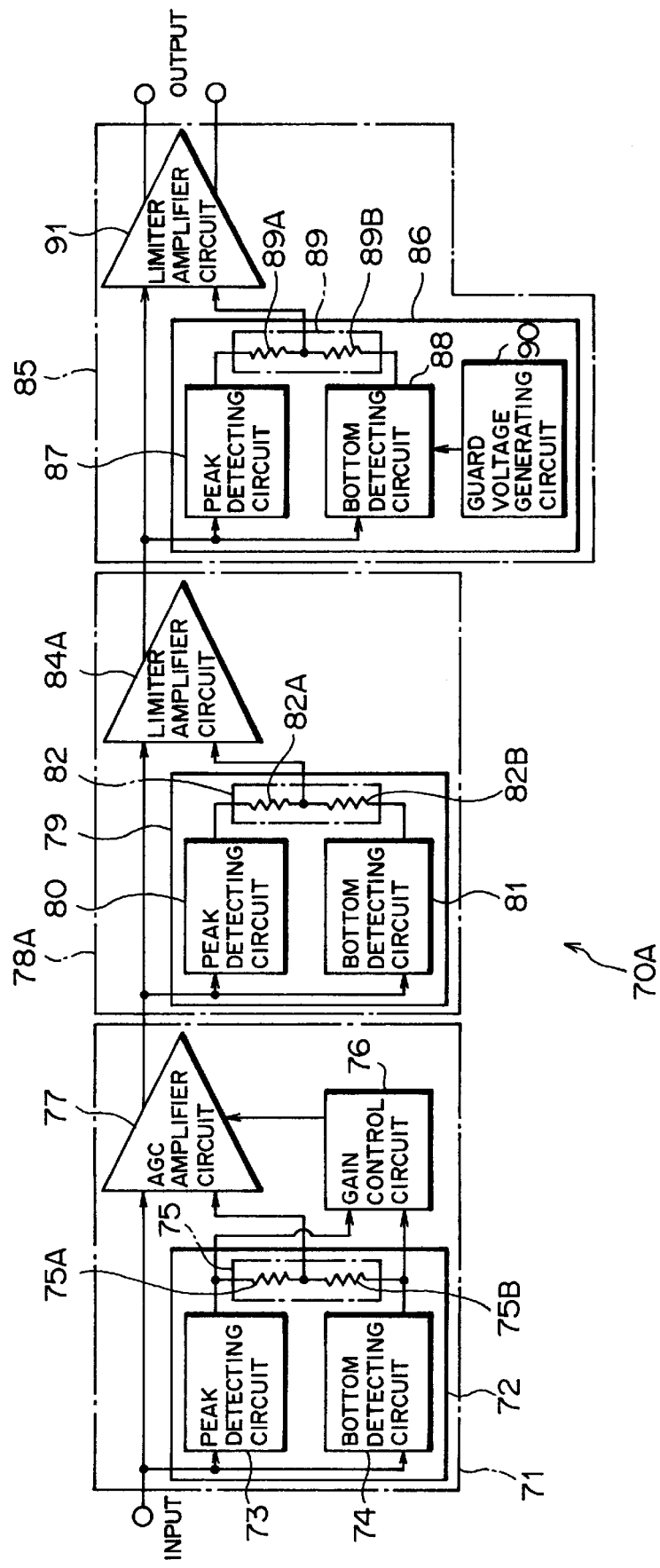
FIG. 20 is a block diagram showing a configuration of a signal amplifier circuit according to modification of the sixth embodiment of the present invention.

Here, a signal amplifier circuit 70A shown in FIG. 20 has the same configuration as that of the signal amplifier circuit 70 except that the ATC-AGC amplifier circuit 78 of the signal amplifier circuit 70 is replaced with an ATC-limiter amplifier circuit 78A.

The ATC-limiter amplifier circuit 78A includes an ATC circuit 79 and a limiter amplifier circuit 84A, and the ATC circuit 79 is the same in function and configuration as the corresponding component part in the above sixth embodiment.

Further, the limiter amplifier circuit 84A takes as inputs output from an AGC amplifier circuit 77 of an ATC-AGC amplifier circuit 71 and a threshold value from an ATC circuit 79, and performs differential amplification of an input signal from the AGC amplifier circuit 77 with center at the threshold level from the ATC circuit 79, thereafter limiting the amplified input to the predetermined signal level, and outputting the result.

Moreover, the limiter amplifier circuit 84A has the same configuration as that of the limiter amplifier circuit 91 in the above sixth embodiment so that, in the limiter amplifier circuit 84A, output amplitude is also limited to a constant level throughout an input range.

As set forth above, the signal amplifier circuit 70A may include the one-stage ATC-AGC amplifier circuit and the two-stage ATC-limiter amplifier circuit. It is thereby possible to provide the same advantages as those of the signal amplifier circuit 70 according to the sixth embodiment described above. In addition, there is no need to provide a gain control circuit (see reference numeral 83 in FIG. 18) for the ATC-limiter amplifier circuit 78A in an intermediate stage. It is possible to reduce the number of circuits forming the signal amplifier circuit 70A, and simplify the configuration of the signal amplifier circuit 70A.

(h) Others

In the first to fifth embodiments, it is also possible to employ the peak detecting circuit (see FIGS. 22, 23), the bottom detecting circuit (see FIGS. 24 to 26), the gain control circuit (see FIG. 27), the AGC amplifier circuit (see FIG. 28), and the limiter amplifier circuit (see FIG. 29) as described in the sixth embodiment.

Further, in the above sixth embodiment, it is also possible to employ the peak detecting circuit (not shown), the bottom detecting circuit (not shown), the gain control circuit (see FIG. 7), and the AGC amplifier circuit (see FIGS. 8, 21) as described in the first to fifth embodiments.

Further, in the first to sixth embodiments, a bipolar transistor may be used in the circuit including the MOSFET.

The present invention is not limited to the specifically described embodiment, and variations and modifications may be made without departing from the scope of the present invention.

What is claimed is:

1. A signal amplifier circuit comprising:
   an automatic threshold value setting portion automatically setting a threshold value depending upon a logic "1" side level and a logic "0" side level of an input signal;
   an automatic gain control amplifying portion performing differential amplification with respect to the input signal, based on the input signal and the threshold value from said automatic threshold value setting portion; and
   a gain control portion feeding a gain control signal according to amplitude information of the input signal, which information is obtained based on the logic "1" side level and the logic "0" side level of the input signal to be used in said automatic threshold value setting portion for setting the threshold value, to said automatic gain control amplifying portion as a feedforward signal.

2. A signal amplifier circuit according to claim 1, wherein said automatic threshold value setting portion comprises:
   a logic "1" side level output circuit outputting the logic "1" side level of the input signal.
   a logic "0" side level output circuit outputting the logic "0" side level of the input signal; and
   a voltage dividing circuit dividing the logic "1" side level and the logic "0" side level of the input signal, which are respectively output from the logic "1" side level output circuit and the logic "0" side level output circuit, thereby generating the threshold value.

3. A signal amplifier circuit according to claim 2, wherein the logic "1" side level output circuit is configured as a peak detecting circuit detecting a peak level of the input signal, and the logic "0" side level output circuit is configured as a bottom detecting circuit detecting a bottom level of the input signal.

4. A signal amplifier circuit according to claim 2, wherein the logic "1" side level output circuit is configured as a peak detecting circuit detecting a peak level of the input signal, and the logic "0" side level output circuit is configured as a reference level generating circuit generating a reference level corresponding to the logic "0" side level of input signal.

5. A signal amplifier circuit according to claim 1, wherein a delay circuit is connected to the automatic gain control amplifying portion on the side into which the input signal is input.

6. A signal amplifier circuit according to claim 1, wherein the automatic gain control amplifying portion has a plurality of transistor pairs having different transconductances connected to the same load resistance, and common differential input terminals connected to inputs of the plurality of transistor pairs so as to control an amplification gain by varying a ratio of current while holding an entire amount of current flowing in the plurality of transistor pairs substantially constant.

7. A signal amplifier circuit according to claim 1, wherein the gain control portion has a differential amplifier circuit to take as inputs the "1" side level and the "0" side level of the input signal.

8. A signal amplifier circuit according to claim 1, wherein the gain control portion has a level shift circuit, and a differential amplifier circuit to take as input any one of the "1" side level and the "0" side level of the input signal through the level shift circuit.

9. A signal amplifier circuit according to claim 1, wherein the gain control portion and the automatic gain control amplifying portion are configured such that a minimum gain $G_{min}$ determined by the gain control portion and the automatic gain control amplifying portion can take a value which does not exceed a linear range of the automatic gain control amplifying portion even at a maximum level of an input signal.

10. A signal amplifier circuit according to claim 9, wherein the gain control portion and the automatic gain control amplifying portion are configured such that the minimum gain $G_{min}$ which does not exceed the linear range of the automatic gain control amplifying portion can take a value defined as:

$$G_{min} = V_{linear}/V_{inmax}$$

where $V_{linear}$: linear range of output from automatic gain control amplifying portion; and $V_{inmax}$: maximum input level.

11. A signal amplifier circuit according to claim 1, wherein the input signal is an optical signal, and said signal amplifier circuit is adapted to be connected at an input side to a light-to-electricity converting portion converting the optical signal into an electrical signal, and a preamplifier circuit amplifying the electrical signal output from said light-to-electricity converting portion.

12. A signal amplifier circuit comprising:
an automatic threshold value setting portion to automatically set a threshold value depending upon a "1" side level and a "0" side level of an input signal;
an automatic gain control amplifying portion to take as inputs the input signal and the threshold value from the automatic threshold value setting portion so as to perform differential amplification;
a gain control portion to detect amplitude information of the input signal so as to feed a gain control signal according to amplitude of the input signal to the automatic gain control amplifying portion as a feed-forward signal; and
an offset compensation feedback portion to feed back difference information of an output signal from the automatic gain control amplifying portion to an input side of the automatic gain control amplifying portion so as to compensate for offset of the automatic gain control amplifying portion.

13. A signal amplifier circuit according to claim 12, wherein the automatic threshold value setting portion comprises:
a "1" side level output circuit to output the "1" side level of the input signal;
a "0" side level output circuit to output the "0" side level of the input signal; and
a voltage dividing circuit to generate the threshold value level by dividing the "1" side level and the "0" side level of the input signal respectively obtained in the "1" side level output circuit and the "0" side level output circuit.

14. A signal amplifier circuit according to claim 13, wherein the "1" side level output circuit is configured as a peak detecting circuit to detect a peak level of the input signal, and the "0" side level output circuit being configured as a bottom detecting circuit to detect a bottom level of the input signal.

15. A signal amplifier circuit according to claim 13, wherein the "1" side level output circuit is configured as a peak detecting circuit to detect a peak level of the input signal, and the "0" side level output circuit being configured as a reference level generating circuit to generate a reference level corresponding to the "0" side level of the input signal.

16. A signal amplifier circuit according to claim 12, wherein the automatic threshold value setting portion comprises:
a "1" side level output circuit to output the "1" side level of the input signal;
a "0" side level output circuit to output the "0" side, level of the input signal; and
a voltage dividing circuit to generate the threshold value level by dividing the "1" side level and the "0" side level of the input signal respectively obtained in the "1" side level output circuit and the "0" side level output circuit, and
the "1" side level output circuit being configured as a peak detecting circuit to detect a peak level of the input signal, and the offset compensation feedback portion also serving as the "0" side level output circuit.

17. A signal amplifier circuit according to claim 12, wherein a delay circuit is connected to the automatic gain control amplifying portion on the side into which the input signal is input.

18. A signal amplifier circuit according to claim 12, wherein the automatic gain control amplifying portion has a plurality of transistor pairs having different transconductances connected to the same load resistance, and common differential input terminals connected to inputs of the plurality of transistor pairs so as to control an amplification gain by varying a ratio of current while holding an entire amount of current flowing in the plurality of transistor pairs substantially constant.

19. A signal amplifier circuit according to claim 12, wherein the gain control portion has a differential amplifier circuit to take as inputs the "1" side level and the "0" side level of the input signal.

20. A signal amplifier circuit according to claim 12, wherein the gain control portion has a level shift circuit, and a differential amplifier circuit to take as input any one of the "1" side level and the "0" side level of the input signal through the level shift circuit.

21. A signal amplifier circuit according to claim 12, wherein the gain control portion and the automatic gain control amplifying portion are configured such that a minimum gain $G_{min}$ determined by the gain control portion and the automatic gain control amplifying portion can take a value which does not exceed a linear range of the automatic gain control amplifying portion even at a maximum level of an input signal.

22. A signal amplifier circuit according to claim 21, wherein the gain control portion and the automatic gain control amplifying portion are configured such that the minimum gain $G_{min}$ which does not exceed the linear range of the automatic gain control amplifying portion can take a value defined as:

$$G_{min} = V_{linear}/V_{inmax}$$

where $V_{linear}$: linear range of output from automatic gain control amplifying portion; and $V_{inmax}$: maximum input level.

23. A signal amplifier circuit according to claim 12, wherein the offset compensation feedback portion feeds back a difference level between peak values of differential outputs of the automatic gain control amplifying portion as the difference information of the output signal from the automatic gain control amplifying portion to the input side of the automatic gain control amplifying portion so as to compensate for the offset of the automatic gain control amplifying portion.

24. A signal amplifier circuit according to claim 12, wherein the offset compensation feedback portion makes low-pass filter processing to a difference level between peak values of differential outputs of the automatic gain control amplifying portion, and feeds back the result as the difference information of the output signal from the automatic gain control amplifying portion to the input side of the automatic gain control amplifying portion so as to compensate for the offset of the automatic gain control amplifying portion.

25. A signal amplifier circuit according to claim 12, wherein the offset compensation feedback portion feeds back a difference level between bottom values of differential outputs of the automatic gain control amplifying portion as the difference information of the output signal from the automatic gain control amplifying portion to the input side of the automatic gain control amplifying portion so as to compensate for the offset of the automatic gain control amplifying portion.

26. A signal amplifier circuit according to claim 12, wherein the offset compensation feedback portion makes low-pass filter processing to a difference level between bottom values of differential outputs of the automatic gain control amplifying portion, and feeds back the result as the difference information of the output signal from the automatic gain control amplifying portion to the input side of the automatic gain control amplifying portion so as to compensate for the offset of the automatic gain control amplifying portion.

27. A signal amplifier circuit according to claim 12, wherein the offset compensation feedback portion feeds back as the difference information of the output signal from the automatic gain control amplifying portion a difference level between values obtained by dividing a peak value and a bottom value of differential outputs of the automatic gain control amplifying portion to the input side of the automatic gain control amplifying portion so as to compensate for the offset of the automatic gain control amplifying portion.

28. signal amplifier circuit according to claim 12, wherein the offset compensation feedback portion makes low-pass filter processing to a difference level between values obtained by dividing a peak value and a bottom value of differential outputs of the automatic gain control amplifying portion, and feeds back the result as the difference information of the output signal from the automatic gain control amplifying portion to the input side of the automatic gain control amplifying portion so as to compensate for the offset of the automatic gain control amplifying portion.

29. A signal amplifier circuit according to claim 12, wherein, when the input signal is an optical signal, a light-to-electricity converting portion for light-to-electricity conversion of the input signal, and a preamplifier circuit to amplify an output signal of the light-to-electricity converting portion are connected to an input side.

30. A signal amplifier circuit comprising:
an automatic gain control amplifying portion to take as inputs an input signal and a reference signal so as to perform differential amplification;
a gain control portion to detect amplitude information of the input signal so as to feed a gain control signal according to amplitude of the input signal to the automatic gain control amplifying portion as a feedforward signal; and
an offset compensation feedback portion to feed back difference information of an output signal from the automatic gain control amplifying portion to an input side of the automatic gain control amplifying portion as the reference signal so as to compensate for offset of the automatic gain control amplifying portion.

31. A signal amplifier circuit according to claim 30, wherein a delay circuit is connected to the automatic gain control amplifying portion on the side into which the input signal is input.

32. A signal amplifier circuit according to claim 30, wherein the automatic gain control amplifying portion has a plurality of transistor pairs having different transconductances connected to the same load resistance, and common differential input terminals connected to inputs of the plurality of transistor pairs so as to control an amplification gain by varying a ratio of current while holding an entire amount of current flowing in the plurality of transistor pairs substantially constant.

33. A signal amplifier circuit according to claim 30, wherein the gain control portion has a differential amplifier circuit to take as inputs the "1" side level and the "0" side level of the input signal.

34. A signal amplifier circuit according to claim 30, wherein the gain control portion has a level shift circuit, and a differential amplifier circuit to take as input any one of the "1" side level and the "0" side level of the input signal through the level shift circuit.

35. A signal amplifier circuit according to claim 30, wherein the gain control portion and the automatic gain control amplifying portion are configured such that a minimum gain $G_{min}$ determined by the gain control portion and the automatic gain control amplifying portion can take a value which does not exceed a linear range of the automatic gain control amplifying portion even at a maximum level of an input signal.

36. A signal amplifier circuit according to claim 35, wherein the gain control portion and the automatic gain control amplifying portion are configured such that the minimum gain $G_{min}$ which does not exceed the linear range of the automatic gain control amplifying portion can take a value defined as:

$$G_{min}=V_{linear}/V_{inmax}$$

where $V_{linear}$: linear range of output from automatic gain control amplifying portion; and $V_{inmax}$: maximum input level.

37. A signal amplifier circuit according to claim 30, wherein the offset compensation feedback portion feeds back a difference level between peak values of differential outputs of the automatic gain control amplifying portion as the difference information of the output signal from the automatic gain control amplifying portion to the input side of the automatic gain control amplifying portion so as to compensate for the offset of the automatic gain control amplifying portion.

38. A signal amplifier circuit according to claim 30, wherein the offset compensation feedback portion makes low-pass filter processing to a difference level between peak values of differential outputs of the automatic gain control amplifying portion, and feeds back the result as the difference information of the output signal from the automatic gain control amplifying portion to the input side of the automatic gain control amplifying portion so as to compensate for the offset of the automatic gain control amplifying portion.

39. A signal amplifier circuit according to claim 30, wherein the offset compensation feedback portion feeds back a difference level between bottom values of differential outputs of the automatic gain control amplifying portion as the difference information of the output signal from the automatic gain control amplifying portion to the input side of the automatic gain control amplifying portion so as to compensate for the offset of the automatic gain control amplifying portion.

40. A signal amplifier circuit according to claim 30, wherein the offset compensation feedback portion makes low-pass filter processing to a difference level between bottom values of differential outputs of the automatic gain control amplifying portion, and feeds back the result as the difference information of the output signal from the automatic gain control amplifying portion to the input side of the automatic gain control amplifying portion so as to compensate for the offset of the automatic gain control amplifying portion.

41. A signal amplifier circuit according to claim 30, wherein the offset compensation feedback portion feeds back as the difference information of the output signal from the automatic gain control amplifying portion a difference level between values obtained by dividing a peak value and a bottom value of differential outputs of the automatic gain control amplifying portion to the input side of the automatic gain control amplifying portion so as to compensate for the offset of the automatic gain control amplifying portion.

42. A signal amplifier circuit according to claim 30, wherein the offset compensation feedback portion makes low-pass filter processing to a difference level between values obtained by dividing a peak value and a bottom value of differential outputs from the automatic gain control amplifying portion, and feeds back the result as the difference information of the output signal from the automatic gain control amplifying portion to the input side of the automatic gain control amplifying portion so as to compensate for the offset of the automatic gain control amplifying portion.

43. A signal amplifier circuit according to claim 30, wherein, when the input signal is an optical signal, a light-to-electricity converting portion for light-to-electricity conversion of the input signal, and a preamplifier circuit to amplify an output signal of the light-to-electricity converting portion are connected to an input side.

44. A signal amplifier circuit comprising:
at least one signal amplification basic block portion having an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal so as to feed a gain control signal according to amplitude of the input signal to the automatic gain control amplifying portion as a feedforward signal; and
at least one limiter amplification basic block portion having a limiter amplifying portion to perform differential amplification of a differential input signal,
wherein the at least one limiter amplification basic block portion is connected at a subsequent stage of the at least one signal amplification basic block portion.

45. A signal amplifier circuit comprising:
at least one signal amplification basic block portion having an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, a gain control portion to detect amplitude information of the input signal so as to feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion so as to compensate for offset of the automatic gain control amplifying portion; and
at least one limiter amplification basic block portion having a limiter amplifying portion to perform differential amplification of a differential input signal,
wherein the at least one limiter amplification basic block portion is connected at a subsequent stage of the at least one signal amplification basic block portion.

46. A signal amplifier circuit comprising:
at least one signal amplification basic block portion having an automatic gain control amplifying portion to take as inputs an input signal and a reference signal so as to perform differential amplification, a gain control portion to detect amplitude information of the input signal so as to feed a gain control signal according to amplitude of the input signal to the automatic gain control amplifying portion as a feedforward signal, and an offset compensation feedback portion to feed back difference information of an output signal from the automatic gain control amplifying portion to an input side of the automatic gain control amplifying portion as the reference signal so as to compensate for offset of the automatic gain control amplifying portion; and
at least one limiter amplification basic block portion having a limiter amplifying portion to perform differential amplification of a differential input signal,
wherein the at least one limiter amplification basic block portion is connected at a subsequent stage of the at least one signal amplification basic block portion.

47. A signal amplifier circuit comprising:
at least one signal amplification basic block portion having an automatic threshold value setting portion to automatically set a threshold value depending upon a "1" side level and a "0" side level of an input signal, an automatic gain control amplifying portion to take as inputs the input signal and the threshold value from the automatic threshold value setting portion so as to perform differential amplification, and a gain control portion to detect amplitude information of the input signal so as to feed a gain control signal according to amplitude of the input signal to the automatic gain control amplifying portion as a feedforward signal; and
at least one limiter amplification basic block portion having an automatic threshold value setting portion to automatically set a threshold value depending upon a "1" side level and a "0" side level of an input signal, and a limiter amplifying portion to take as inputs the input signal and the threshold value from the automatic threshold value setting portion so as to perform differential amplification, wherein the at least one limiter amplification basic block portion is connected at a subsequent stage of the at least one signal amplification basic block portion.

48. A signal amplifier circuit according to claim 47, wherein the automatic threshold value setting portion of the limiter amplification basic block portion is provided with a guard voltage generating circuit to control the threshold level such that the threshold level can be held higher than a level in the absence of an input signal by a predetermined guard voltage even when no signal is input into the automatic threshold value setting portion of the at least one limiter amplification basic block portion.

49. A signal amplifier circuit according to claim 48, wherein the guard voltage generating circuit is mounted in the automatic threshold value setting portion of a limiter amplification basic block portion at a last stage.

50. A method of amplifying a signal using an amplifier, comprising:

automatically setting a threshold value depending upon a logic "1" side level and a logic "0" side level of an input signal;

performing differential amplification with respect to the input signal, based on the input signal and the threshold value; and feeding a gain control signal according to amplitude information of the input signal to the amplifier as a feedforward signal.

* * * * *